(12) United States Patent
Nakamura

(10) Patent No.: US 6,573,553 B2
(45) Date of Patent: *Jun. 3, 2003

(54) SEMICONDUCTOR DEVICE AND METHOD FOR FABRICATING THE SAME

(75) Inventor: Shunji Nakamura, Kawasaki (JP)

(73) Assignee: Fujitsu Limited, Kawasaki (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/537,434

(22) Filed: Mar. 27, 2000

(65) Prior Publication Data

US 2003/0025145 A1 Feb. 6, 2003

(51) Int. Cl.$^7$ .................. H01L 29/76; H01L 29/94; H01L 27/108; H01L 31/119

(52) U.S. Cl. .................. 257/309; 257/308; 257/310

(58) Field of Search .................. 257/295–310, 257/530–535; 438/253–254, 396–398

(56) References Cited

U.S. PATENT DOCUMENTS 5,554,564 A * 9/1996 Nishioka et al. ............ 438/396

* cited by examiner

Primary Examiner—Cuong Quang Nguyen
(74) Attorney, Agent, or Firm—Armstrong, Westerman & Hattori, LLP

(57) ABSTRACT

A semiconductor device comprises: a lower contact electrode 1; an adhesion improving layer 3 formed on the lower contact electrode 1; and a capacitor including a lower electrode 4 in a projected structure formed on the adhesion improving layer 3, a capacitor dielectric film 5 formed on the lower electrode 4, and an upper electrode 6 formed on the capacitor dielectric film 5, in which a gap is formed on a sidewall of the adhesion improving layer 3. The gap is at least partially left as a cavity 7. The gap insulates the upper electrode 6 and the adhesion improving layer 3 by the cavity 7.

22 Claims, 39 Drawing Sheets

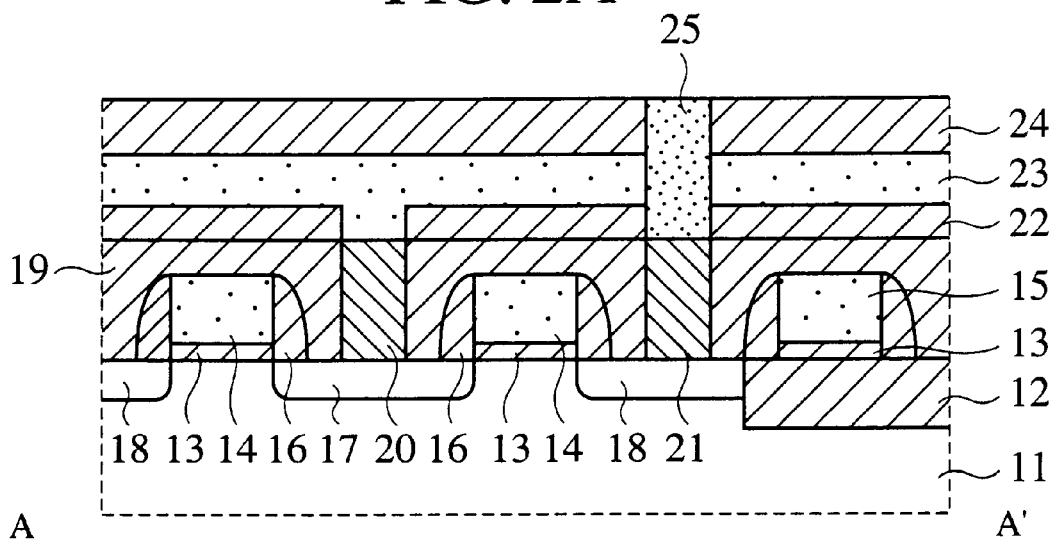
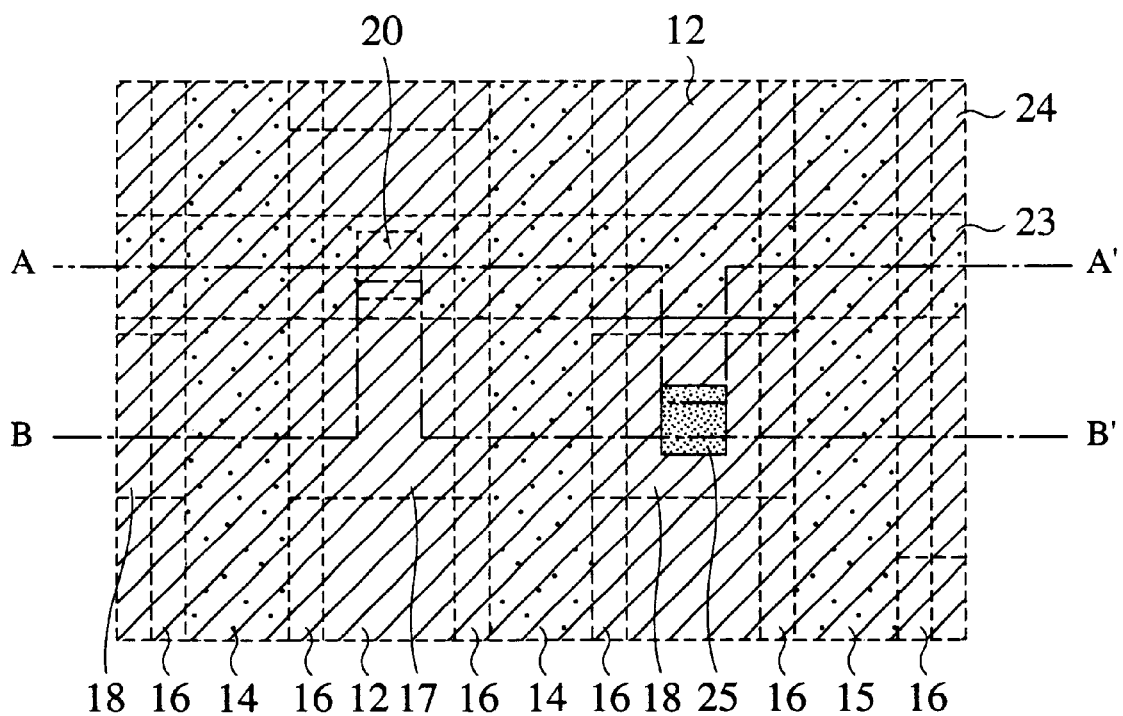

SEMICONDUCTOR DEVICE AND METHOD FOR FABRICATING THE SAME

BACKGROUND OF THE INVENTION

The present invention relates to a semiconductor device and a method for fabricating the semiconductor device, more specifically to a semiconductor device characterized by a junction structure between an adhesion improving layer and a capacitor dielectric film used in a storage capacitor formed in a DRAM (Dynamic Random Access Memory) or an FeRAM (Ferroelectric RAM), and a method for fabricating the same.

Recently, as semiconductor devices are more highly integrated and have larger capacities, design rules (line/space) have become increasingly precise. Accordingly, the semiconductor devices, e.g., DRAMs (Dynamic Random Access Memories) have widths of the wiring layers decreased, and the contact plugs connecting the storage nodes which are to be the lower connection electrodes of the storage capacitors to the source regions have smaller diameters.

Such the DRAM comprises cell regions each including one transistor and one storage capacitor, for storing 1-bit information. The storage capacitor comprises a lower electrode called a storage node, an upper electrode called a cell plate, and a capacitor dielectric film sandwiched between the upper and the lower electrodes.

In the conventional DRAM, an electrode material of the storage node and the cell plate is doped polycrystalline silicon, and the capacitor dielectric film is ON film (a composite film of $SiO_2$ and $Si_3N_4$) formed by thermally oxidizing the surface of a thin CVD nitride film.

The storage node is formed in a projected electrode structure to use as a capacitor not only the upper surface but also the side surfaces, whereby a sufficient capacitance can be obtained for a limited space (floor area). This has a background that the capacitance cannot be lowered below a prescribed capacitance, e.g., about 30 fF in order to cope with alpha radiation and decrease of the source voltage.

In addition, DRAMs have been developed with the integration improved by about 4 times every three years, i.e., the micronization improved; the projected structure of the storage capacitor, i.e., the projected structure of the storage node tends to become higher and higher so that a sufficient surface area can be ensured for a decreased capacitor floor area.

However, as the storage capacitor structure becomes higher, a height difference from the peripheral circuit region becomes larger. This resultantly causes a problem that the wiring layer becomes thin at the step, and the wiring becomes less reliable, and, in the exposing step, a problem of a depth of focus that the higher region and the lower region cannot be simultaneously focused.

On the other hand, although the above-described problems can be solved by planarizing with an insulation film to be equalized the height with the higher surface, there occur additional problems that contact holes in the peripheral circuit regions become deeper, making the etching difficult and that the contact holes of such high aspect ratio cannot be filled with a metal electrode material of low resistance.

Then, a material having a higher dielectric constant, i.e., a high dielectric constant film is required in place of the conventional ON film (a composite film of $SiO_2$ and $Si_3N_4$) as the capacitor dielectric film. Such high dielectric constant film is used to thereby obtain a higher capacitance per a unit area. Studies of obtaining a required capacitance without increasing a height of the projected structure of the storage capacitor are made. This produces an advantage of simplifying steps of the fabrication.

As such the high dielectric constant film, the use of $Ta_2O_5$ film, SBT ($SrBi_2Ta_2O_9$) film, BST (($Ba,Sr$)$TiO_3$) film, etc. are studied. These high dielectric constant materials are basically oxides, and have a problem that when these films are deprived of oxygen, these films become conductive, and leak current tends to flow in the films.

DRAMs store information in charges stored in the storage capacitors. Seriously, increase of leak current means extinction of information stored in the DRAMS.

The storage node and the cell plate of the conventional storage capacitor are formed of polycrystalline silicon. Polycrystalline silicon can be easily deprived of oxygen. In using a high dielectric constant film as the capacitor dielectric film, it is vital to use an electrode material which take place of polycrystalline silicon.

An electrode material suitable for such the high dielectric constant film must satisfy the following (1) to (6) requirements:

(1) Oxygen defect which is a cause for depriving a high dielectric constant film of oxygen to cause leak current does not take place.

(2) An electrode material itself does not diffuse in the high dielectric constant film to cause deterioration of the high dielectric constant film.

(3) An electrode material is able to withstand high-temperature annealing for crystallizing the high dielectric constant film.

(4) The electrode material can be easily etched.

(5) An electrode material has a resistance as low as possible.

(6) An electrode material has good adhesion with a base insulation film, so that peeling does not take place after heat treatment.

However, it is very difficult to satisfy all the six requirements from (1) to (6), and no electrode material which satisfy all of the requirements has been so far found. Electrode materials, for example, Ru (Ruthenium) and RuO (Ruthenium Oxide), can satisfy, to some extent, the requirements (1) to (5) but does not satisfy the requirement (6).

That is, a Ru film and a RuO film have a defect that they tend to peel from the insulation film.

Then, in order to solve such defect of the peeling of these electrode films, which is their only one defect, it is considered to provide below such electrode materials an adhesion improving layer having good adhesion with the base insulation film for the prevention of the pealing of the electrode materials. As such the adhesion improving layer, TiN, WN, and Ta, etc. are prospective.

Here, with reference to FIGS. 38A and 38B, the storage capacitor of the conventional DRAM using Ru as the storage node and having the adhesion improving layer will be explained.

FIG. 38B is a plan view of the DRAM at the time that a lower plug 75 of the DRAM is formed. FIG. 38A is a sectional view of the DRAM. In FIG. 38A, the layer structure up to a first inter-layer insulation film 69 is a sectional view along the one-dot chain line B–B' in FIG. 38B, the layer structure from a second inter-layer insulation film 72 to a third inter-layer insulation film 74 is a sectional view along the one-dot line A–A' in FIG. 38B, and the layer structure thereabove is a sectional view again along the one-dot chain line B–B' in FIG. 38B. In FIG. 38A, the layer structure below the third inter-layer insulation film is represented conveniently by A–A' to simplify the showing.

In FIG. 38A, for convenience, a bit line 73 is shown, shorted to the lower plug 75, but they are positionally isolated from each other as shown in FIG. 38B.

Reference will be made to FIGS. 38A and 38B.

First, a device isolation oxide film 62 is formed by selective oxidation in a prescribed region of a p-type silicon substrate 61. Then, the exposed surface of the p-type silicon substrate 61 surrounded by the device isolation oxide film 62 is thermally oxidized to form a gate oxide film 63. Next, a non-doped polycrystalline silicon film is deposited, and an impurity, such as P (phosphorus) or others, is ion-implanted. Then, the polycrystalline silicon layer is etched into a prescribed pattern to form gate electrodes 64 and word lines 65, which are extensions of the gate electrodes 64.

Actually, an $SiO_2$ film or an $Si_3N_4$ film as a protection film is provided by CVD method on the gate electrodes 64.

Then, as the gate electrodes 64 as a mask, an impurity, such as As (arsenic), P or others, is ionimplanted to form an $n^+$-type drain region 67 and an $n^+$-type source region 68. Then, an $SiO_2$ film is deposited on the entire surface by CVD method and is subjected to anisotropic etching to form sidewalls 66.

Instead, in the above-described ion implanting step, As ions are implanted to form an LDD (Lightly Doped Drain) in a shallow $n^-$-type region, and the sidewalls 66 are formed. Then, P ions are implanted to form the $n^+$-type drain region 67 and the $n^+$-type source region 68.

Then, an $SiO_2$ film is deposited on the entire surface by CVD method to form the first inter-layer insulation film 69. A via hole for the $n^+$-type drain region 67 and the $n^+$-type source region 68 is formed. A TiN (titanium nitride) film to be a barrier metal and next a W (tungsten) film, etc. are deposited by CVD method or sputtering method, and are polished by CMP (Chemical Mechanical Polishing) method to form contact plugs 70, 71 with the W film, etc. buried in.

Next, an $SiO_2$ film is deposited on the entire surface by CVD method to form the second inter-layer insulation film 72, and a via hole for the contact plug 70 is formed. Then, a doped polycrystalline silicon film, a $WSi_2$ film, etc. are deposited on the entire surface by LPCVD (Low Pressure Chemical Vapor Deposition) method and then patterned to form the bit line 73.

Next, again an $SiO_2$ film is deposited on the entire surface by CVD method to form the third inter-layer insulation film 74, and a via hole for the contact plug 71 is formed. Then again a W film is deposited on the entire surface by LPCVD method and polished by CMP method to form the lower plug 75 buried in the via hole.

A TiN film and an Ru film are sequentially deposited on the entire surface by sputtering and then etched to form the adhesion improving layer 76 and a storage node 77 in a projected shape. Then, again a $Ta_2O_5$ film and an Ru film are sequentially deposited by sputtering and etched into a prescribed shape to form the capacitor dielectric film 78 and the cell plate 70. Thus, a basic structure of the DRAM is completed.

In this case, the storage capacitor is constituted by the storage node 77, the cell plate 79, and the capacitor dielectric film 78 sandwiched by both, and is electrically connected to the $n^+$-type source region 68 via the adhesion improving layer 76, the lower plug 75, and to the contact plug 71.

However, in the storage capacitor using such the adhesion improving layer 76, the adhesion improving layer 76, and the capacitor dielectric film 78 of the $Ta_2O_5$ film contact directly to each other at both ends of the adhesion improving layer 76 circled by the dotted lines. At these ends, oxygen in the $Ta_2O_5$ film diffuses in the TiN film forming the adhesion improving layer 76 to cause oxygen defect in the $Ta_2O_5$ film. As a result, a problem of deterioration of the capacitor dielectric film 78 is caused.

That is, the adhesion improving layer 76 of TiN film, etc. satisfy the requirements (4) to (6) out of the requirements (1) to (6) but does not satisfy the requirements (1) to (3). Accordingly, there occurs the problem that the high dielectric constant film at the sidewall of the adhesion improving layer 76 is degraded, and leak current undesirably flows.

In order to solve this problem of deterioration of the high dielectric constant film on the sidewall of the adhesion improving layer 76, it is considered to from the adhesion improving layer 76 in a buried structure. Such improved storage capacitor will be explained with reference to FIGS. 39A and 39B.

FIG. 39A shows a sectional view of the same part as FIG. 38A. FIG. 39A, however, omits the structure on the side of p-type silicon substrate 61, and another transistor commonly using an $n^+$-type drain region 67 so as to simplify the explanation.

In FIG. 39A, the view on the right side is a view showing the positional relationship between a storage node 77 and the adhesion improving layer 76.

Reference is made to FIG. 39A.

The structure up to the third inter-layer insulation film 74 is formed in completely the same way as in FIG. 38A. Then, a via hole arriving at the contact plug 71 is formed and then filled with the lower plug 76 of W film by CMP. Then, the lower plug 75 is over-etched to form a cavity in the via hole. Then, a TiN film is deposited and polished by CMP method to be buried as the adhesion improving layer 76 in the cavity.

Hereafter, an Ru is deposited in the same way as in FIG. 38A and is etched into a prescribed shape to form the storage node 77 in a projected shape. Next, again, a $Ta_2O_5$ film and an Ru film are sequentially deposited by sputtering method and etched into a prescribed shape to form a capacitor dielectric film 78 and a cell plate 79. Thus, a basic structure of the DRAM is completed.

In the case that the adhesion improving layer 76 is thus buried, the $Ta_2O_5$ film forming the capacitor dielectric film 78 is kept out of direct contact with the adhesion improving layer 76, whereby deterioration of the capacitor dielectric film 78 never takes place.

However, as the integration of the DRAM is improved, an alignment allowance between the storage node 77 and the adhesion improving layer 76 is so small that, in view of the alignment precision of the current exposure systems, it is actually impossible to prevent, without failure, the adhesion improving layer 78, accordingly the lower plug 75, from appearing beyond the storage node 77. This causes additional problems. These problems will be explained with reference to FIG. 39B.

FIG. 39B is a sectional view of the same part as FIG. 39A.

Reference is made to FIG. 39B.

As shown by the view on the right side in FIG. 39B, in the case that the lower plug 75, accordingly the adhesion improving layer 76, appears beyond the storage node 77, the adhesion improving layer 76 and the capacitor dielectric film 78 contact directly to each other in the part circled by the broken line in the view on the left side in FIG. 39B. At this part, the deterioration of the capacitor dielectric film 78 takes place, causing leak current.

In addition to an area of the adhesion improving layer decreased by the buried structure, when such disalignment takes place, an area of the contact between the adhesion improving layer 76 and the storage node 77 becomes smaller, which causes an additional problem of the peeling of the storage node 77.

SUMMARY OF THE INVENTION

An object of the present invention is to prevent the peeling of the storage node and occurrence of leak current even when disalignment takes place between the lower plug and the storage node.

FIGS. 1A and 1B are views explaining a principle constitution of the invention of the present application. With reference to FIG. 1, the present invention will be summarized.

FIG. 1A is an enlarged sectional view of a major part of a capacitor in a case that the disalignment between a lower connection electrode 1 buried in an inter-layer insulation film 2 and a lower electrode 4, e.g., disalignment between the lower plug and the storage node, is absent. FIG. 1B is an enlarged sectional view of the major part in a case that the disalignment is present.

Reference is made to FIGS. 1A and 1B.

(1) The semiconductor device according to the present invention comprises: a lower contact electrode 1; an adhesion improving layer 3 formed on the lower contact electrode 1; and a capacitor including a lower electrode 4 in a projected structure formed on the adhesion improving layer 3, a capacitor dielectric film 5 formed on the lower electrode 4, and an upper electrode 6 formed on the capacitor dielectric film 5, in which a gap is formed on a sidewall of the adhesion improving layer 3, and at least a portion of the gap is left as a cavity 7, whereby the upper electrode 6 and the adhesion improving layer 3 are insulated from each other by the cavity 7.

The upper electrode 6, typically the cell plate is thus insulated from the adhesion improving layer 3 through the cavity 7, whereby even if the capacitor dielectric film 5 and the adhesion improving layer 3 should be contiguous, generation of leak current can be prevented. A retention time of information in micronized DRAMs can be much longer.

(2) In the above-described semiconductor device according to the present invention described above in item (1), the sidewall of the adhesion improving layer 3 is contiguous to the capacitor dielectric film 5, and the cavity 7 is surrounded by the capacitor dielectric film 5 and the upper electrode 6.

The upper electrode 6 and the adhesion improving layer 3 are thus insulatively isolated from each other by the cavity 7 as shown in item (1), whereby even when the sidewall of the adhesion improving layer 3 and the capacitor dielectric film 5 are contiguous to thereby deteriorate the capacitor dielectric film 5 at the contiguous part, no voltage is effectively applied to the contiguous part, and increase of leak current can be restrained.

(3) In the semiconductor device according to the present invention described above in item (1), a part of the gap is filled with the capacitor dielectric film 5, and the cavity 7 is formed between the sidewall of the adhesion improving layer 3 and the capacitor dielectric film 5.

The upper electrode 6 and the adhesion improving layer 3 are insulated by the cavity 7 as shown in item (1), and it is possible that the gap is made narrower, and the gap is partially filled with the capacitor dielectric film 5.

(4) In the semiconductor device according to the present invention described above in item (1), a whole of the gap is the cavity 7, and the cavity 7 is formed between the sidewall of the adhesion improving layer 3 and the capacitor dielectric film 5.

The upper electrode 6 and the adhesion improving layer 3 are insulated from each other by the cavity 7 as shown in item (1), and it is possible that the gap is made narrower, and the entire gap is the cavity 7.

(5) The semiconductor device according to the present invention comprises: a lower contact electrode 1; an adhesion improving layer 3 formed on the lower contact electrode 1; and a capacitor including a lower electrode 4 in a projected structure formed on the adhesion improving layer 3, a capacitor dielectric film 5 formed on the lower electrode 4, and an upper electrode 6 formed on the capacitor dielectric film 5, in which a gap is formed on a sidewall of the adhesion improving layer 3, and the gap is completely filled with the capacitor dielectric film 5.

When the gap is thus completely filled with the capacitor dielectric film 5, a voltage V is applied through the buried capacitor dielectric film 5 of a thickness D, whereby an electric field E ($=V/D$) is much mitigated, and no leak current does increase even at the contiguous part where the adhesion improving layer 3 and the capacitor dielectric film 5 are contiguous to each other.

(6) The semiconductor device according to the present invention comprises: a lower contact electrode 1; an adhesion improving layer 3 formed on the lower contact electrode 1; and a capacitor including a lower electrode 4 in a projected structure formed on the adhesion improving layer 3, a capacitor dielectric film 5 formed on the lower electrode 4, and an upper electrode 6 formed on the capacitor dielectric film 5, in which a gap is formed on a sidewall of the adhesion improving layer 3, and the gap is completely filled with an insulation film which is different from the capacitor dielectric film 5.

In the case that the gap is thus completely filled with a deposited insulation film, such as $CVD\text{-}SiO_2$ film or others, a voltage V is applied through the buried capacitor dielectric film 5 of a thickness D, whereby an electric field E ($=V/D$) is much mitigated. Furthermore, the adhesion improving layer 3 and the capacitor dielectric film 5 are not contiguous directly to each other, whereby the capacitor dielectric film 5 does not deteriorate.

(7) The semiconductor device according to the present invention comprises: a lower contact electrode 1; an adhesion improving layer 3 formed on the lower contact electrode 1; and a capacitor including a lower electrode 4 in a projected structure formed on the adhesion improving layer 3, a capacitor dielectric film 5 formed on the lower electrode 4, and an upper electrode 6 formed on the capacitor dielectric film 5, in which a gap is formed on a sidewall of the adhesion improving layer 3, and the gap is completely filled with a self-oxidized film or a self-nitridized film of the lower electrode 4.

In this case, an self-oxide film or a self-nitride film of the lower electrode must be conductive.

Also in the case the gap is thus completely filled with a self-oxide film or a self-nitride film of the lower electrode 4, a voltage V is applied through the thick self-oxide or self-nitride film of a thickness D, whereby an electric field E ($=V/D$) is much mitigated. In addition, the adhesion improving layer 3 and the capacitor dielectric film 5 are not contiguous directly to each other, whereby the capacitor dielectric film 5 does not deteriorate.

(8) The semiconductor device according to the present invention comprises: a lower contact electrode 1; an adhesion improving layer 3 formed on the lower contact electrode 1; and a capacitor including a lower electrode 4 in a projected structure formed on the adhesion improving layer 3, a capacitor dielectric film 5 formed on the lower electrode 4, and an upper electrode 6 formed on the capacitor dielectric film 5, in which a self-oxidized film of the adhesion improving layer 3 is formed on the sidewall of the adhesion improving layer 3, whereby the adhesion improving layer 3 and the capacitor dielectric film 5 are isolated from each other by the self-oxidized film of the adhesion improving layer 3.

A self-oxide film of the adhesion improving layer is thus provided on the sidewall of the adhesion improving layer 3, and the adhesion improving layer 3 and the capacitor dielectric film 5 are not contiguous directly to each other, whereby the capacitor dielectric film does not deteriorate. In addition, an electric filed is mitigated by an thickness of the self-oxide film of the adhesion improving layer 3. In this case, it is not necessary to define the gap on the sidewall of the adhesion improving layer 3.

(9) The semiconductor device according to the present invention comprises: a lower contact electrode 1; a capacitor including a lower electrode 4 in a projected structure formed on the lower contact electrode 1, a capacitor dielectric film 5 formed on the lower electrode 4, and an upper electrode 6 formed on the capacitor dielectric film 5; and an adhesion improving layer 3 being contiguous to the lower electrode 4 and the lower contact electrode 1, in which the adhesion improving layer 3 is formed, covering at least a sidewall of the lower contact electrode 1, a gap is formed on a sidewall of the adhesion improving layer 3 at a part where the lower electrode 4 and the lower contact electrode 1 do not disalign with each other, a gap is formed on the sidewall of the lower contact electrode 1 at a portion of a part where the lower electrode 4 and the lower contact electrode 1 disalign with each other, and each said gaps is left partially as a cavity 7, whereby the upper electrode 6 and the adhesion improving layer 3 are insulated from each other by the cavity 7.

At least the side surface of the lower contact electrode 1 is thus covered with the adhesion improving layer 3, whereby peeling of the lower contact electrode 1 can be effectively prevented. This leads to the prevention of peeling of the lower electrode 4. In this case as well, the upper electrode 6 and the adhesion improving layer 3 are insulated from each other by the cavity 7, whereby generation of leak current can be prevented.

(10) In the semiconductor device according to the present invention described above in item (9), the adhesion improving layer 3 and a capacitor dielectric film 5 are contiguous to each other, and the cavity 7 is surrounded by the capacitor dielectric film 5 and the upper electrode 6.

(11) In the semiconductor device according to the present invention described above in item (9), the gap is partially filled with the capacitor dielectric film 5, and the cavity 7 is formed between the adhesion improving layer 3 and the capacitor dielectric film 5.

(12) In the semiconductor device according to the present invention described above in item (10), a whole of the gap is the cavity 7, and the cavity 7 is formed between the adhesion improving layer 3 and the capacitor dielectric film 5.

(13) The semiconductor device according to the present invention comprises: a lower contact electrode 1; a capacitor including a lower electrode 4 in a projected structure formed on the lower contact electrode 1, a capacitor dielectric film 5 formed on the lower electrode 4, and an upper electrode 6 formed on the capacitor dielectric film 5; and an adhesion improving layer 3 being contiguous to a lower electrode 4 and a lower contact electrode 1, in which the adhesion improving layer 3 is formed, covering at least a sidewall of the lower contact electrode 1, a gap is formed on a sidewall of the adhesion improving layer 3 at a part where the lower electrode 4 and the lower contact electrode 1 do not disalign with each other, a gap is formed on a sidewall of the lower contact electrode 1 at a portion of a part where the lower electrode 4 and the lower contact electrode 1 disalign with each other, and each said gaps is completely filled with a capacitor dielectric film 5.

(14) The semiconductor device according to the present invention comprises: a lower contact electrode 1; a capacitor including a lower electrode 4 in a projected structure formed on the lower contact electrode 1, a capacitor dielectric film 5 formed on the lower electrode 4, and an upper electrode 6 formed on the capacitor dielectric film 5; and an adhesion improving layer 3 being contiguous to a lower electrode 4 and a lower contact electrode 1, in which the adhesion improving layer 3 is formed, covering at least a sidewall of the lower contact electrode 1, a gap is formed on a sidewall of the adhesion improving layer 3 at a part where the lower electrode 4 and the lower contact electrode 1 do not disalign with each other, a gap is formed on a sidewall of the lower contact electrode 1 at a portion of a part where the lower electrode 4 and the lower contact electrode 1 disalign with each other, and each said gaps is completely filled with an insulation film which is different form the capacitor dielectric film 5.

(15) The semiconductor device according to the present invention comprises: a lower contact electrode 1; a capacitor including a lower electrode 4 in a projected structure formed on the lower contact electrode 1, a capacitor dielectric film 5 formed on the lower electrode 4, and an upper electrode 6 formed on the capacitor dielectric film 5; and an adhesion improving layer 3 being contiguous to a lower electrode 4 and a lower contact electrode 1, in which the adhesion improving layer 3 is formed, covering at least a sidewall of the lower contact electrode 1, a gap is formed on a sidewall of the adhesion improving layer 3 at a part where the lower electrode 4 and the lower contact electrode 1 do not disalign with each other, a gap is formed on a sidewall of the lower contact electrode 1 at a portion of a part where the lower electrode 4 and the lower contact electrode 1 disalign with each other, and each said gaps is completely filled with a self-oxidized film or a self-nitridized film of the lower electrode 4.

In the semiconductor device according to the present invention described above in items (10) to (15), the gap is defined on the sidewall of the lower contact electrode 1 at a portion of a part where the lower electrode 4 and the lower contact electrode 1 disaligned from each other. The gap is longitudinally defined. In this case as well, generation of leak current can be prevented by using the same constitution as stated in items (2) to (7).

(16) The semiconductor device according to the present invention comprises: a lower contact electrode 1; a capacitor including a lower electrode 4 in a projected structure formed on the lower contact electrode 1, a capacitor dielectric film 5 formed on the lower electrode 4, and an upper electrode 6 formed on the capacitor dielectric film 5; and an adhesion improving layer 3 being contiguous to a lower electrode 4 and a lower contact electrode 1, in which the adhesion improving layer 3 is formed, covering at least a sidewall of the lower contact electrode 1, a self-oxidized film of the adhesion improving layer is formed on a sidewall of the adhesion improving layer 3 at a part where the lower electrode 4 and the lower contact electrode 1 do not disalign with each other, and a self-oxidized film of the adhesion improving layer 3 is formed on a exposed portion of the adhesion improving layer 3 at a portion of a part where the lower electrode 4 and the lower contact electrode 1 disalign with each other, whereby the adhesion improving layer 3 and the capacitor dielectric film 5 are isolated from each other by the self-oxidized film of the adhesion improving layer 3.

Also in the case that at least the side surface of the lower contact electrode 1 is thus covered with the adhesion improving layer 3, an self-oxide film of the adhesion improving layer 3 is provided without defining the gap to thereby prevent generation of leak current.

(17) In the semiconductor device according to the present invention described above in any one of items (9) to (16), the lower contact electrode 1 and the lower electrode 4 are formed in one-piece with each other.

In the case that at least the side surface of the lower contact electrode 1 is thus covered with the adhesion improving layer 3, the lower contact electrode 1 and the lower electrode 4 may be formed in one-piece with each other. The step of forming an electrode material for burying the lower contact electrode 1, and the CMP step are not necessary.

The semiconductor device according to the present invention comprises: a lower contact electrode; a capacitor including a lower electrode in a projected structure formed on the lower contact electrode, a capacitor dielectric film formed on the lower electrode, and an upper electrode formed on the capacitor dielectric film; and an adhesion improving layer being contiguous to a lower electrode and a lower contact electrode, in which the adhesion improving layer is formed, covering at least a sidewall of the lower contact electrode, a gap is formed on a sidewall of the adhesion improving layer at a part where the lower electrode and the lower contact electrode do not disalign with each other, and a gap is formed on a sidewall of the lower contact electrode at a portion of a part where the lower electrode and the lower contact electrode disalign with each other.

In the above-described semiconductor device, it is preferable that each said gaps is completely filled with an insulation film which is different form the capacitor dielectric film.

In the above-described semiconductor device, it is preferable that each said gaps is completely filled with a self-oxidized film or a self-nitridized film of the lower electrode.

The semiconductor device according to the present invention comprises: a lower contact electrode; a capacitor including a lower electrode in a projected structure formed on the lower contact electrode, a capacitor dielectric film formed on the lower electrode, and an upper electrode formed on the capacitor dielectric film; and an adhesion improving layer being contiguous to a lower electrode and a lower contact electrode, in which the adhesion improving layer is formed, covering at least a sidewall of the lower contact electrode, a self-oxidized film of the adhesion improving layer is formed on a sidewall of the adhesion improving layer at a part where the lower electrode and the lower contact electrode do not disalign with each other, and a self-oxidized film of the adhesion improving layer is formed on a exposed portion of the adhesion improving layer at a portion of a part where the lower electrode and the lower contact electrode disalign with each other, whereby the adhesion improving layer and the capacitor dielectric film are isolated from each other by the self-oxidized film of the adhesion improving layer.

(18) The method for fabricating the semiconductor device according to the present invention includes the step of etching an adhesion improving layer 3 which is contiguous to a lower electrode 4 of a capacitor in a projected structure and a lower contact electrode 1, in which the adhesion improving layer 3 is excessively etched to form a gap, and then a capacitor dielectric film 5 covering the lower electrode 4 is formed.

The gap for insulating the upper electrode 6 and the adhesion improving layer 3 from each other can be formed simply and by self-alignment by excessively etching the adhesion improving layer 3.

(19) In the method for fabricating the semiconductor device according to the present invention described above in item (18), the adhesion improving layer 3 is formed to cover at least a sidewall of the lower contact electrode 1, a gap is formed on a sidewall of the adhesion improving layer 3 at a part where the lower electrode 4 and the lower contact electrode 1 disalign with each other, and a gap is formed on the sidewall of the lower contact electrode 1 at a portion of a part where the lower electrode 4 and the lower contact electrode 1 disalign with each other.

In the case that to prevent peeling of the lower contact electrode 1, the adhesion improving layer 3 is thus provided to cover at least the side surface of the lower contact electrode 1, the gap is defined on the sidewall of the lower contact electrode 1 at a portion of a part where the lower electrode 4 and the lower contact electrode 1 disaligned from each other, which makes no problem.

(20) The semiconductor device fabrication method according to the present invention comprises the steps of: forming an opening in an insulation film; forming an adhesion improving layer 3, covering at least a sidewall of the opening; depositing a conductive material, filling the opening; polishing or etching back the conductive material to form the lower contact electrode 1 and a lower electrode 4 buried in the opening, the lower contact electrode 1 and the lower electrode 4 being formed in one-piece; removing at least a part of the insulation film; etching the exposed adhesion improving layer 3 to form a gap on a sidewall of the lower contact electrode 1; and forming a capacitor dielectric film 5 covering the lower electrode 4.

The lower contact electrode 1 and the lower electrode 4 may be thus formed unseparable in one-piece by CMP. In this case as well, the adhesion improving layer 3 is excessively etched to define by self-alignment the gap on the sidewall of the lower contact electrode 1.

(21) The semiconductor device fabrication method according to the present invention comprises the steps of: etching an adhesion improving layer 3 contiguous to a lower electrode 4 of a capacitor in a projected structure and a lower contact electrode 1; oxidizing at least an exposed part of the adhesion improving layer 3 to form a self-oxidized film of the adhesion improving layer 3; and forming a capacitor dielectric film 5 covering the lower electrode 4.

In the case that a self-oxide film of the adhesion improving layer 3 is thus used, the excessive etching step for defining the gap is unnecessary. The steps can be simple.

(22) In the semiconductor device fabrication method according to the present invention described in item (21), the adhesion improving layer 3 is formed so as to cover at lest a sidewall of the lower contact electrode 1.

The adhesion improving layer 3 is thus provided to cover at least the side surface of the lower contact electrode 1, whereby peeling of the lower contact electrode 1 can be prevented, which leads to the prevention of peeling of the lower electrode 4.

(23) The semiconductor device fabrication method according to the present invention comprises the steps of: forming an opening in an insulation film; forming an adhesion improving layer 3, covering at least a sidewall of the opening; depositing a conductive material, filling the opening; polishing or etching back the conductive material to form a lower contact electrode 1 and a lower electrode 4 buried in the opening, the lower contact electrode 1 and the lower electrode 4 being formed in one-piece; removing at least a part of the insulation film; etching an exposed portion of the adhesion improving layer 3; oxidizing the exposed portion of the adhesion improving layer 3; and forming a capacitor dielectric film 5 covering the lower electrode 4.

In the case that the lower contact electrode 1 and the lower electrode 4 are thus formed unseparable in one-piece by CMP, a self-oxide film of the adhesion improving layer 3 is used, whereby the excessive etching step for defining the gap is unnecessary. The steps can be simple.

(24) In the semiconductor device fabrication method according to the present invention described in any one of items (18) to (23), a protection film is formed on the upper surface of the lower electrode 4, and an upper electrode 6 covering a sidewall of the lower electrode 4 is formed by depositing a conductive material and anisotropically etching the conductive material with the protection film as a mask.

It is possible that the protection film is provided on the upper surface of the lower electrode 4 in a projected shape through the adhesion improving layer 3, and anisotropic etching is performed with the protection film as a mask to form the upper electrode 6 forming the capacitor as, e.g., a sidewall-like electrode on the sidewall of the lower electrode 4. This is effective especially in a case that because of high integration the etching of the upper electrode 6 is difficult.

BRIEF DESCRIPTION OF THE DRAWINGS

FIGS. 2A–2B are views explaining those of the fabrication steps of fabricating the semiconductor device according to a first embodiment of the present invention, which are on the way to the completion of the semiconductor device.

DETAILED DESCRIPTION OF THE INVENTION

A FIRST EMBODIMENT

Figure 1A:
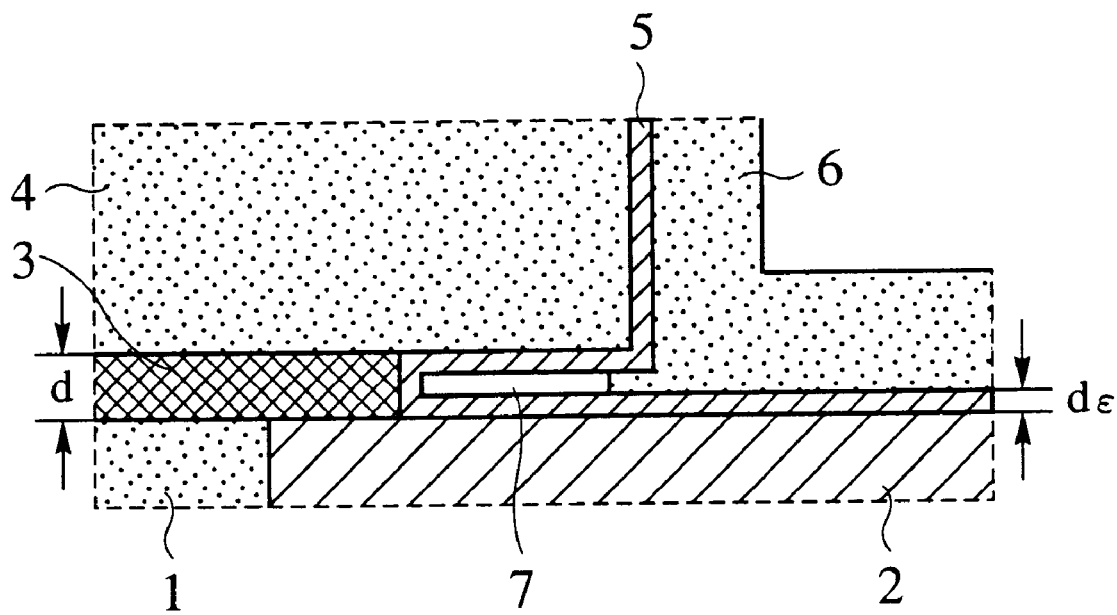
FIGS. 1A and 1B are views explaining the principle constitution of the present invention.
Figure 1B:
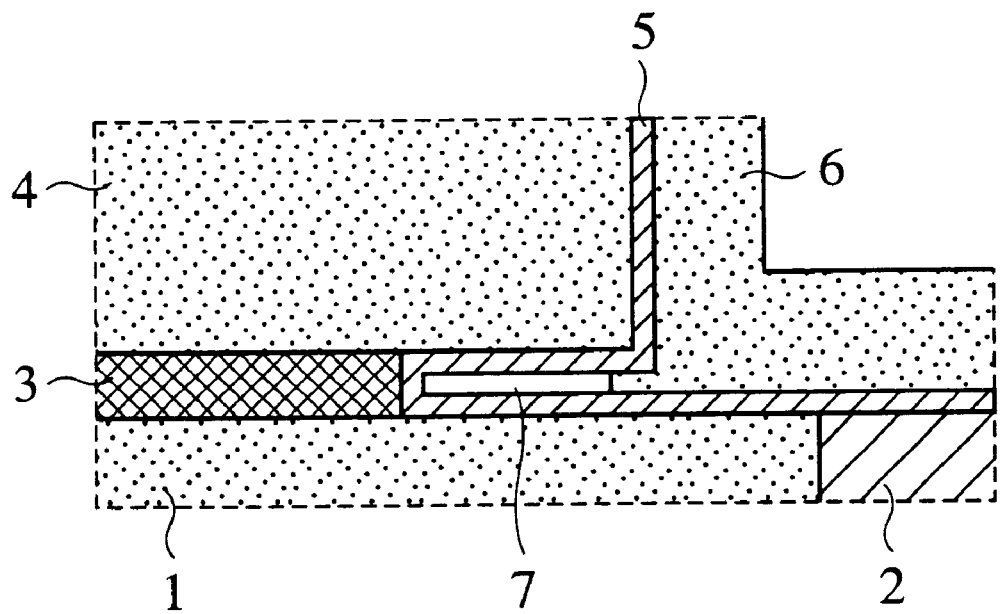

A first embodiment of the present invention will be explained with reference to FIGS. 2A–2B, 3A–3B, 4A–4B and 5A–5B.

FIG. 2B is a plan view of a DRAM at the time that a lower plug 25 is formed. FIG. 2A is a sectional view of the DRAM. In FIG. 2A, the layer structure of the DRAM below a first inter-layer insulation film 19 including the first inter-layer insulation film 19 corresponds to that of the sectional view along the one-dot chain line B–B' in FIG. 2B, the layer structure of the DRAM of a second interlayer insulation film 22 to a third inter-layer insulation film 24 corresponds to that of the sectional view along the one-dot chain line A–A' in FIG. 2B, and the layer structure of the DRAM above the third inter-layer insulation film 24 excluding the third inter-layer insulation film 24 corresponds to that of the sectional view along the one-dot chain line B–B' in FIG. 2B. In FIG. 2A, etc., to simplify the showing, a layer structure of the DRAM up to the third inter-layer insulation film 24 including the inter-layer insulation film 24 is represented by A–A'.

In FIG. 2A, etc., a bit line 23 is shorted to the lower plug 25 for convenience of the showing, but actually they are positionally isolated from each other as shown in FIG. 2B.

Reference is made to FIGS. 2A and 2B.

First, a device isolation oxide film 12 is formed by selective oxidation in a prescribed region of a p-type silicon substrate 11, and then the exposed surface of the p-type silicon substrate 11 surrounded by the device isolation oxide film 12 is thermally oxidized to form a gate oxide film 13. Then, a non-doped polycrystalline silicon layer is deposited, then is doped with P (phosphorus) ions and next etched into a prescribed pattern to form gate electrodes 14 and word lines 15, which are extensions of the gate electrodes 14.

Actually, an $SiO_2$ film or an $Si_3N_4$ film as a protection film is provided on the gate electrodes 14 by CVD method.

Next, with the gate electrodes 14 as a mask, As (arsenic) ions are implanted to form an $n^+$-type drain region 17 and an $n^+$-type source region 18. Then, an $SiO_2$ film is deposited on the entire surface by CVD method and etched to form sidewalls 16.

In the above-described ion-implanting step, instead it is possible that an LDD (Lightly Doped Drain) region of a shallow $n^-$-type region is formed, and As ions are implanted after the sidewalls 16 have been formed, to form the $n^+$-type drain region 17 and the $n^+$-type source region 18.

Next, again an $SiO_2$ film is deposited on the entire surface by CVD method to form the first inter-layer insulation film 19, and then via holes for the $n^+$-type drain region 17 and the $n^+$-type source region 18 are formed. Then a TiN film and a W film to be a barrier metal is sequentially deposited by sputtering method and polished by CMP method to form contact plugs 20, 21 with the TiN film, the W, etc. buried in.

An SiN film to be a stopper in the CMP step may be formed on the first inter-layer insulation film 19.

Then again, an $SiO_2$ film is deposited on the entire surface by CVD method to form the second inter-layer insulation film 22, and then a via hole for the contact plug 20 is formed. Then, a doped polycrystalline silicon film is deposited on the entire surface by LPCVD method and patterned to form the bit line 23.

Next again, an $SiO_2$ film is deposited on the entire surface by CVD method to form the third inter-layer insulation film 24, and then a via hole arriving at the contact plug 21 is formed. Then, an Ru film is deposited on the entire surface by CVD method which is superior in step coverage and polished by CMP method to form the lower plug 25 buried in the via hole. In this specification, the lower plug (the lower contact electrode) means a electrode which is electrically contiguous to the lower portion of the storage node (the lower electrode). The lower electrode may be formed also on the side portion of the bit line or on the upper portion of the bit line.

It is also possible to provide on the third inter-layer insulation film 24 an SiN film to be the stopper in the CMP step.

Figure 3A:
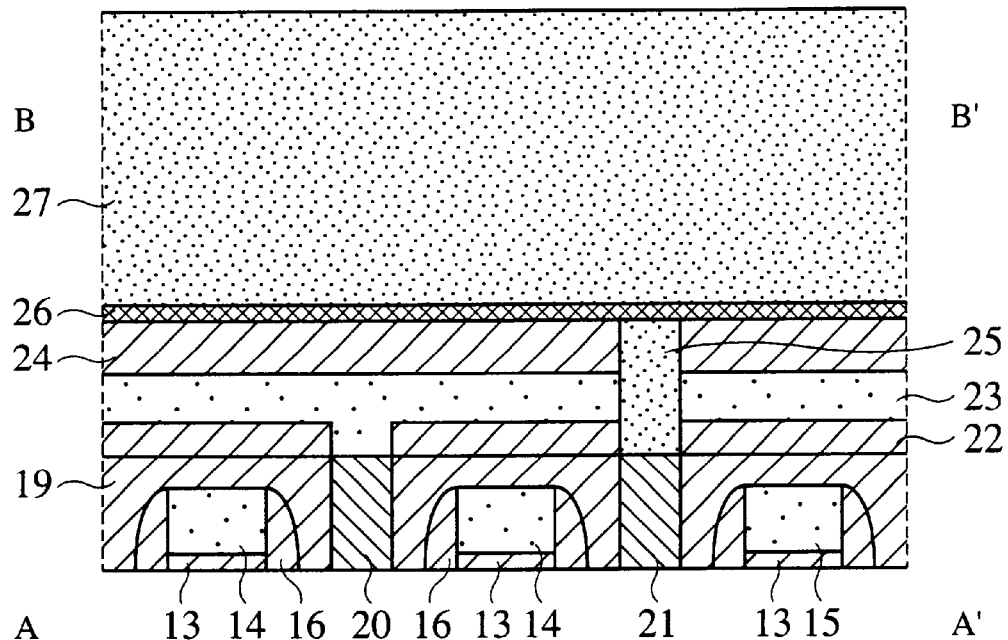
FIGS. 3A–3B are views explaining those of the fabrication steps of fabricating the semiconductor device according to the first embodiment of the present invention, which follow the last one of the steps shown in FIGS. 2A and 2B and are on the way to the completion of the semiconductor device.

Reference is made to FIG. 3A.

Next, a TiN film 26 of a 1–100 nm-thick, e.g., a 10 nm-thick, is deposited on the entire surface by sputtering method, and again an Ru film 27 of, e.g., a 1.0 μm-thick is deposited by CVD method.

Figure 3B:
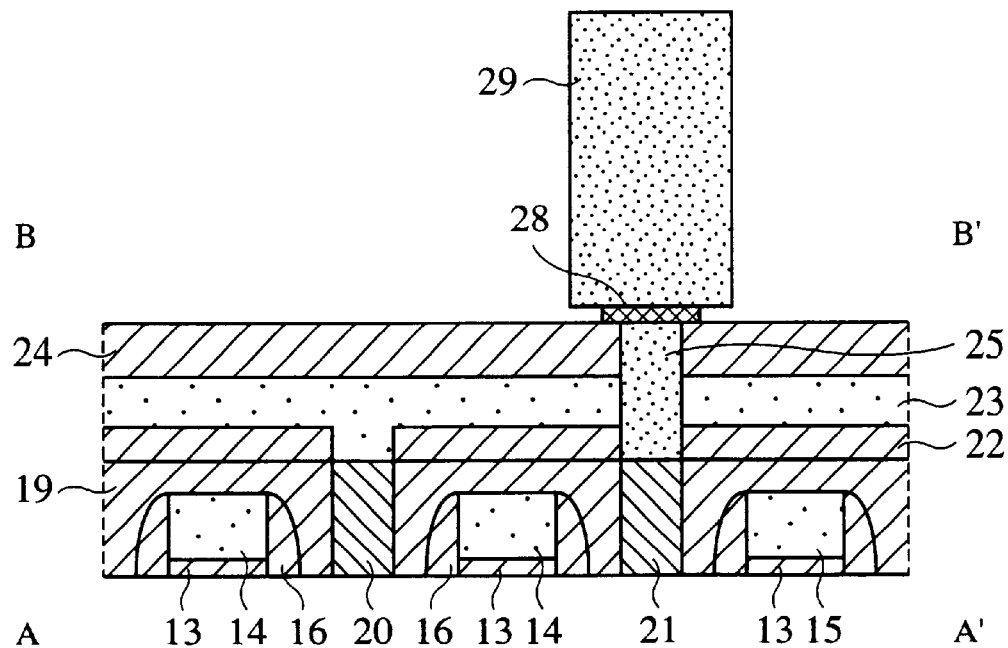

Reference is made to FIG. 3B.

Then, the Ru film is etched by anisotropic etching using a prescribed etching mask and an $O_2+Cl_2$ mixed gas into a prescribed pattern which is, for example, 0.25 μm-width along the bit line 23 and 0.5 μm-width along the word lines so as to form a projected storage node 29.

The TiN film 26 is not substantially etched by the $O_2+Cl_2$ mixed gas, and can function as the etching stopper.

Next, the exposed portion of the TiN film 26 is etched isotropic etching using heated hydrochloric acid, sulfuric acid, hydrogen peroxide aqueous solution+hydrochloric acid, or hydrogen peroxide aqueous solution+sulfuric acid, and then the TiN film 26 is excessively etched to form an adhesion improving layer 28 defining a slit-shaped gap on the sidewall.

Incidentally, a height of the gap is a film thickness "d" of the adhesion improving layer 28.

The etching is not essentially wet etching, and may be dry etching as long as the etching is isotropic.

Figure 4A:
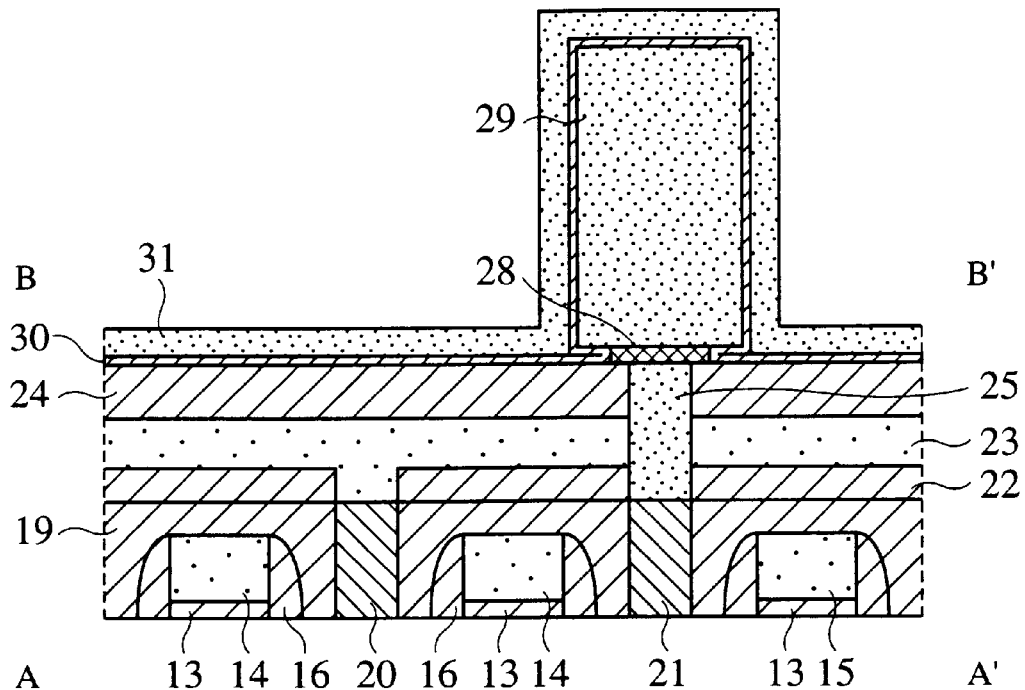
FIGS. 4A–4B are views explaining those of the fabrication steps of fabricating the semiconductor device according to the first embodiment of the present invention, which follow the last one of the steps shown in FIG. 3B.

Reference is made to FIG. 4A.

Then, a $Ta_2O_5$ film 30 of a thickness "$d_\epsilon$" of , e.g., 10 nm-thick, and an Ru film 31 of, e.g., a 150 nm-thick are sequentially deposited by CVD method.

Figure 4B:
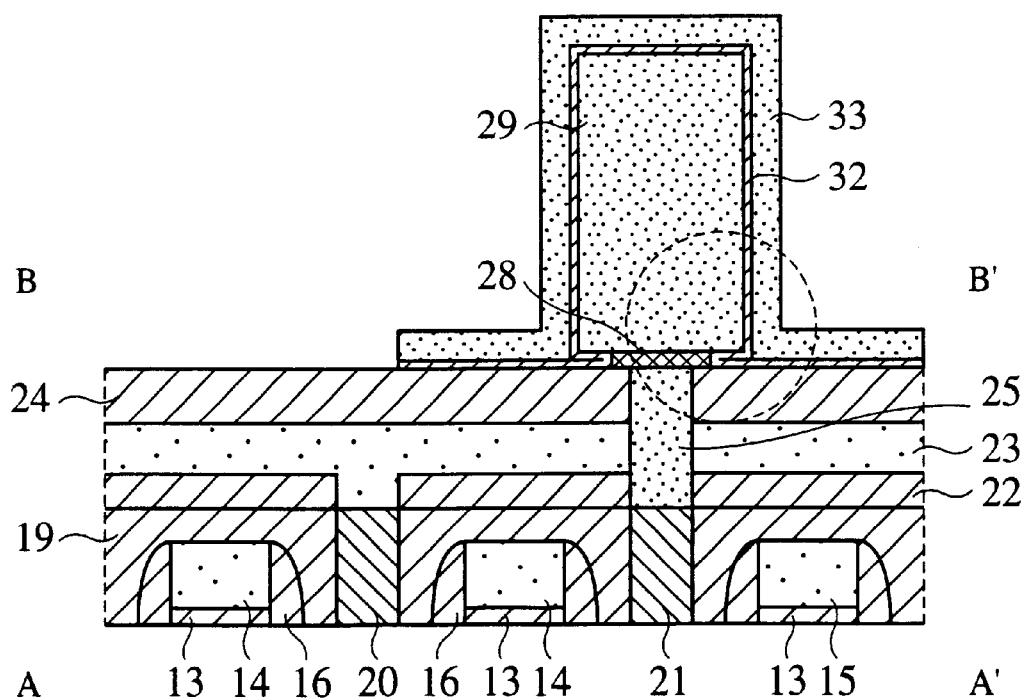

Reference is made to FIG. 4B.

Next, the Ru film 31 and the $Ta_2O_5$ film 30 are sequentially etched into a prescribed shape to form a cell plate 33 and a capacitor dielectric film 32.

Figure 5A:
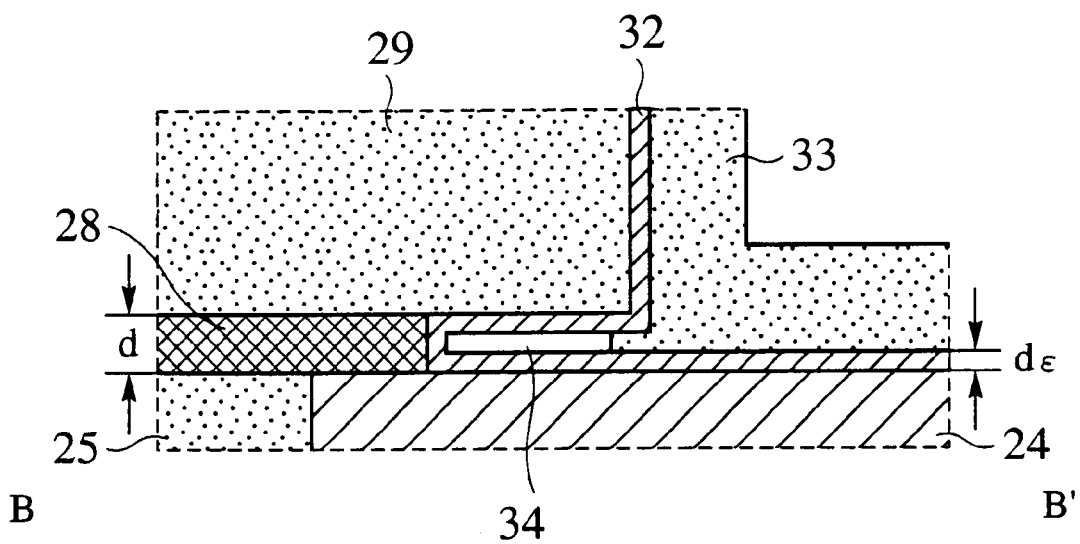
FIGS. 5A–5B are enlarged views of a major part of the first embodiment of the present invention.

Reference is made to FIG. 5A.

FIG. 5A is an enlarged view of the major part circled by the dotted line in FIG. 4B. In the above-described case, a height of the gap, i.e., a thickness "d" of the adhesion improving layer 28 satisfies the relationship $$2 \times d_\epsilon < d \leq d_v$$

with respect to a thickness $d_\epsilon$ of the capacitor dielectric film 32 and a width $d_v$ which permits the CVD-Ru film forming the cell plate 33 to intrude capably of the step coverage. As a result, the capacitor dielectric film 32 of $Ta_2O_5$ intrudes deep into the gap to become contiguous to the sidewall of the adhesion improving layer 28, while the CVD-Ru film, which is good but inferior to $Ta_2O_5$ in the step coverage, intrudes into the gap up to the vicinity of the entrance of the gap to form the cell plate 33. Thus, the gap is partially surrounded by the capacitor dielectric film 32 and the cell plate 33 to form a cavity 34.

The capacitor dielectric film 32 has the film quality deteriorated at the contiguous portion between the adhesion improving layer 28 and the capacitor dielectric film 32. However, a voltage is applied to the contiguous portion through the cavity 34. Accordingly, the adhesion improving layer 28 and the cell plate 33 are isolated from each other, effectively insulated from each other by the cavity 34, and no leak current flows. Accordingly, a charge stored in the capacitor can be sufficiently retained.

Figure 5B:
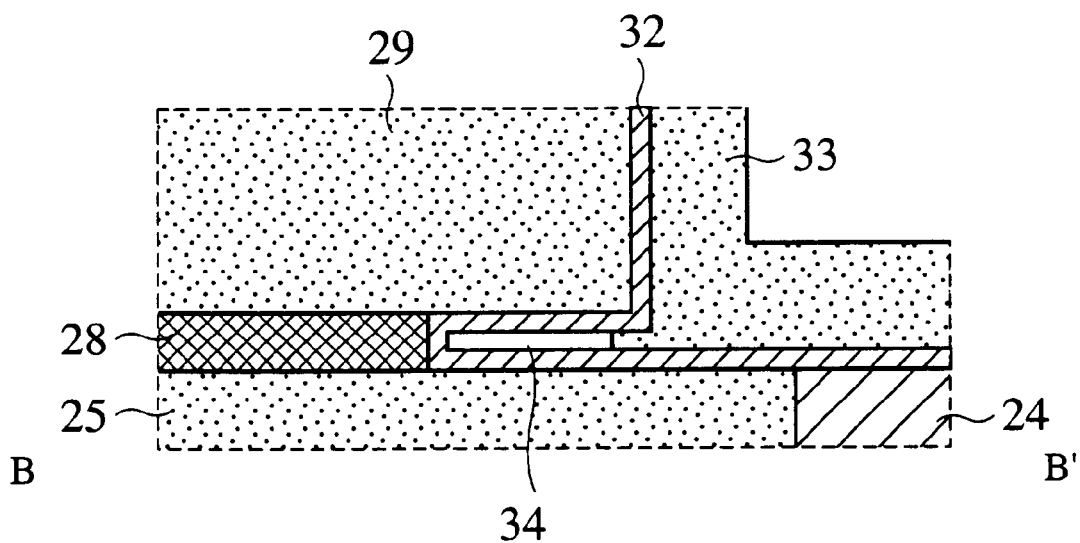

Reference is made to FIG. 5B.

FIG. 5B is an enlarged view of the major part for explaining the disalignment between the storage node 29 and the lower plug 25. As in FIG. 5A, the capacitor dielectric film 32 of $Ta_2O_5$ intrudes deep into the gap to become contiguous to the sidewall of the adhesion improving layer 28, while the CVD-Ru film, which is good but inferior to $Ta_2O_5$ in the step coverage, intrudes into the gap up to the vicinity of the entrance of the gap to form the cell plate 33. Thus, the gap is partially surrounded by the capacitor dielectric film 32 and the cell plate 33 to form the cavity 34.

In a case that the cell plate 33 is deposited by sputtering method, the step coverage is inferior, and a width $d_v$ becomes larger.

In this case, even when the disalignment takes place, the storage node 29 is contiguous to the adhesion improving layer 28 at the same contiguous area as is when the disalignment does not take place and never peel.

In this case, a capacitor is formed also between the lower plug 25 and the cell plate 33.

As described above, in the present embodiment, the adhesion improving layer 28 is excessively etched to define the slit-shaped gap, and a part of the gap is formed in the cavity 34. Even when the adhesion improving layer 28 and the capacitor dielectric film are contiguous to each other, the cavity 34 effectively insulates the adhesion improving layer 28 from the cell plate 33. Accordingly, leak current does not flow.

Even when the disalignment takes place between the storage node 29 and the lower plug 25, the storage node 29 is contiguous to the adhesion improving layer 28 at the same contiguous area as is when the disalignment does not take place to be thereby maintained stable. The storage node 29 never peels.

In this case, a capacitor is formed also between the lower plug 25 and the cell plate 33.

A Modification of the First Embodiment

Then, with reference to FIG. 6, a modification of the first embodiment of the present invention will be explained.

Figure 6:
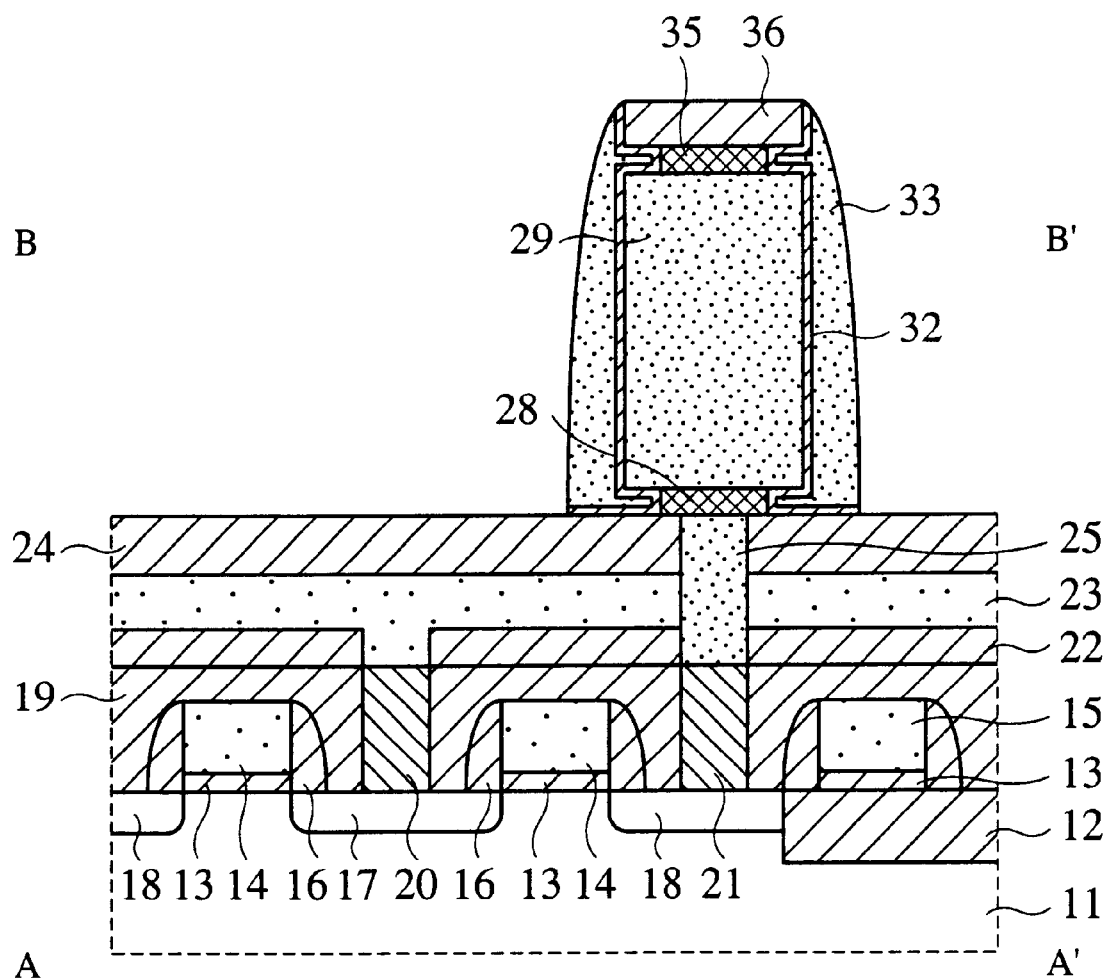
FIG. 6 is a view explaining a modification of the first embodiment of the present invention.

Reference is made to FIG. 6.

FIG. 6 is a sectional view of the modification in the same state as FIG. 4B. The deposition steps up to the Ru film depositing step including the Ru film depositing step are completely the same as those of the first embodiment. The explanation of the steps up to the Ru film depositing step including the Ru film depositing step will be omitted.

In the same way as in the first embodiment, an Ru film is deposited, then a TiN film to be an adhesion improving layer of, e.g., a 10 nm-thick is deposited by sputtering method. Next, a 300 nm-thick SiN film to be a protection film is formed by CVD method. Then the protection film, the TiN film, the Ru film, and the TiN film are etched into the same shape as in the first embodiment to form an insulation film 36, the adhesion improving layer 35 and the storage node 29. Next, the adhesion improving layers 28, 35 are excessively etched to define a slit-shaped gap.

The adhesion improving layer 35 is side-etched, but there is no problem.

Then, a $Ta_2O_5$ film and a Ru film are deposited and then are anisotropically etched by reactive ion etching with the insulation film 36 as a mask to form sidewall-shaped cell plate 33 and a capacitor dielectric film 32.

In the modification of the first embodiment, the cell plate 33 is thus formed by anisotropical etching in a sidewall shape by self-alignment, which permits the photolithography step to be omitted, and furthermore is effective in a case that, because of high integration, for the usual lithography step, the storage nodes 29 are too high, and a gap between the storage nodes 29 is too small.

A SECOND EMBODIMENT

Next, a second embodiment of the present invention will be explained with reference to FIGS. 7A and 7B.

Figure 7A:
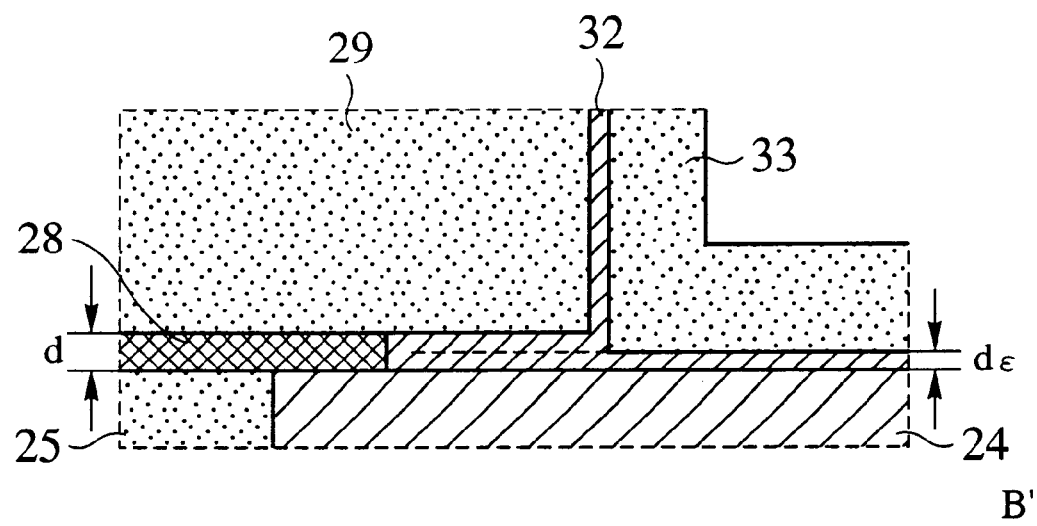
FIGS. 7A–7B are views explaining a major part of a second embodiment of the present invention.
Figure 7B:
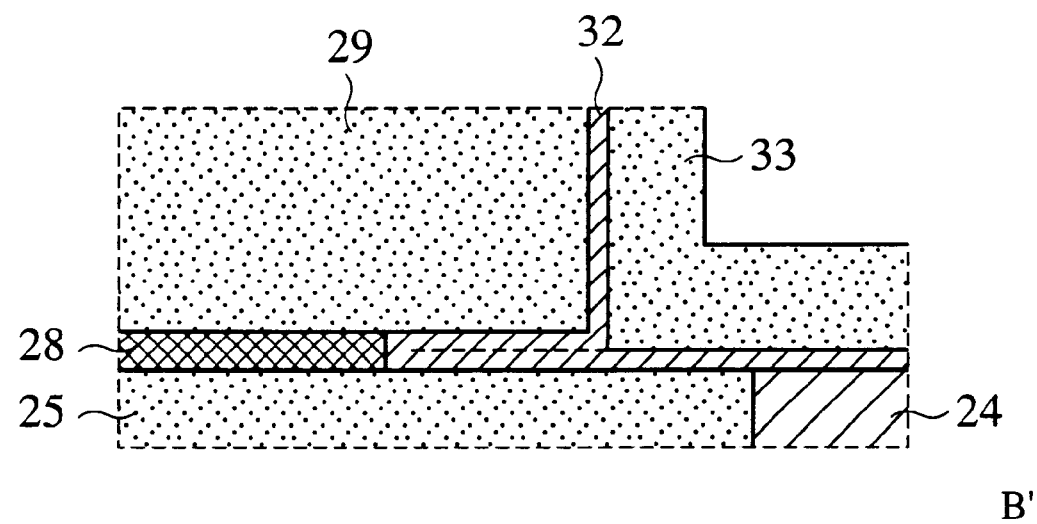

Reference is made to FIGS. 7A and 7B.

FIGS. 7A and 7B correspond to FIGS. 5A and 5B. The sequence of the fabrication steps, and the materials forming the respective elements are completely the same as those of the first embodiment, and the explanation of the fabrication steps is omitted.

In the second embodiment, a thickness "d" of the adhesion improving layer 28 of TiN film is below 20 nm, e.g., 10 nm, a depth of the gap, i.e., an excessive etched amount of the adhesion improving layer 28 is 10–20 nm, and $T_2O_5$ film forming the capacitor dielectric film 32 is deposited in a 10 nm-thick, filling completely the gap with the $Ta_2O_5$ film forming the capacitor dielectric film 32.

That is, in the second embodiment, the relationship $$d \leq 2 \times d_\epsilon$$

is satisfied.

In the second embodiment as well, the capacitor dielectric film 32 is contiguous to the sidewall of the adhesion improving layer 28, but the adhesion improving layer 28 and the cell plate 33 are isolated from each other by the capacitor dielectric film 32 of a thickness of (a depth of the gap+a film thickness $d_\epsilon$ of the capacitor dielectric film) $\approx 2 \times d_\epsilon \sim 3 \times d_\epsilon$. An applied electric field is mitigated, and leak current does not flow.

When the disalignment takes place between the storage node 29 and the lower plug 25 as shown in FIG. 7B, the storage node 29 is contiguous to the adhesion improving layer 28 at the same contiguous area as in the case that the disalignment does not take place, whereby the storage node 29 is maintained stable and never peels.

A THIRD EMBODIMENT

Then, a third embodiment of the present invention will be explained.

Figure 8A:
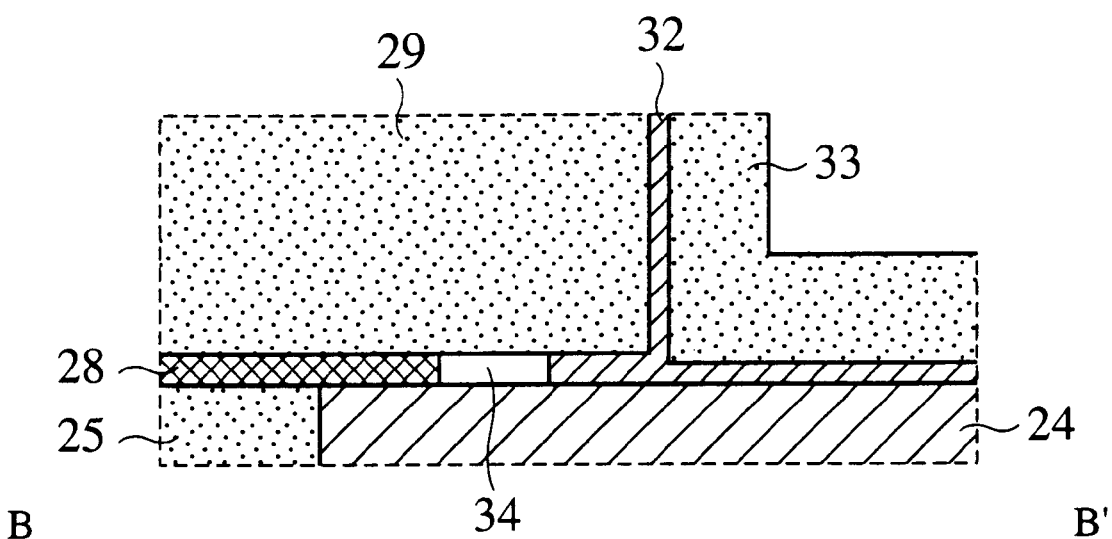
FIGS. 8A–8B are enlarged views of a major part of a third embodiment of the present invention.
Figure 8B:
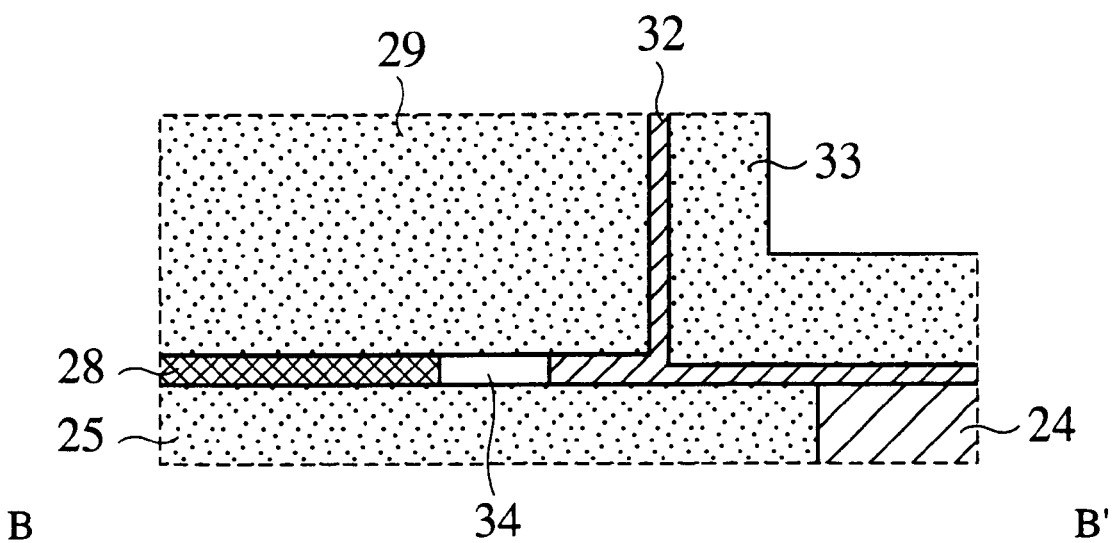

Reference is made to FIGS. 8A and 8B.

FIGS. 8A and 8B correspond to FIGS. 5A and 5B. The sequence of the fabrication steps, and the materials forming the respective elements are completely the same as those of the first embodiment, and the explanation of the fabrication steps is omitted.

In the third embodiment, a film thickness "d" of the adhesion improving layer 28 of TiN film is as thin as 1–10 nm. In a case that $Ta_2O_5$ film forming the capacitor dielectric film 32 is deposited in a 10 nm-thick, even CVD-$Ta_2O_5$ film, which is superior in the step coverage, cannot intrude deep into the gap, and the cavity 34 is formed between the adhesion improving layer 28 and the capacitor dielectric film 32.

In the third embodiment, the capacitor dielectric film 32 is not contiguous to the sidewall of the adhesion improving layer 28, whereby the capacitor dielectric film 32 does not deteriorate.

The adhesion improving layer 28 is isolated from the cell plate 33 by the cavity 34 and the relatively thick capacitor dielectric film 32, whereby an applied electric field is mitigated, and leak current does not flow.

In th is case as well, when the disalignment takes place between the storage node 29 and the lower plug 25 as shown in FIG. 8B, the storage node 29 is contiguous to the adhesion improving layer 28 at the same contiguous area as in the case that the disalignment does not take place, whereby the storage node 29 can be maintained stable and never peels.

A FOURTH EMBODIMENT

Next, a fourth embodiment of the present invention will be explained with reference to FIGS. 9A and 9B.

Figure 9A:
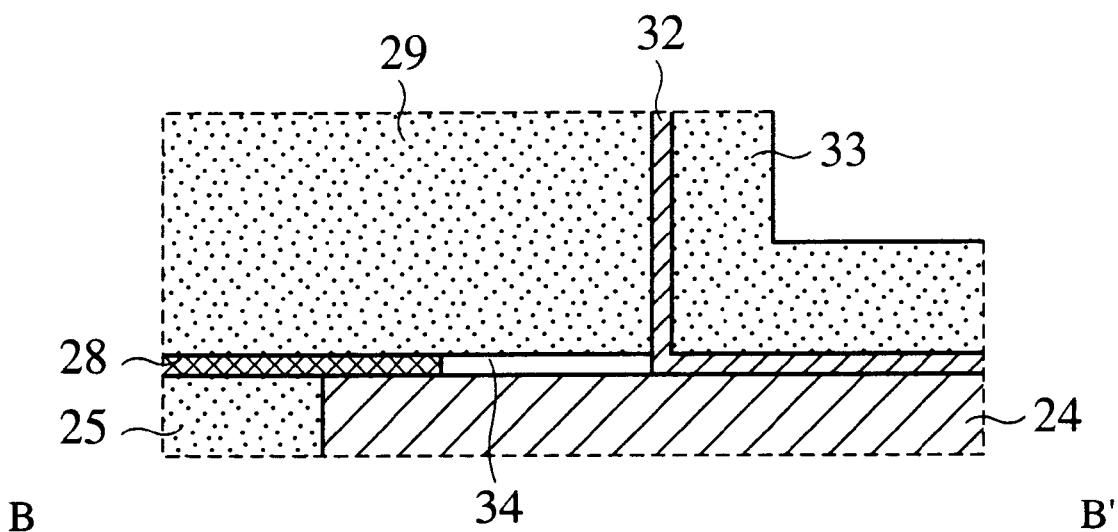
FIGS. 9A–9B are enlarged views of a major part of a fourth embodiment of the present invention.
Figure 9B:
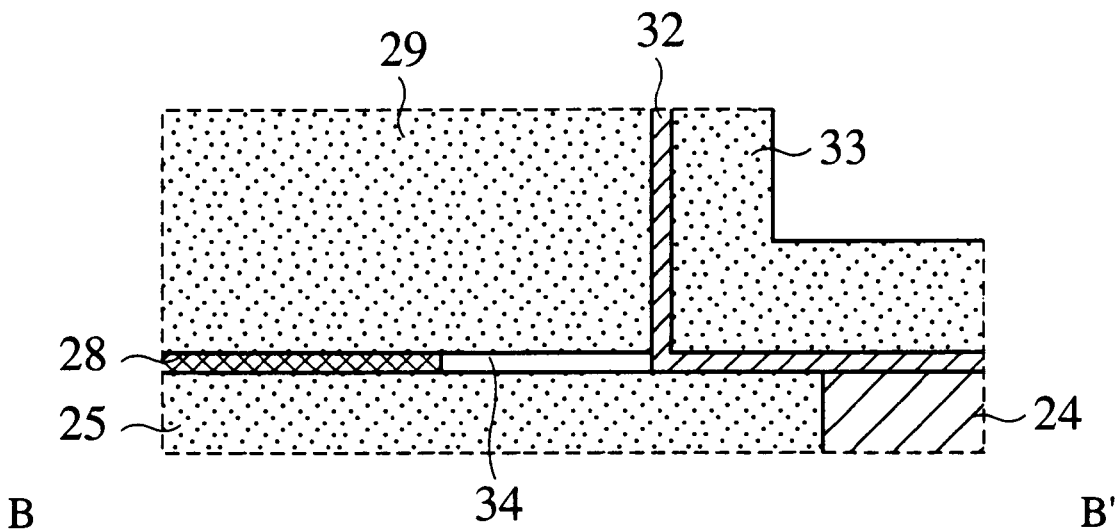

Reference is made to FIGS. 9A and 9B.

FIGS. 9A and 9B correspond to FIGS. 5A and 5B. The sequence of the fabrication steps, and the materials forming the respective elements are completely the same as those of the first embodiment, and the explanation of the fabrication steps is omitted.

In the fourth embodiment, a thickness "d" of the adhesion improving layer of TiN film is further thinned to below 5 nm.

In a case that $Ta_2O_5$ film is deposited in a 10 nm-thick, even CVD-$Ta_2O_5$ film cannot substantially into the gap, and the entire gap becomes the cavity 34.

In the fourth embodiment as well, the capacitor dielectric film 32 is not contiguous to the sidewall of the adhesion improving layer 28, whereby the capacitor dielectric film 32 does not deteriorate. The adhesion improving layer 28 and the cell plate 33 are isolated from each other by the long cavity 34, whereby an applied electric field is mitigated, and leak current does not flow.

In a case that the storage node 29 is disaligned with the lower plug 25 as shown in FIG. 9B, the storage node 29 is contiguous to the adhesion improving layer 28 at the same contiguous area as in the case that the storage node 29 is not disaligned and maintained stable. The storage node 29 does not peel.

When the capacitor dielectric film 32 is formed by sputtering method or CVD method using a high pressure or a high temperature for forming the film, the step coverage can be much degraded, whereby even in a case that a height of the gap, i.e., a thickness d of the adhesion improving layer 28 is as thick as above 5 nm, the capacitor dielectric film 32 can have the same film state as in FIGS. 9A and 9B.

A FIFTH EMBODIMENT

Then, a fifth embodiment of the present invention will be explained with reference to FIGS. 10A–10B and 11A–11B.

Figure 10A:
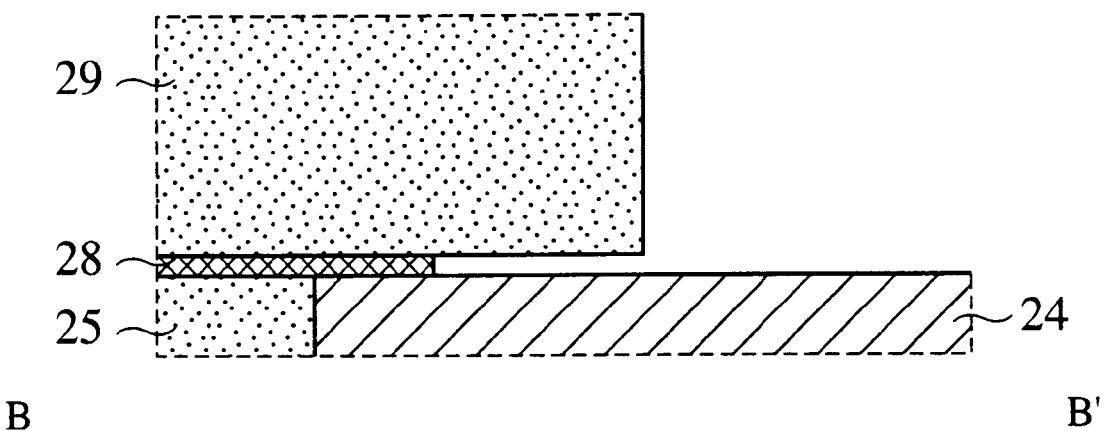
FIGS. 10A–10B are views explaining those of the fabrication steps of fabricating the semiconductor device according to a fifth embodiment of the present invention, which are on the way to the completion of the semiconductor device.
Figure 10B:
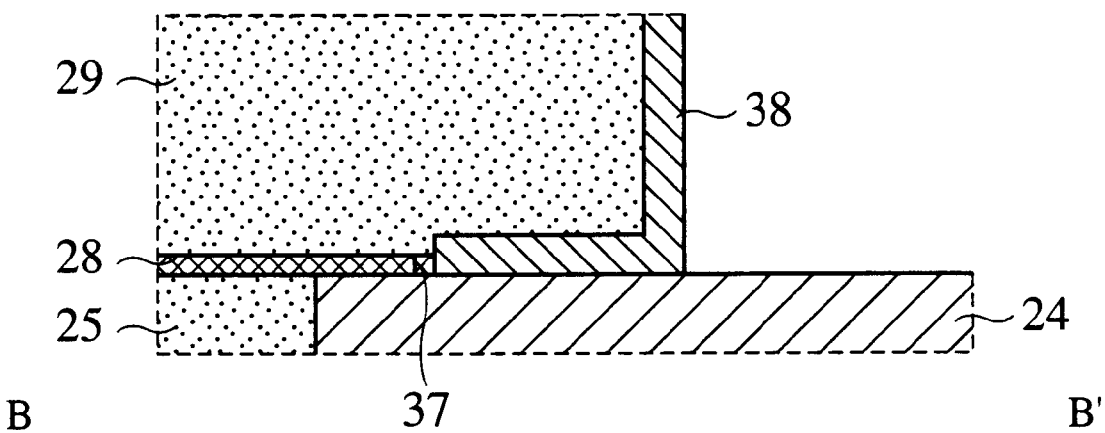
Figure 11A:
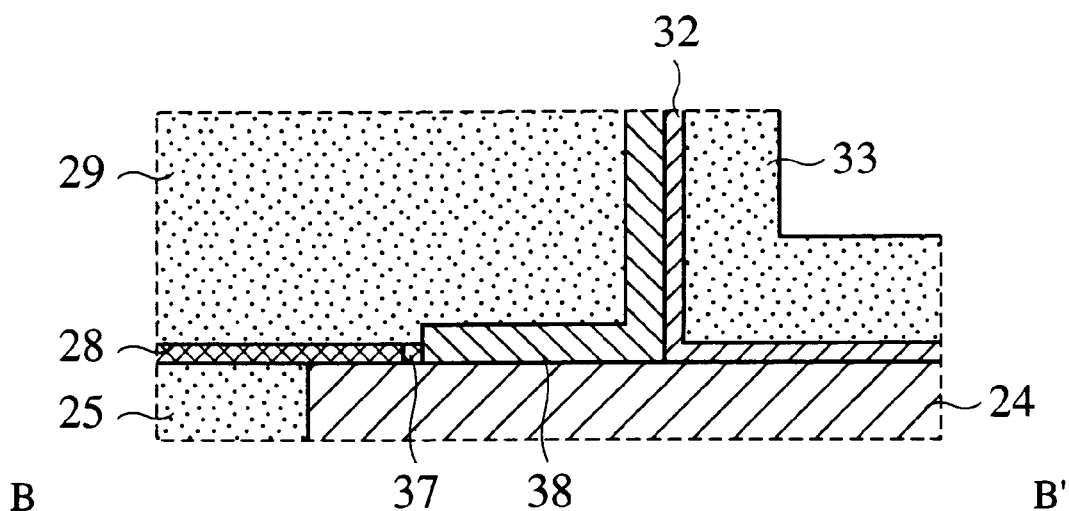
FIGS. 11A–11B are views of those of the fabrication steps of fabricating the semiconductor device according to the fifth embodiment of the present invention, which follow the last one of the steps shown in FIG. 10B.
Figure 11B:
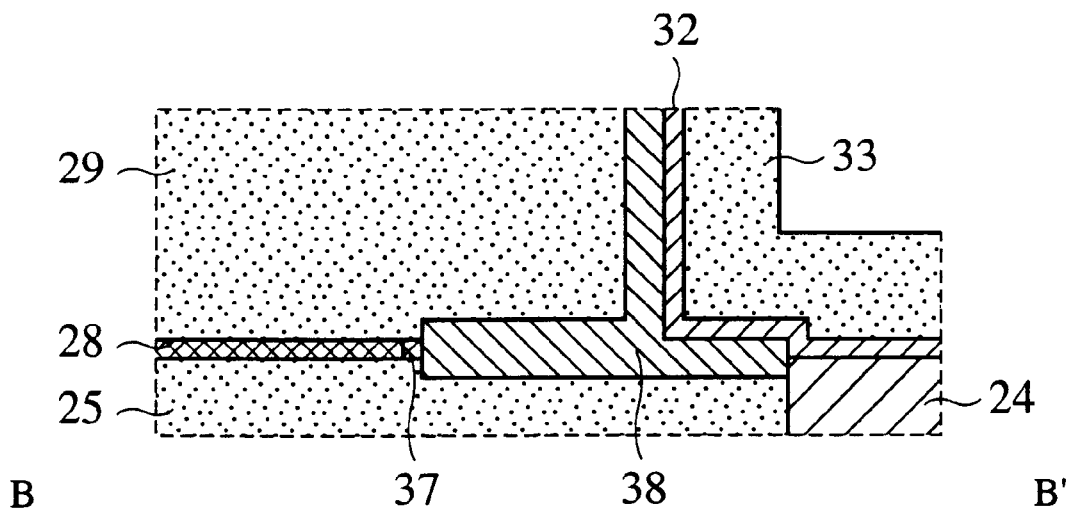

FIGS. 10A, 10B and 11A are enlarged views of the contiguous portion between the lower plug 25 and the storage node 29 and correspond to FIG. 5A. FIG. 11B corresponds to FIG. 5B.

The fabrication steps up to the step of excessively etching the adhesion improving layer 28 including the adhesion improving layer excessive etching step are completely the same as those of the first embodiment, and the explanation of these steps is omitted.

Reference is made to FIG. 10A.

The adhesion improving layer 28 is formed by performing the completely the same excessive etching as in the first embodiment.

Reference is made to FIG. 10B.

Then, the surface of the storage node 20 of Ru film is oxidized by a heat-treatment in an oxidizing atmosphere of 450–600° C. to form a ruthenium oxide (RuO) film 38, so that the gap on the sidewall of the adhesion improving layer 28 is filled with the ruthenium oxide film 38 owing to volume expansion of the Ru (ruthenium) at the time of its transform to the ruthenium oxide.

That is, the heat-treatment is performed for a period of time in which the gap on the sidewall of the adhesion improving layer 28 is completely filled with the ruthenium oxide film 38.

The exposed portion of the sidewall of the adhesion improving layer 28 is oxidized, and oxide film 37 is formed.

Reference is made to FIG. 11A.

After the above-described step, a $Ta_2O_5$ film and an Ru are deposited in the same way as in the first embodiment and are etched into a prescribed shape to form the capacitor dielectric film 32 and the cell plate 33. Thus, a basic structure of the DRAM is completed.

Reference is made to FIG. 11B.

In a case that the disalignment takes place between the storage node 29 and the lower plug 25, in the step of oxidizing the storage node 29 the exposed portion of the Ru film forming the lower plug 25 is also oxidized to form an RuO film.

The ruthenium oxide film 38, which has good conductivity, does not decrease a capacitance and, in addition, satisfies the above-described requirements (1) to (5), and accordingly does not deteriorate the film quality of capacitor dielectric film 32.

In the fifth embodiment, the capacitor dielectric film 32 and the adhesion improving layer 28 are not contiguous to each other, whereby deterioration of the capacitor dielectric film 32 does not take place.

In the description of the fifth embodiment, the self-oxidized film is used, but the storage node may be nitridized to bury the gap with a self-nitridized film. In this case, the self-nitridized film must have conductivity, and accordingly the storage node 29 must be formed of a conductive member whose self-nitridized film has conductivity. For example, it is possible that W is used in place of Ru, and a self-nitridized film (WN film) having conductivity formed by nitridizing the surface of the W film is used.

In this case, in which, as shown in FIG. 11B, the disalignment takes place between the storage node 29 and the lower plug 25, the storage node 29 is contiguous to the adhesion improving player 28 at the same contiguous area as in the case that the disalignment does not take place, whereby storage node 29 does not peel.

A SIXTH EMBODIMENT

Next, the fabrication steps of a sixth embodiment of the present invention will be explained with reference to FIGS. 12A–12C and 13A–13B.

FIGS. 12A–12C and 13A are enlarged views of the major part of the contiguous portion between the lower plug 25 and the storage node 29 and correspond to FIG. 5A. FIG. 13B corresponds to FIG. 5B.

The fabrication steps up to the step of excessively etching the adhesion improving layer 28 including the adhesion improving layer 28 are completely the same as those of the first embodiment, and the explanation of these steps is omitted.

Figure 12A:
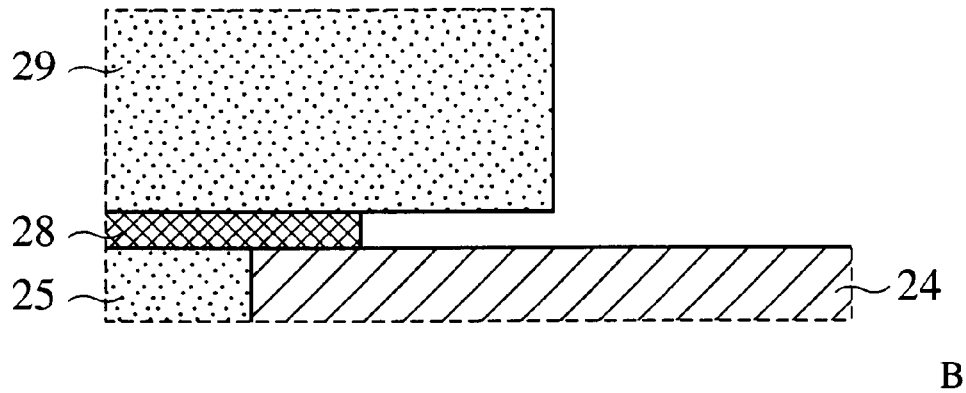
FIGS. 12A–12C are views explaining those of the fabrications steps of fabricating the semiconductor device according to a sixth embodiment of the present invention, which are on the way to the completion of the semiconductor device.

Reference is made to FIG. 12A.

The excessive etching is performed in completely the same way as in the first embodiment to form the adhesion improving layer 28.

A thickness of the adhesion improving layer 28 is 10–50 nm, e.g., 20 nm.

Figure 12B:
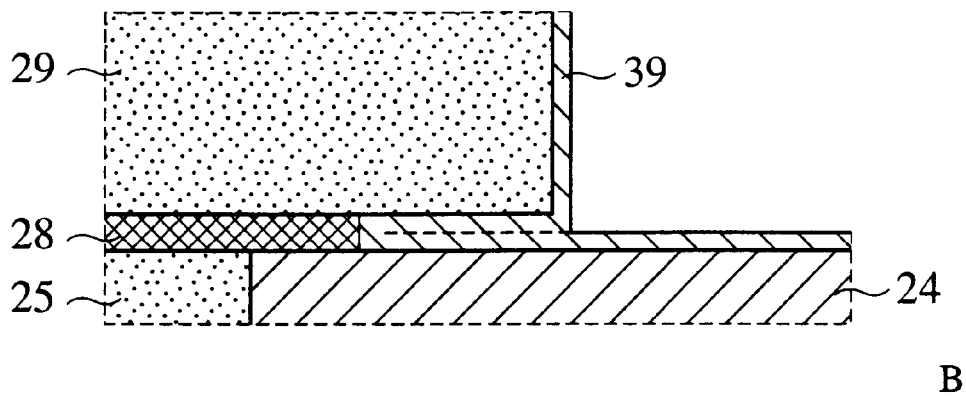

Reference is made to FIG. 12B.

Then, the insulation film 39 of $SiO_2$ film is deposited by CVD method to fill the gap with the insulation film 39.

Figure 12C:
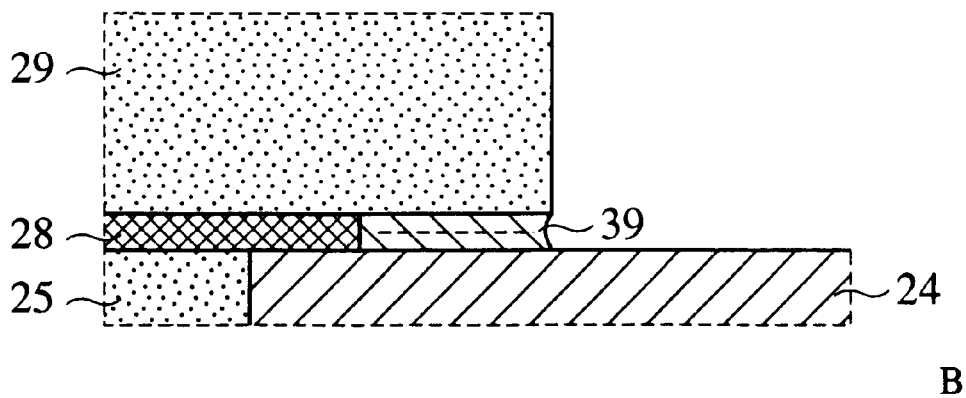

Reference is made to FIG. 12C.

Then, the insulation film 39 deposited on the surfaces of the storage node 29 and of the third inter-layer insulation film 24 is removed by isotropic etching, leaving the insulation film 39 only in the gap.

Figure 13A:
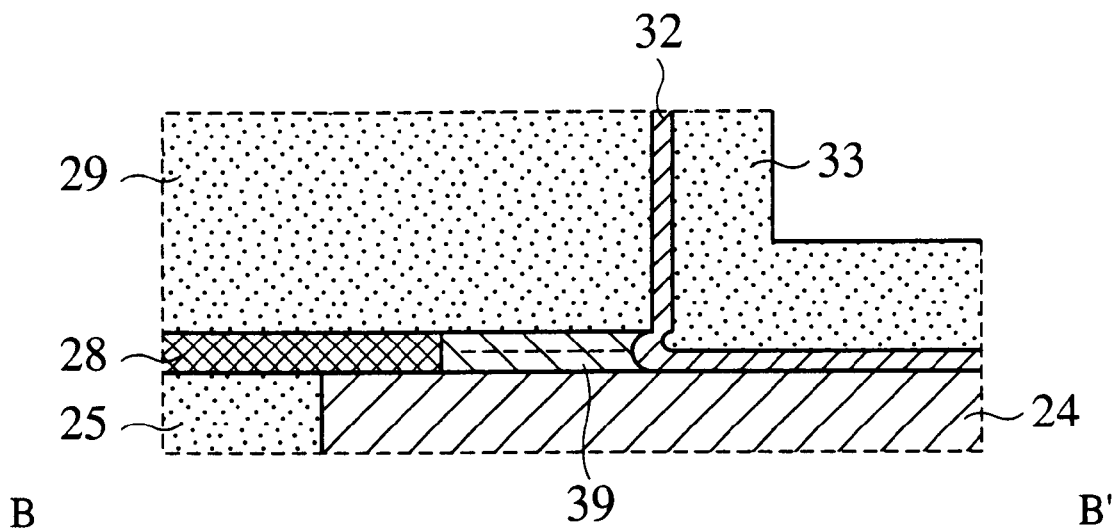
FIGS. 13A–13B are views explaining those of the fabrication steps of the semiconductor device according to the sixth embodiment of the present invention, which follow the last one of the steps shown in FIG. 12C.
Figure 13B:
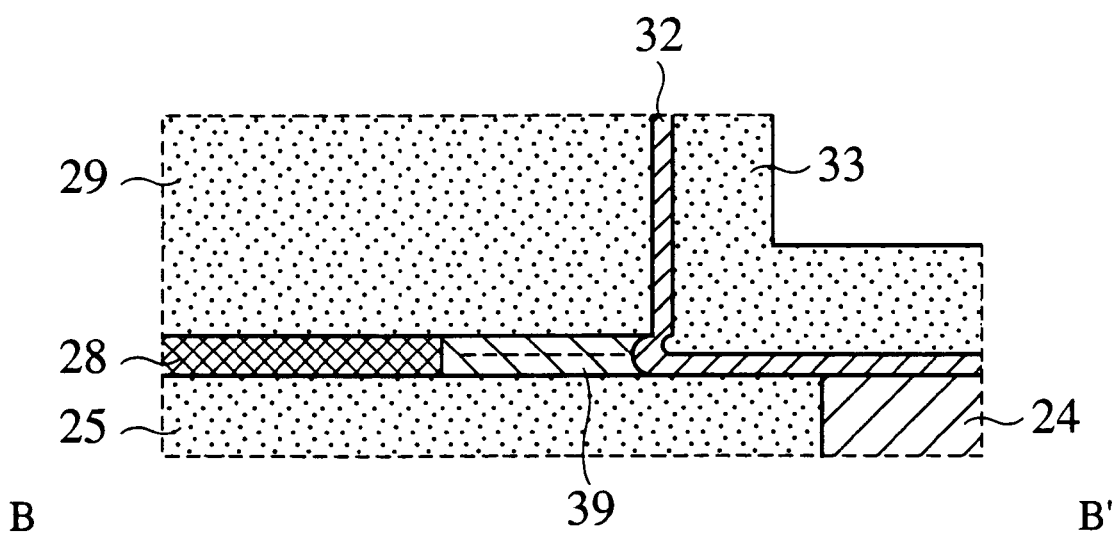

Reference is made to FIG. 13A.

After the above-described step, in the same way as in the first embodiment, a $Ta_2O_5$ film and an Ru film are deposited and etched into a prescribed shape to form the capacitor dielectric film 32 and the cell plate 33. Thus a basic structure of the DRAM is completed.

Reference is made to FIG. 13B.

The gap is substantially completely filled with the insulation film 39 at a portion where the storage node 29 is disaligned with respect to the lower plug 25.

Porosities often remain in the buried insulation film 39, but it makes no problem.

In the sixth embodiment, the capacitor dielectric film 32 and the adhesion improving layer 28 are not contiguous to each other, and accordingly the capacitor dielectric film 32 does not deteriorate. The insulation film 39 of $SiO_2$ film is buried completely between the adhesion improving layer 28 and the cell plate 33, and the insulation film 39 mitigates an applied electric field, and leak current does not flow.

In a case that, as shown in FIG. 13B, the disalignment between the storage electrode 29 and the lower plug 25 takes place, the storage node 29 is contiguous to the adhesion improving layer 28 at the same contiguous area as in the case that the disalignment does not take place, whereby the storage node 29 is maintained stable and does not peel.

In the above description, the insulation film 39 filling the gap is $SiO_2$ film, but in place of $SiO_2$ film, SiN film may be deposited by CVD method. In this case, the etching of the third inter-layer insulation film 24 in the isotropic etching may not be considered because SiN film can be selectively etched with respect to the third inter-layer insulation film 24.

A SEVENTH EMBODIMENT

Next, the fabrication steps of a seventh embodiment of the present invention will be explained with reference to FIGS. 14A–14B and 15A–15B.

Figure 14A:
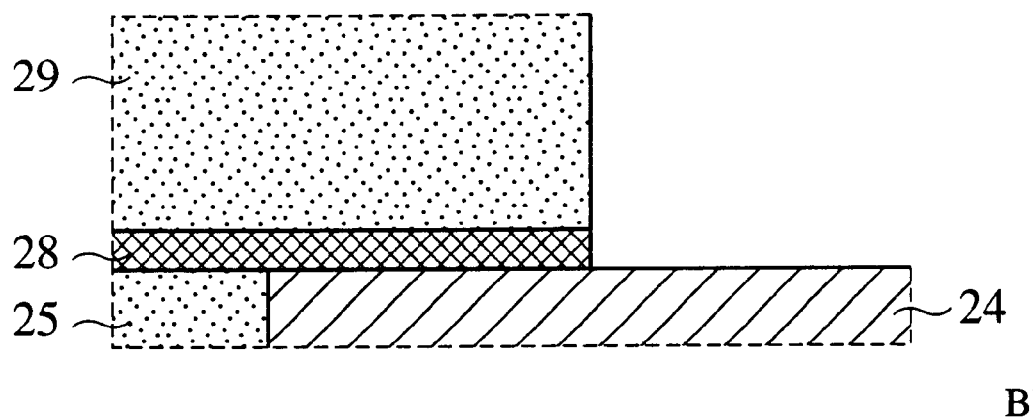
FIGS. 14A–14B are views explaining those of the fabrication steps of the semiconductor device according to a seventh embodiment of the present invention, which are on the way to the completion of the semiconductor device.
Figure 14B:
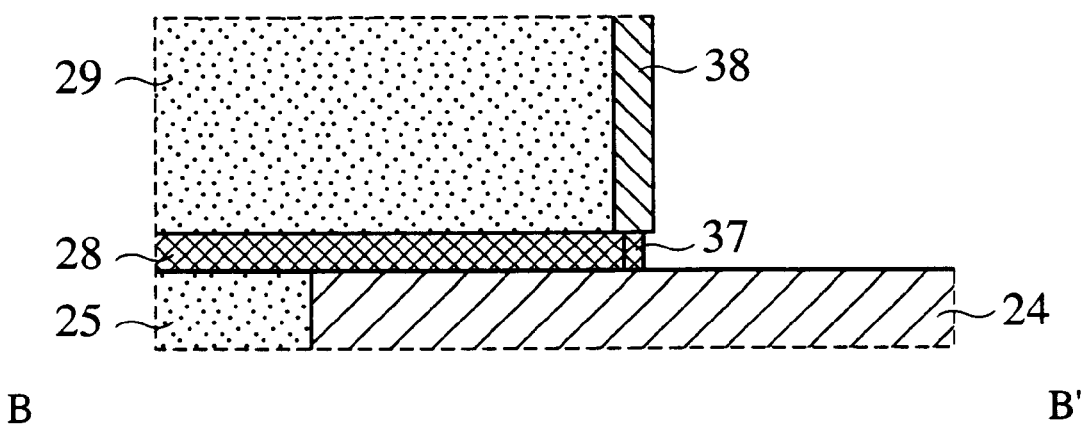
Figure 15A:
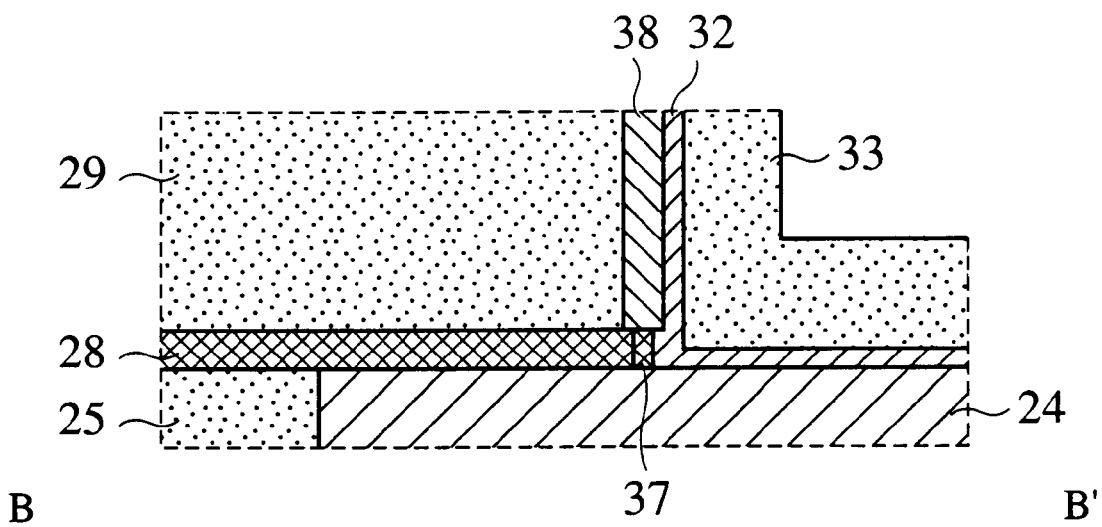
FIGS. 15A–15B are views explaining those of the fabrication steps of fabricating the semiconductor device according to the seventh embodiment of the present invention, which follow the last one of the steps shown in FIG. 14B.
Figure 15B:
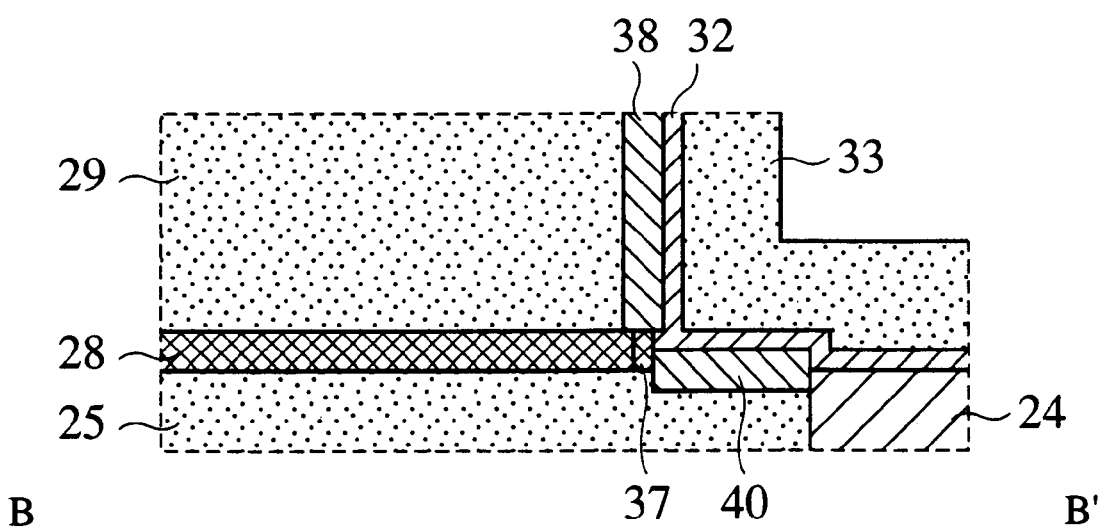

FIGS. 14A–14B and 15A are enlarged view of the major part of the contiguous portion between the lower plug 25 and the storage node 29 and corresponds to FIG. 5A. FIG. 15B corresponds to FIG. 5B.

The steps up to the step of etching the adhesion improving layer 28 including the adhesion improving layer etching step are completely the same as those of the first embodiment, and the explanation of these steps is omitted.

Reference is made to FIG. 14A.

The adhesion improving layer 28 is formed by completely the same etching as in the first embodiment.

The excessive etching is not performed. Accordingly the gap is not defined on the sidewall of the adhesion improving layer 28.

Reference is made to FIG. 14B.

Then, a heat-treatment is performed in an oxidizing atmosphere of 450–600° C. to oxidize the surface of the storage node 29 of Ru film so as to form a ruthenium oxide film 38 and also to oxidize the exposed surface of the adhesion improving layer 28 to transform the TiN film to the oxide film 37 of TiO.

Reference is made to FIG. 15A.

After the above-described step, in the same way as in the first embodiment, a $Ta_2O_5$ film and an Ru film are deposited and etched into a prescribed shape to form the capacitor dielectric film 32 and the cell plate 33. Thus, a basic structure of the DRAM is completed.

Reference is made to FIG. 15B.

In a case that the disalignment between the storage node 29 and the lower plug 25 takes place, in the step of oxidizing the storage node 29 the exposed portion of the Ru film forming the lower plug 25 is also oxidized to form a ruthenium oxide film 40.

TiO is an insulator, and the adhesion improving layer 28 and the cell plate 33 are not electrically shorted with each other. The oxide film 37 of TiO does not deteriorate the film quality of the capacitor dielectric film 32.

In the seventh embodiment, the capacitor dielectric film 32 and the adhesion improving layer 28 are not contiguous to each other. The capacitor dielectric film 32 does not deteriorate. The adhesion improving layer 28 is insulated from the cell plate 33 by the oxide film 37 of TiO, and accordingly leak current does not flow.

In the description of the seventh embodiment, the self-oxidized film of the adhesion improving layer 28 is used, but it is possible that the adhesion improving layer is nitridized to use a self-nitridized film for the insulation. In this case, the adhesion improving layer 28 must be formed of a conductive member whose self-nitridized film has insulativity, and the storage node 29 must be formed of a conductive member whose self-nitridized film has conductivity.

In a case that the disalignment between the storage node 29 and the lower plug 25 takes place as shown in FIG. 15B, the storage node 29 is contiguous to the adhesion improving layer 28 at the same contiguous area as in the case that the disalignment does not take place, and accordingly maintained stable. The storage node 29 does not peel.

AN EIGHTH EMBODIMENT

In the first to the seventh embodiments, the lower plug 25 and the adhesion improving layer 28 are flatly contiguous to each other at the top surface of the lower plug 25. The adhesion of the lower plug 25 is not always sufficient. Furthermore, insufficient adhesion of the storage node 29 can be considered. Then, with reference to FIGS. 16A–16B, 17A–17B and 18A–18B, an eighth embodiment of the present invention in which an adhesion improving layer 43 is provided, covering at least the sides of a lower plug 42 for improved adhesion of the lower plug 42 will be explained.

The fabrication steps up to the step of forming a via hole for a contact plug 21 including the contact plug via hole forming step are completely the same as those of the first embodiment, and their explanation is omitted. A basic structure below a gate oxide film 13 is not shown.

Figure 16A:
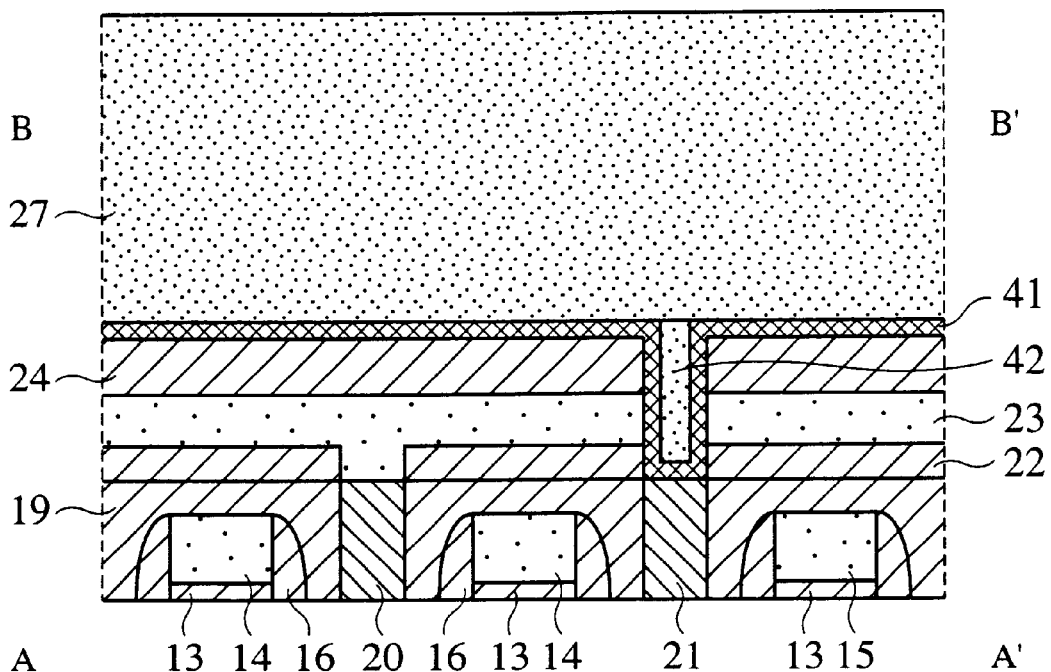
FIGS. 16A–16B are views explaining those of the fabrication steps of fabricating the semiconductor device according to an eighth embodiment of the present invention, which are on way to the completion of the semiconductor device.

Reference is made to FIG. 16A.

Following the step of forming a via hole for the contact plug 21 in completely the same way as in the first embodiment, a TiN film 41 is deposited on the entire surface by CVD method, covering the inside surface of the via hole. Then, an Ru film is deposited also by CVD method and polished by CMP method to bury the Ru film in the via hole to form the lower plug 42. Next, again an Ru film of, e.g., a 1.0 μm-thick is deposited by CVD method.

Figure 16B:
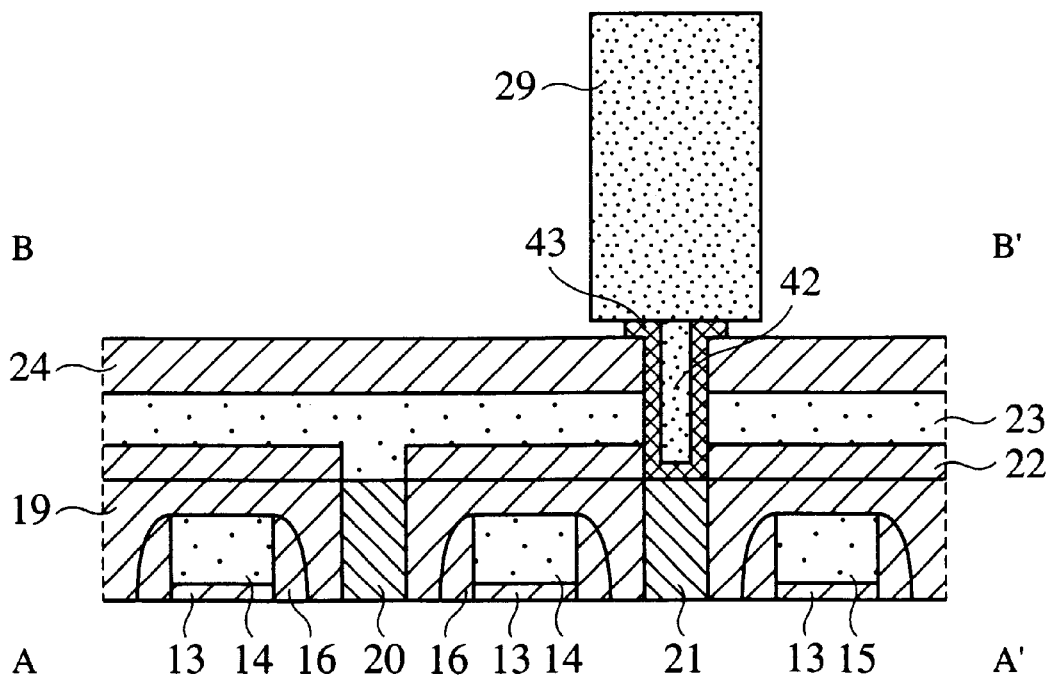

Reference is made to FIG. 16B.

Next, in the same way as in the first embodiment, anisotropic etching is performed using a prescribed etching mask as a mask and a $O_2+Cl_2$ mixed gas to etch the Ru film 27 into a prescribed shape which is, for example, 0.25 μm-width along bit lines 23 and 0.5 μm-width along word lines 15. Thus the storage node 29 in a projected shape is formed.

Next, the exposed portion of the TiN film 41 is isotropically etched using heated hydrochloric acid, sulfuric acid, hydrogen peroxide aqueous solution+hydrochloric acid, or hydrogen peroxide aqueous solution+sulfuric acid, and the TiN film 41 is excessively etched to form an adhesion improving layer 43 defining a slit-shaped gap on the sidewall.

The etching is not essentially wet etching, and may be dry etching as long as the etching is isotropic.

Figure 17A:
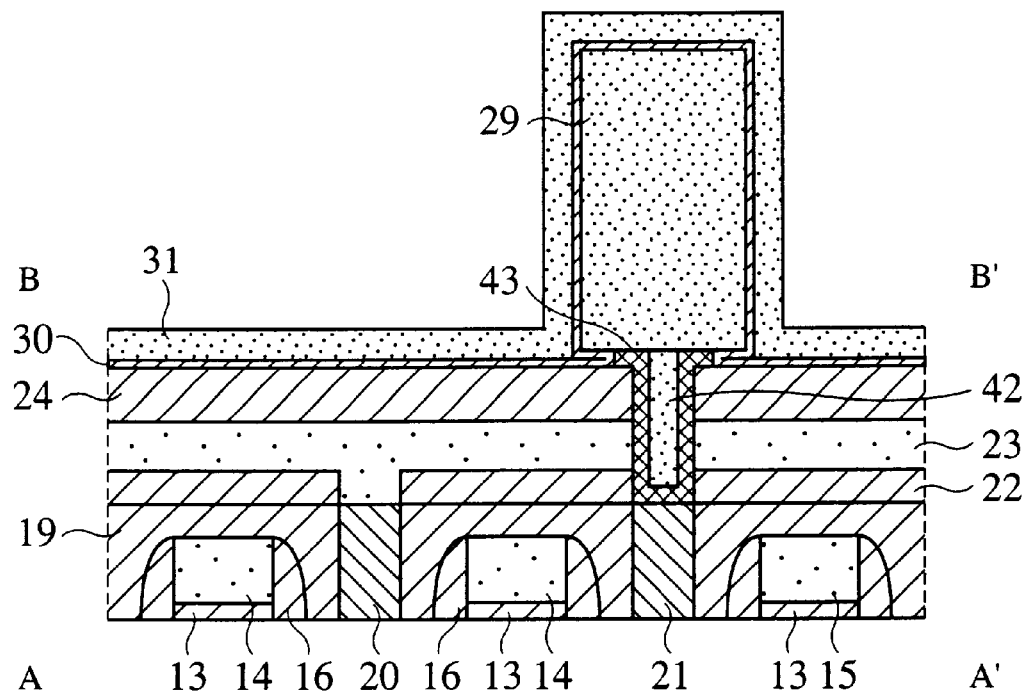
FIGS. 17A–17B are views explaining those of the fabrication steps of fabricating the semiconductor device according to the eighth embodiment of the present invention, which follows the last one of the fabrication steps shown in FIG. 16B.

Reference is made to FIG. 17A.

Then, in the same way as in the first embodiment, a $Ta_2O_5$ film 30 of a thickness $d_\epsilon$ of, e.g., 10 nm, and an Ru film 31 of, e.g., a 150 nm-thick are sequentially deposited by CVD method.

Figure 17B:
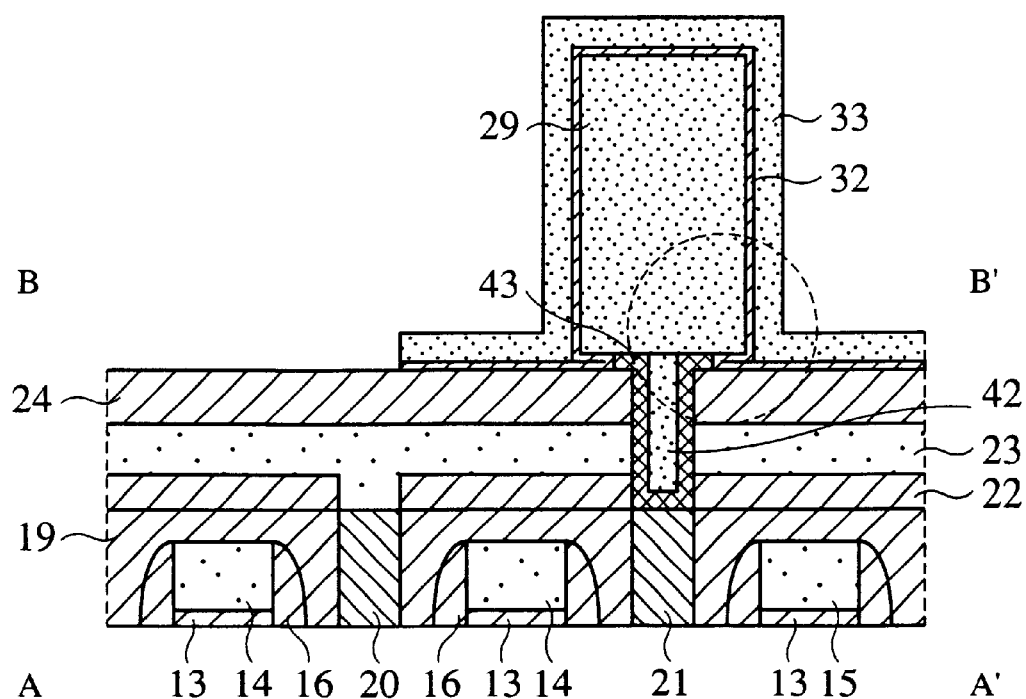

Reference is made to FIG. 17B.

Next, in the same way as in the first embodiment, the Ru film 31 and the $Ta_2O_5$ film 30 are sequentially etched into a prescribed shape to form a cell plate 33 and a capacitor dielectric film 32.

Figure 18A:
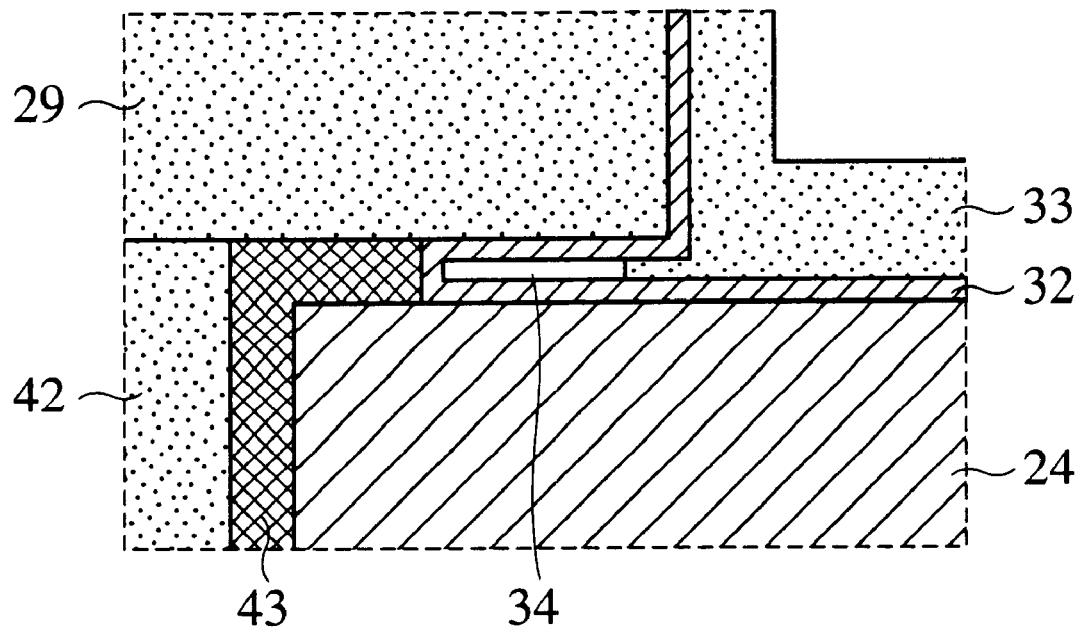
FIGS. 18A–18B are enlarged views of a major part of the semiconductor device according to the eighth embodiment of the present invention.

Reference is made to FIG. 18A.

FIG. 18A is an enlarged view of the major part circled by the dotted line in FIG. 17B and corresponds to FIG. 5A showing the first embodiment. A height of the gap, i.e., a thickness "d" of the adhesion improving layer 43 satisfies the relationship $$2 \times d_\epsilon < d \leq d_v$$

with respect to a thickness $d_\epsilon$ of the capacitor dielectric film 32 and a width $d_v$ which permits the CVD-Ru film forming the cell plate 33 to intrude capably of the step coverage. As a result, as in FIG. 5A, the capacitor dielectric film 32 of $T_2O_5$ intrudes deep into the gap to become contiguous to the sidewall of the adhesion improving layer 43, and the cell plate 33 also intrudes into the gaps. Thus, the gap is partially surrounded by the capacitor dielectric film 32 and the cell plate 33 to form a cavity 34.

The capacitor dielectric film 32 has the film quality deteriorated at the contiguous portion between the adhesion improving layer 43 and the capacitor dielectric film 32. However, a voltage is applied to the contiguous portion through the cavity 34. Accordingly, the adhesion improving layer 43 and the cell plate 33 are isolated from each other, effectively insulated from each other by the cavity 34, and no leak current flows. Accordingly, a charge stored in the capacitor can be sufficiently retained.

Figure 18B:
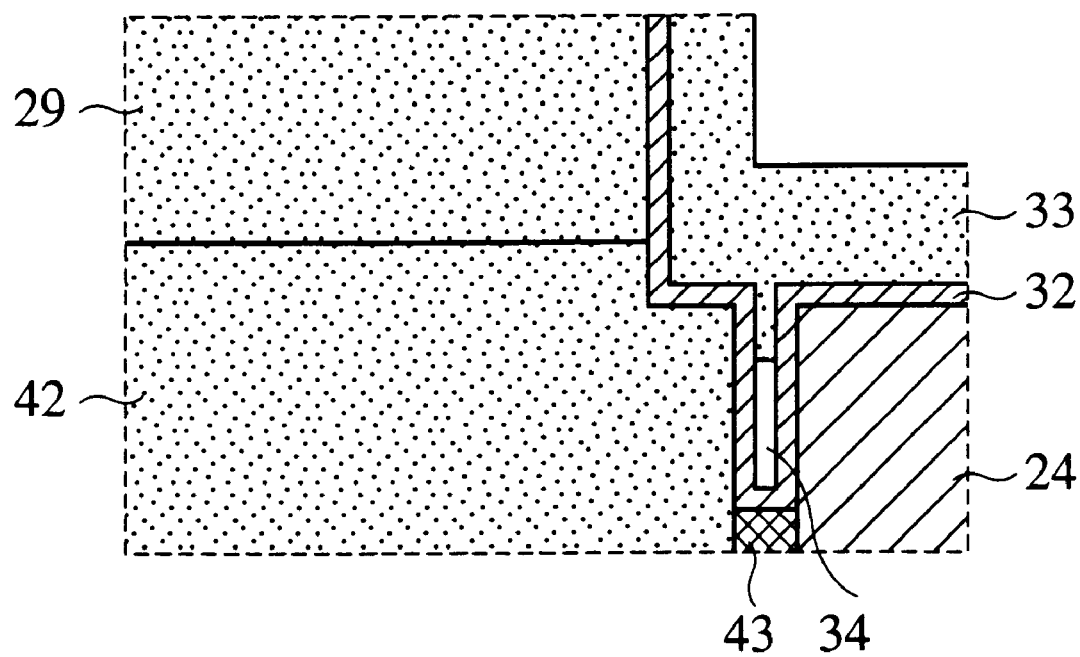

Reference is made to FIG. 18B.

FIG. 18B corresponds to FIG. 5B and is an enlarged view of a major part showing the disalignment between the storage node 29 and the lower plug 42. The adhesion improving layer 43 is excessively etched on the side where the disalignment has taken place, and a gap is defined along the sidewall of the lower plug 42.

The capacitor dielectric film 32 intrudes deep into the gap to be contiguous to the exposed upper surface of the adhesion improving layer 43. The cell plate 33 intrudes into the gap and partially fills the gap. Thus, a cavity surrounded by the capacitor dielectric film 32 and the cell plate 33 is defined.

As described above, in the eighth embodiment of the present invention, the sidewall and the bottom surface of the lower plug 42 are covered with the adhesion improving layer 43, whereby the lower plug has improved adhesion and does not peel, which leads to improved adhesion of the storage node 29, and the storage node 29 does not peel either.

In the case that the disalignment between the storage node 29 and the lower plug 42 takes place, the storage node 29 and the adhesion improving layer 43 are contiguous at a larger contiguous area, and the cavity 34 is formed by the over-etching only along the sidewall of the lower plug 42 and is not formed right below the storage node. Accordingly, the storage node 29 does not fall to peel. Another merit is that a large margin can be allowed for the over-etching, and accordingly the etching step does not require precise control.

In the eighth embodiment as well, a relationship among the adhesion improving layer 43, the capacitor dielectric film 32 and the cell plate 33 is substantially equal to that of the first embodiment, and leak current does not flow.

A NINTH EMBODIMENT

Figure 19A:
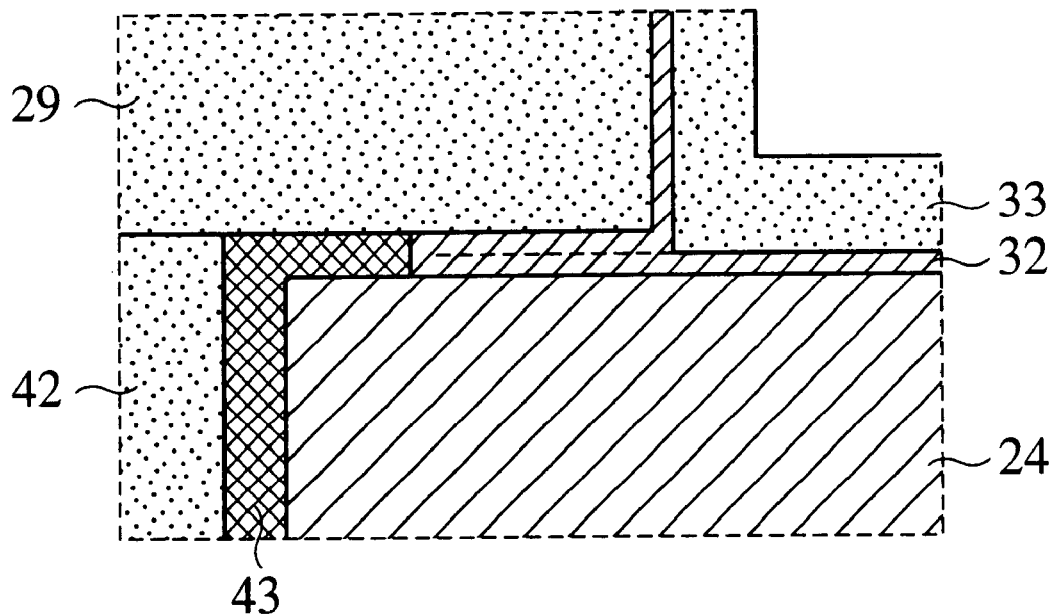
FIGS. 19A–19B are enlarged views of a major part of the semiconductor device according to a ninth embodiment of the present invention.
Figure 19B:
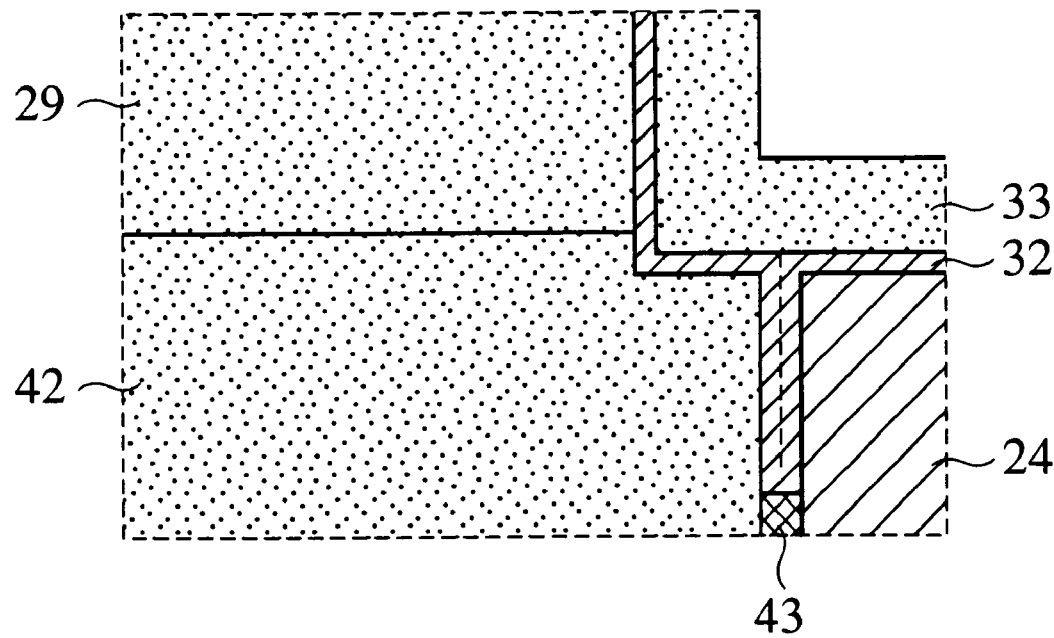

Next, a ninth embodiment of the present invention will be explained with reference to FIGS. 19A–19B. Reference is made to FIGS. 19A and 19B. FIGS. 19A and 19B correspond to FIGS. 7A and 7B. The sequence of the fabrication steps and material forming the respective members are completely the same as those of the eighth embodiment, and their explanation is omitted.

In the ninth embodiment, a thickness "d" of the adhesion improving layer 43 of TiN film is below 20 nm, e.g., 10 nm, a height or a depth of the gap, i.e., an excessive etched amount of the adhesion improving layer 43 is 10–20 nm. A $Ta_2O_5$ film forming the capacitor dielectric film 32 is deposited in a 10 nm-thick to completely fill the gap with the $Ta_2O_5$ film forming the capacitor dielectric film 32.

That is, in the ninth embodiment, the relationship $$d \leq 2 \times d_e$$

is satisfied.

In the ninth embodiment as well, the capacitor dielectric film 32 is contiguous to the exposed end of the adhesion improving layer 43, but the adhesion improving layer 43 and the cell plate 33 are isolated by the capacitor dielectric film 32 of a thickness of (a depth of the gap+a thickness $d_e$) $\approx 2 \times d_e \sim 3 \times d_e$. An applied electric field is mitigated, and leak current does not flow.

A TENTH EMBODIMENT

Then, a tenth embodiment of the present invention will be explained with reference to FIGS. 20A–20B.

Figure 20A:
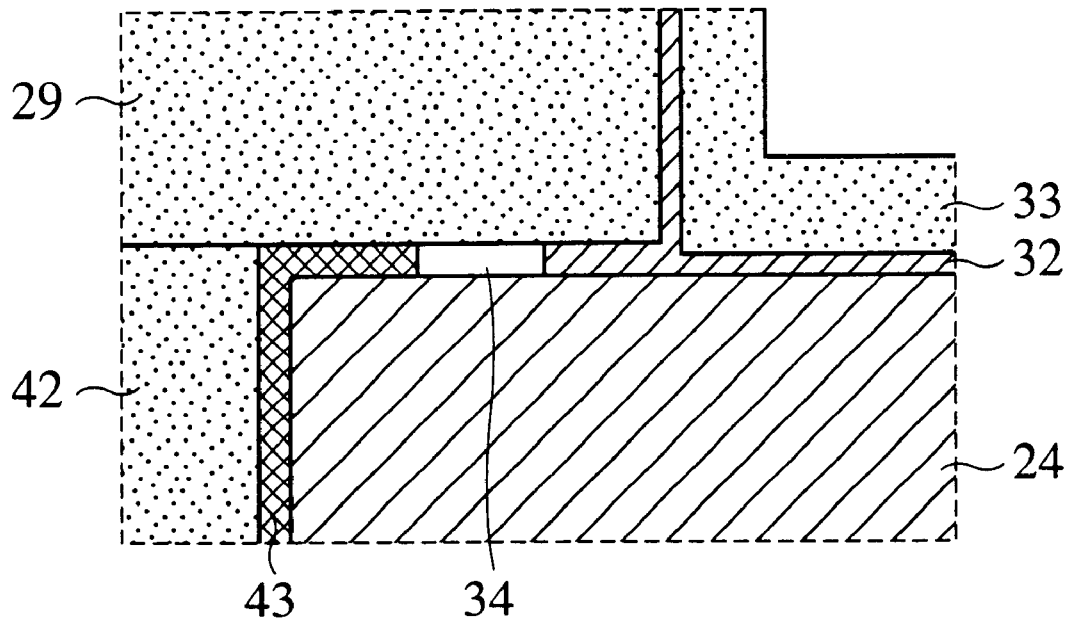
FIGS. 20A–20B are enlarged views of a major part of the semiconductor device according to a tenth embodiment of the present invention.
Figure 20B:
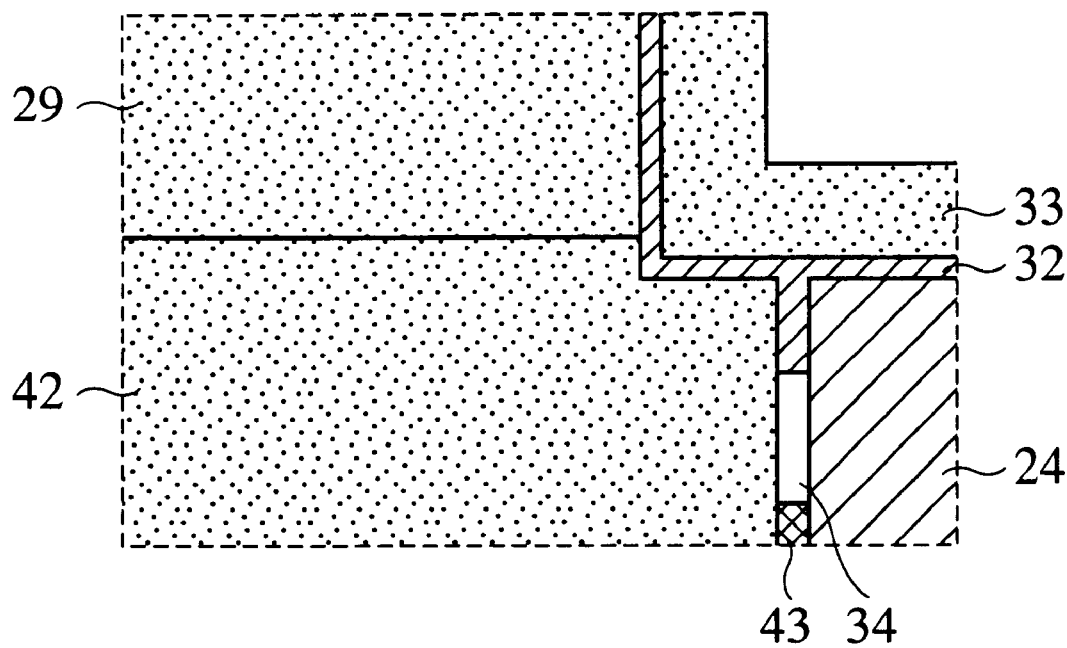

Reference is made to FIGS. 20A and 20B.

FIGS. 20A and 20B correspond to FIGS. 8A and 8B. The sequence of the fabrication steps and the material forming the respective members are completely the same as those of the eighth embodiment, and their explanation will be omitted.

In the tenth embodiment, a thickness "d" of the adhesion improving layer 43 of TiN film is as small as 1–10 nm. Even when $Ta_2O_5$ film forming the capacitor dielectric film 32 is deposited in a 10 nm-thick, even CVD-$Ta_2O_5$ film, which is superior in step coverage, cannot intrude deep into the gap, and the cavity 34 is formed between the adhesion improving layer 43 and the capacitor dielectric film 32.

In the tenth embodiment as well, the capacitor dielectric film 32 is not contiguous to the exposed end of the adhesion improving layer 43, whereby the capacitor dielectric film 32 does not deteriorate. The adhesion improving layer 43 and the cell plate 33 are isolated by the cavity 34 and the relatively thick capacitor dielectric film 32, whereby an applied electric field is mitigated, and leak current does not flow.

AN ELEVENTH EMBODIMENT

Then, with reference to FIG. 21, an eleventh embodiment of the present invention will be explained.

Figure 21A:
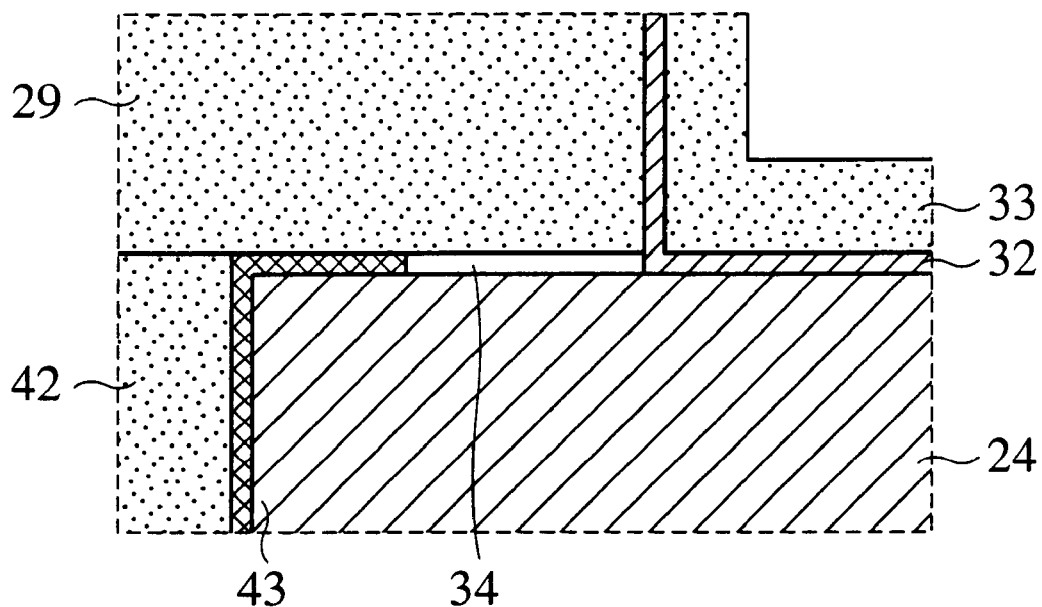
FIGS. 21A–21B are enlarged views of a major part of the semiconductor device according to an eleventh embodiment of the present invention.
Figure 21B:
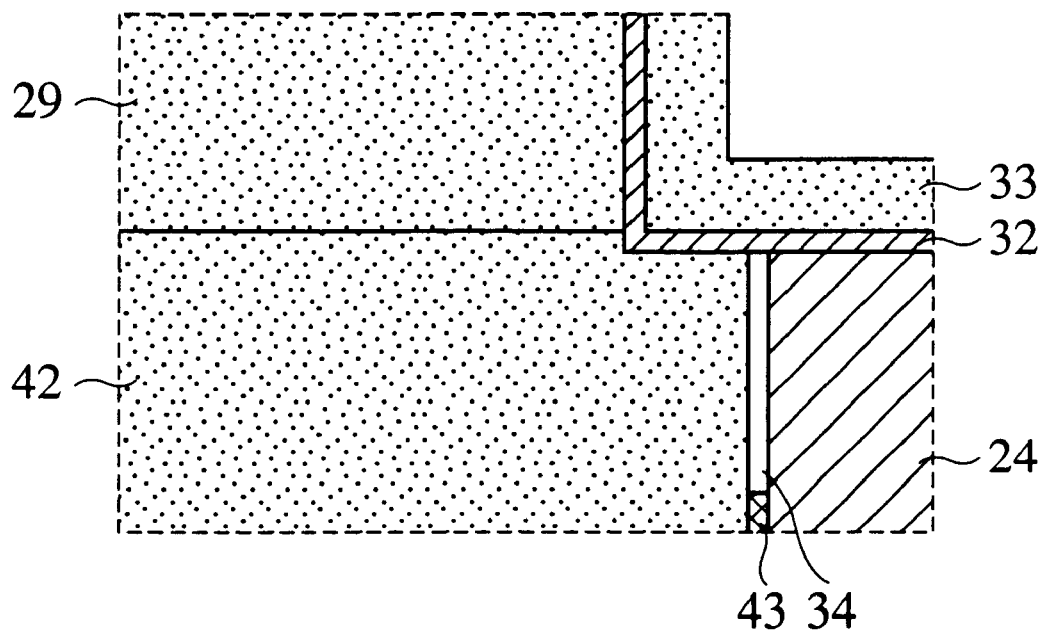

Reference is made to FIGS. 21A and 21B.

FIGS. 21A and 21B correspond to FIGS. 9A and 9B. The sequence of the fabrication steps and the material of their respective members are completely the same as those of the eighth embodiment, and their explanation will be omitted.

In the eleventh embodiment, a thickness "d" of the adhesion improving layer 43 is further as thin as below 5 nm. In a case that $Ta_2O_5$ film forming the capacitor dielectric film 32 is deposited in a 10 nm-thick, even CVD-$Ta_2O_5$ film cannot substantially intrude into the gap, and the entire gap becomes the cavity 34.

In the eleventh embodiment as well, the capacitor dielectric film 32 is not contiguous to the exposed end of the adhesion improving layer, whereby the capacitor dielectric film does not deteriorate. The adhesion improving layer 43 and the cell plate 33 are isolated from each other by the elongate cavity 34, whereby an applied electric field is mitigated, and leak current does not flow.

In the eleventh embodiment as well, when the capacitor dielectric film 32 is formed by sputtering method or CVD method using a high pressure or a high temperature for forming the film, the step coverage can be much degraded, whereby even in a case that a height of the gap, i.e., a thickness "d" of the adhesion improving layer 28 is as thick as above 5 nm, the capacitor dielectric film 32 can have the same film state as in FIGS. 21A and 21B.

A TWELFTH EMBODIMENT

Then, a twelfth embodiment of the present invention will be explained with reference to FIGS. 22A–22B.

Figure 22A:
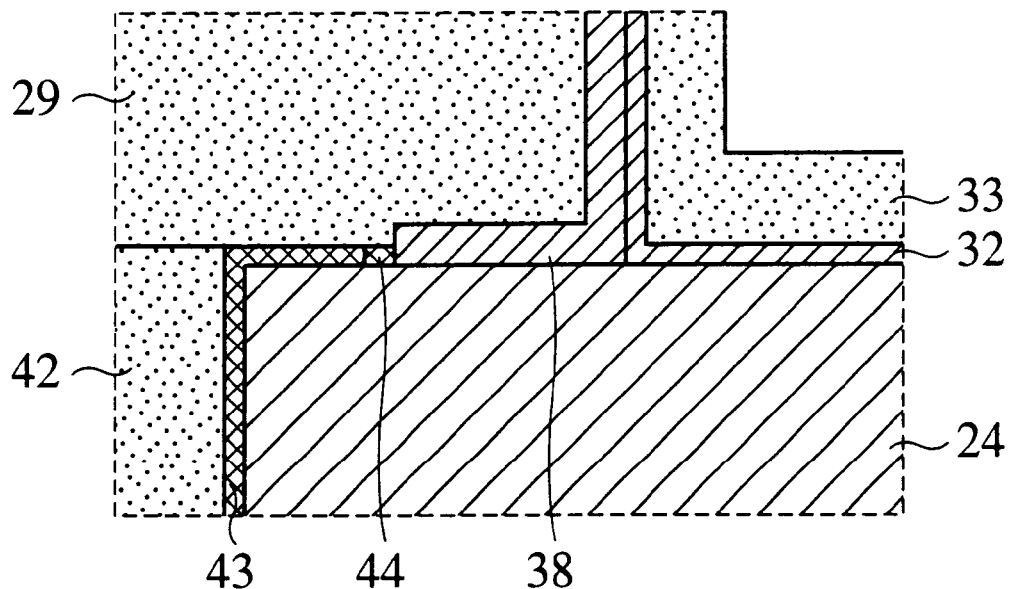
FIGS. 22A–22B are enlarged views of a major part of the semiconductor device according to a twelfth embodiment of the present invention.
Figure 22B:
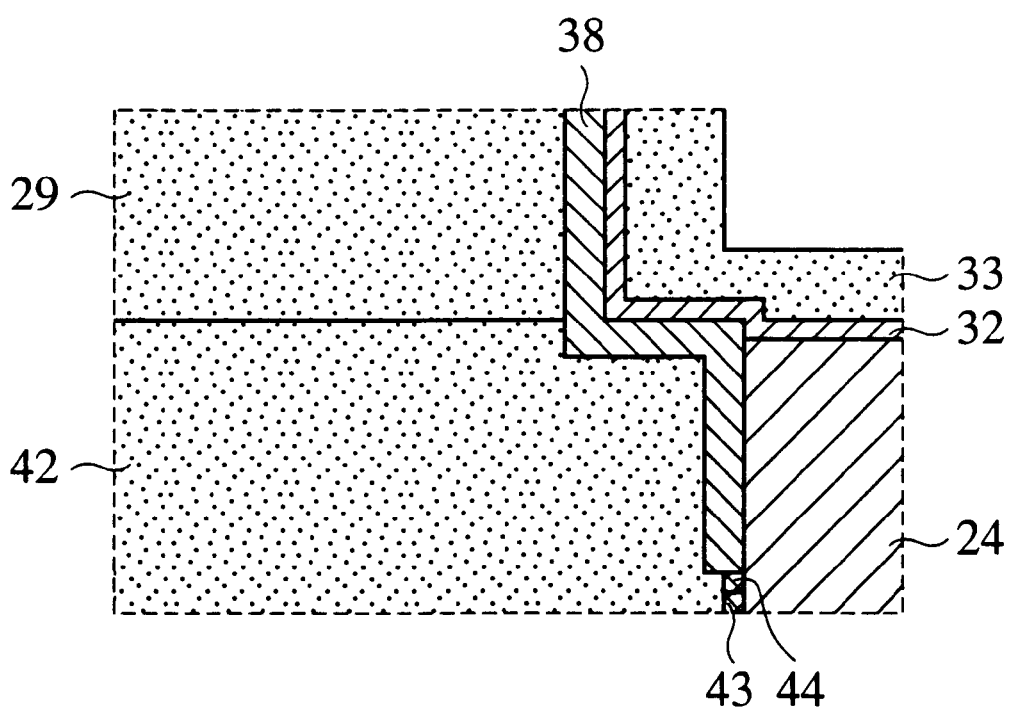

FIGS. 22A and 22B correspond to FIGS. 11A and 11B. The fabrication steps up to the step of forming the storage node 29 including the storage node forming step are completely the same as those of the eighth embodiment, and the fabrication steps following the storage node forming step are the same as those of the fifth embodiment. Their explanation will be omitted.

Reference is made to FIG. 22A.

The twelfth embodiment provides a structure which is effectively equivalent to that shown in FIG. 11A. A ruthenium oxide film 38 formed by oxidizing the storage node 29 completely fills the gap.

Reference is made to FIG. 22B.

On the other hand, in a case that the disalignment between the storage node 29 and the lower plug 42 takes place, the exposed surface of the Ru film forming the lower plug 42 is also oxidized to form ruthenium oxide film 38. The ruthenium oxide film formed by oxidizing the lower plug 42 completely fills the gap.

In the oxidation step, the oxide film of TiO is also formed on the exposed sidewall or the exposed upper surface of the adhesion improving layer 43.

In the twelfth embodiment, the capacitor dielectric film 32 and the exposed portion of the adhesion improving layer 43 are isolated from each other, whereby the capacitor dielectric film 32 does not deteriorate.

In the above description of the twelfth embodiment, the self-oxidized film is used, but the storage node or the lower plug may be nitridized to fill the gap with the self nitridized film. In this case, because the self-nitridized film must be conductive, it is necessary to form the storage node 29 and the lower plug 42 are formed of conductive materials whose nitridized films have conductivity.

A THIRTEENTH EMBODIMENT

Then, a thirteenth embodiment of the present invention will be explained with reference to FIGS. 23A–23B.

Figure 23A:
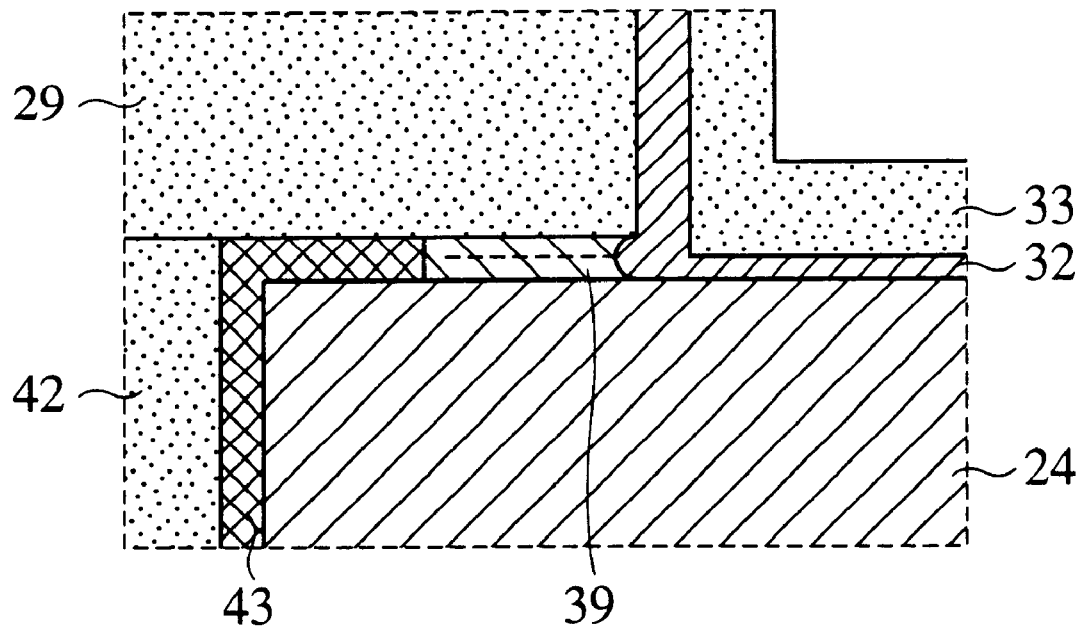
FIGS. 23A–23B are enlarged views of a major part of the semiconductor device according to a thirteenth embodiment of the present invention.
Figure 23B:
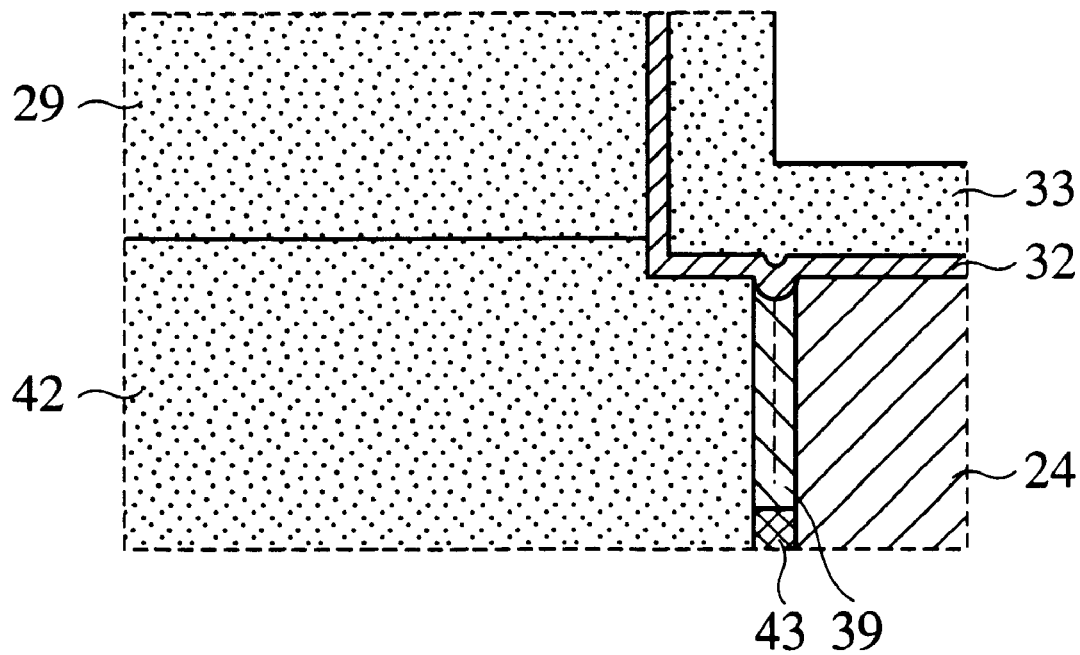

FIGS. 23A and 23B correspond to FIGS. 13A and 13B. The fabrication steps up to the step of forming the storage node 29 including the storage node forming step are completely the same as those of the eighth embodiment, and the fabrication step following the storage node forming step are the same as those of the sixth embodiment. Their explanation will be omitted.

Reference is made to FIG. 23A.

The thirteenth embodiment also provides a structure which is effectively equivalent to that shown in FIG. 13A.

The gap on the sidewall of the adhesion improving layer 43 is completely buried with the insulation film 39 of SiO₂ film.

A thickness of the adhesion improving layer 43 is 10–50 nm, e.g., 20 nm.

Reference is made to FIG. 23B.

In a case that the disalignment between the storage node 29 and the lower plug 42 takes place, the gap defined on the sidewall of the storage node 29 is completely filled with the insulation film 39 of SiO₂ film.

In the thirteenth embodiment as well as in the sixth embodiment, the capacitor dielectric film 32 is not contiguous to the exposed end of the adhesion improving layer 43, whereby the capacitor dielectric film 32 does not deteriorate. The adhesion improving layer 43 and the cell plate 33 are isolated, insulated from each other by the insulation film 39, whereby an applied electric field is mitigated, and leak current does not flow.

In the above description of the thirteenth embodiment, the insulation film 39 filling the gap is SiO₂ film, but in place of SiO₂ film, SiN film may be deposited by CVD method. In this case, SiN film has etching selectivity with respect to the third inter-layer insulation film 24, and the etching of the third inter-layer insulation film 24 may not be considered in the isotropic etching step.

A FOURTEENTH EMBODIMENT

Then, a fourteenth embodiment of the present invention will be explained with reference to FIGS. 24A–24B.

Figure 24A:
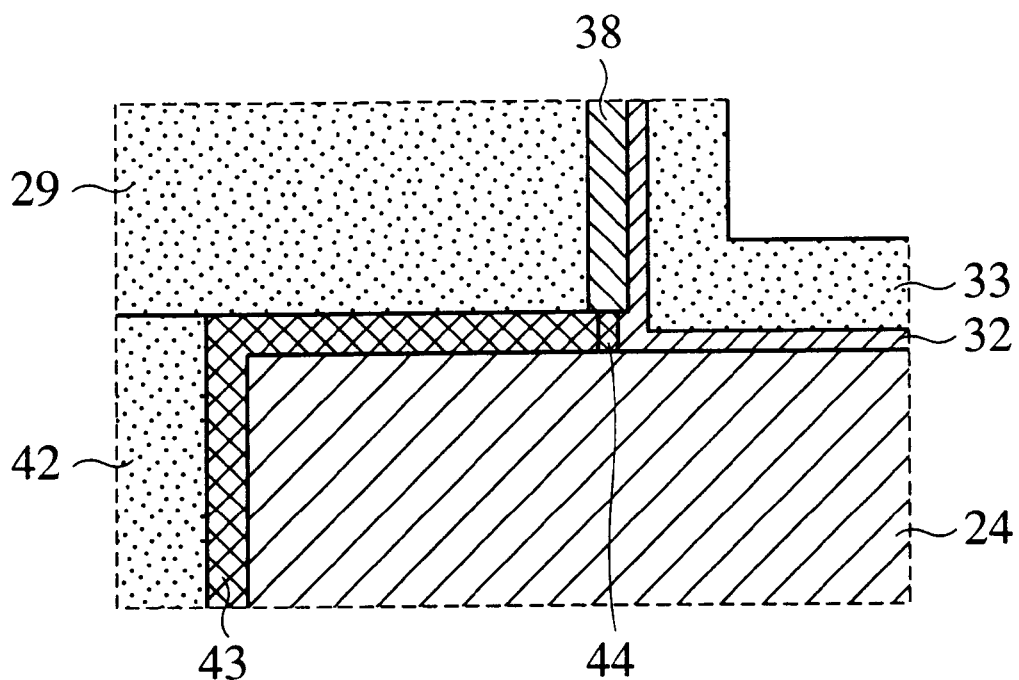
FIGS. 24A–24B are enlarged views of a major part of the semiconductor device according to a fourteenth embodiment of the present invention.
Figure 24B:
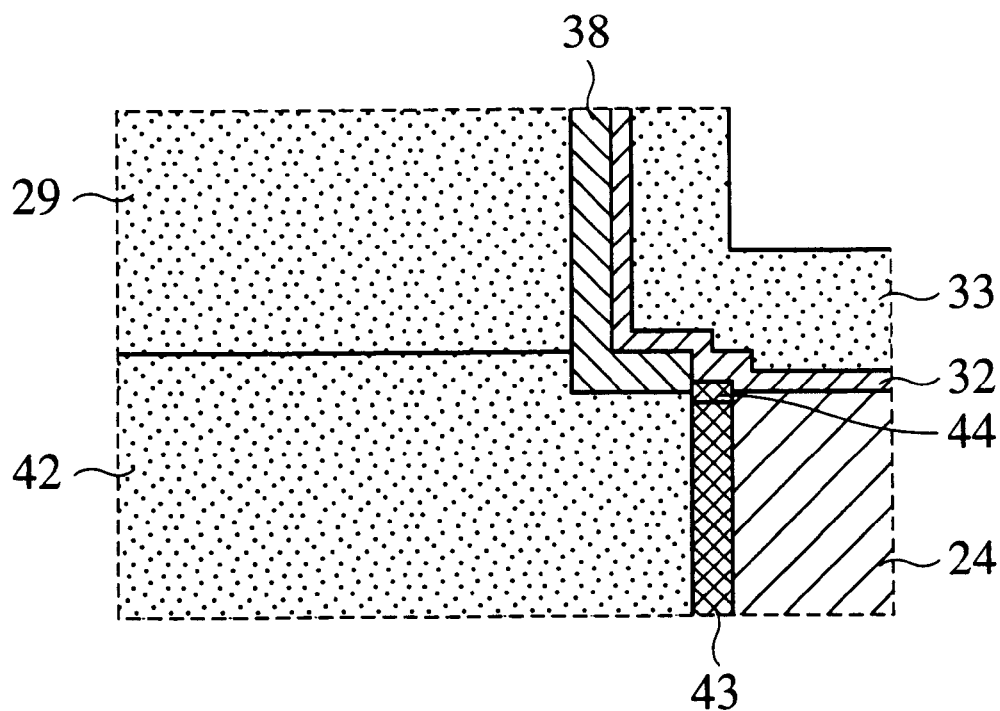

FIGS. 24A and 24B correspond to FIGS. 15A and 15B. The fabrication steps up to the step of forming the storage node 29 including the storage node forming step are completely the same as those of the eighth embodiment, and the fabrication steps following the storage node forming step are the same os those of the seventh embodiment. Their explanation will be omitted.

Reference is made to FIG. 24A.

The fourteenth embodiment provides a structure which is effectively equivalent to that shown in FIG. 15A. On the sidewall of the adhesion improving layer 43, the adhesion improving layer 43 is oxidized to form the oxide film 44 of TiO, and the oxide film 44 isolates the adhesion improving layer 43 and the capacitor dielectric film 32 from each other.

Reference is made to FIG. 24B.

In a case that the disalignment between the storage node 29 and the lower plug 42 takes place, the exposed upper surface of the adhesion improving layer 43 is oxidized to form the oxide film 44 of TiO. The oxide film 44 isolates the adhesion improving layer 43 and the capacitor dielectric film 32 from each other.

Because of the TiO, which is insulative, the adhesion improving layer 43 and cell plate 33 does not electrically short with each other. The oxide film 44 of TiO does not deteriorate film quality of the capacitor dielectric film 32.

In the fourteenth embodiment as well as the seventh embodiment, the capacitor dielectric film 32 and the sidewall of the adhesion improving layer are not contiguous to each other, whereby the capacitor dielectric film 32 does not deteriorate. The adhesion improving layer 43 and the cell plate 33 are isolated, insulated from each other by the oxide film 44 of TiO, and leak current does not flow.

In the description of the fourteenth embodiment, the self-oxidized film of the adhesion improving layer 43 is used, but it is possible that the adhesion improving layer 43 is nitridized to use the self-nitridized film for the insulative isolation. In this case, the self-nitridized film of the adhesion improving layer 43 must be conductive, and the self-nitridized film of the storage node 29 must be conductive. Accordingly, it is necessary that the adhesion improving layer 43 is formed of a conductive material whose self-nitridized film is insulative, and the storage node 29 is formed of a conductive material whose self-nitridized film is conductive.

A FIFTEENTH EMBODIMENT

Next, with reference to FIGS. 25A–25B, a fifteenth embodiment of the present invention which is a modification of the eighth embodiment will be explained.

The fabrication steps up to the step of forming the via hole for the contact plug 21, i.e., the step of depositing the TiN film 41 so as to buried in the lower plug hole 45, including the via hole forming step are completely the same as those of the eighth embodiment of the present invention. Their explanation will be omitted.

Figure 25A:
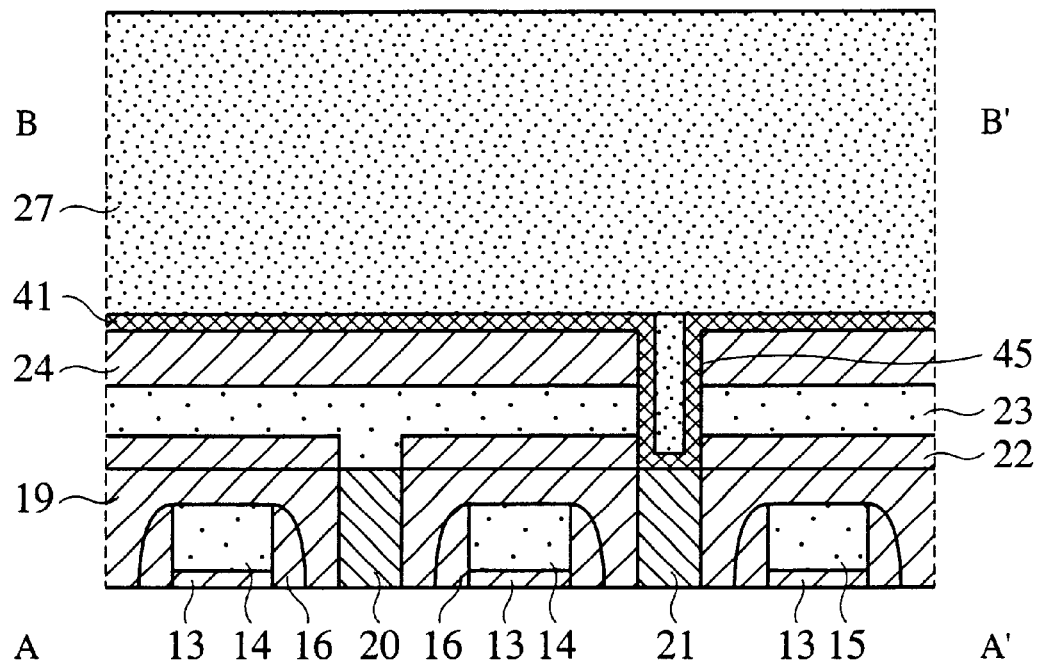
FIGS. 25A–25B are views explaining the fabrication steps for fabricating the semiconductor device according to a fifteenth embodiment of the present invention.

Reference is made to FIG. 25A.

In completely the same way as in the eighth embodiment, a TiN film 41 is deposited on the entire surface, and then an Ru film is deposited by CVD method to have a thickness of, e.g., 1.0 μm. on the flat portion.

In this step, the interior of the lower plug hole 45 is completely filled with the Ru film 27, and the lower plug 46 is in one-piece with the storage node 29.

Figure 25B:
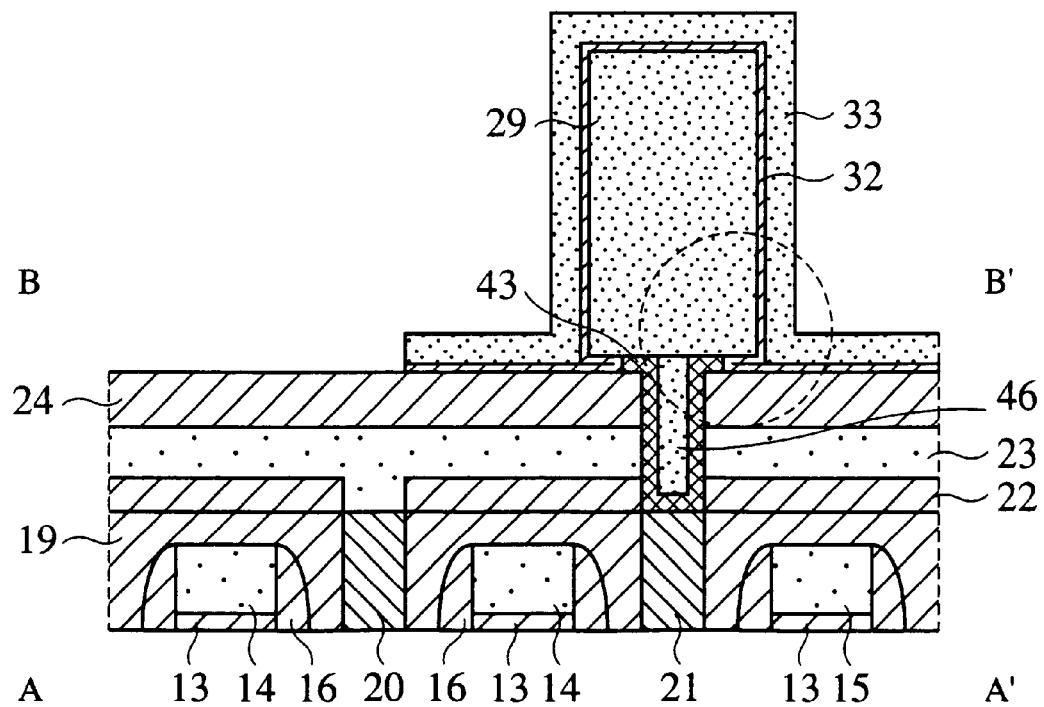

Reference is made to FIG. 25B.

Following this step, in completely the same way as in the eighth embodiment, a Ta₂O₅ film of a thickness $d_e$ of 10 nm, and an Ru film of, e.g., a 150 nm-thick are sequentially deposited and etched into a prescribed shape to form the cell plate 33 and the capacitor dielectric film 32.

The structure circled by the dotted line in FIG. 25B is substantially the same as in FIG. 18A or FIG. 18B.

In the fifteenth embodiment, the lower plug 46 and the storage node 29 are formed in one-piece, whereby the number of film forming steps can be decreased. The CMP step for burying the lower plug 46 into the lower plug hole 45 is not necessary, which simplifies the fabrication steps.

The other characteristics of the fifteenth embodiment are the same as those of the eighth embodiment.

The fabrication steps after the step of etching the storage node 29 of the fifteenth embodiment may be changed to the fabrication steps corresponding to those of the ninth to the fourteenth embodiments. In this case, the same functional effects as those provided by the ninth to the fourteenth embodiments can be provided.

A SIXTEENTH EMBODIMENT

Then, with reference to FIGS. 26A–26B, 27A–27B, 28A–28B, 29A–29B, 30A–30B, and 31A–31B, a sixteenth embodiment of the present invention will be explained.

The views on FIGS. 27A, 28A, 29A, 30A and 31A are explanatory views of forming solid rectangular pole-shaped storage node 53. The views on FIGS. 27B, 28B, 29B, 30B and 31B are explanatory views of forming hollow rectangular pole-shaped storage node 54, i.e., cylindrical storage node.

The fabrication steps up to the step of forming a bit line 23 including the bit line forming step are completely the same as those of the first embodiment, and their explanation will be omitted. The substrate structure below the gate oxide film 13 is also omitted. In FIGS. 27A–27B, 28A–28B, 29A–29B, 30A–30B, and 31A–31B, a transistor on the left side which co-uses the n+-type drain region is omitted.

Figure 26A:
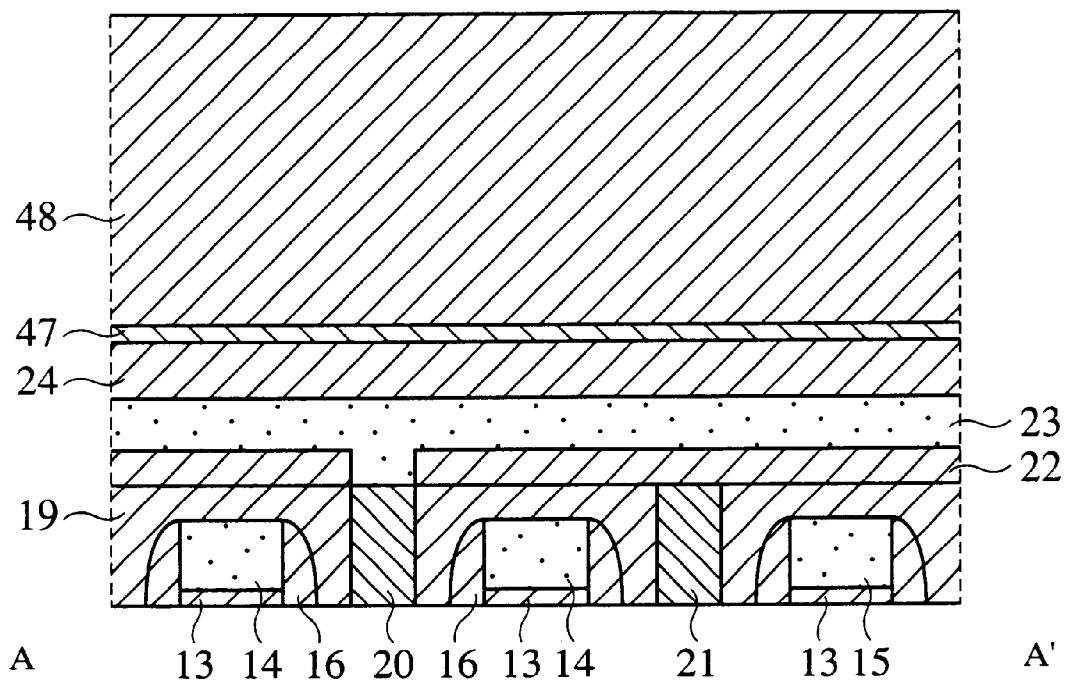
FIGS. 26A–26B are views explaining those of the fabrication steps of fabricating the semiconductor device according to a sixteenth embodiment of the present invention, which are on the way to the completion of the semiconductor device.

Reference is made to FIG. 26A.

In the same way as in the first embodiment, the bit line 23 is formed, then the third inter-layer insulation film 24 of SiO$_2$ film is deposited, next, an SiN film to be an etching stopper 47 is deposited on the entire surface, and a thick insulation film 48 of an SiO$_2$ film of, e.g., a 1.0 µm-thick is deposited.

An SiN film (not shown) may be formed on the entire surface, directly covering the bit line 23. Actually in the vicinity of the contact plug 21, the SiN film is formed contiguously directly on the second inter-layer insulation film 22, and can be an etching stopper in the next step of forming an opening.

An SiN film to be a stopper in the CMP step may be formed on the insulation film 48.

Figure 26B:
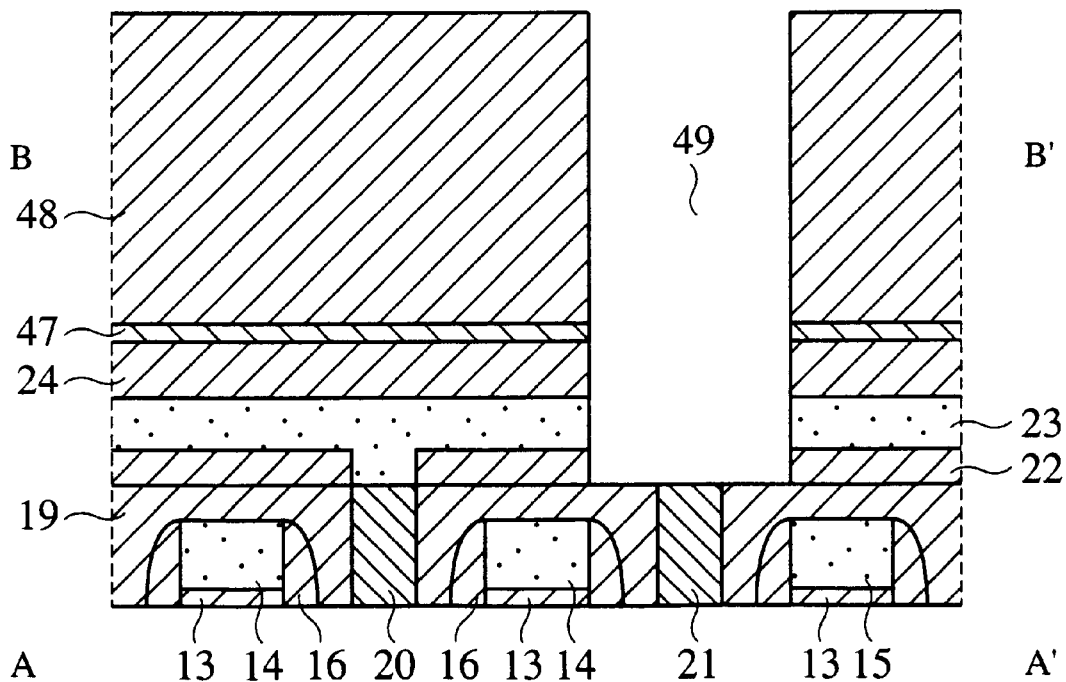

Reference is made to FIG. 26B.

Next, anisotropic etching is performed by reactive ion etching to form an opening 49 arriving at a contact plug 21.

In this step, first an opening arriving at an etching stopper 47 is formed, and the etching stopper 47 is selectively removed. Then, the third inter-layer insulation film 24 and the second inter-layer insulation film 22 are removed to expose the contact plug 21.

A planar shape of the opening 49 is the rectangle having a 0.25 µm-width along the bit line and a 0.5 µm-width along the word lines 15. The opening 49 is formed, offset from the bit line 23 as in the first embodiment.

Figure 27A:
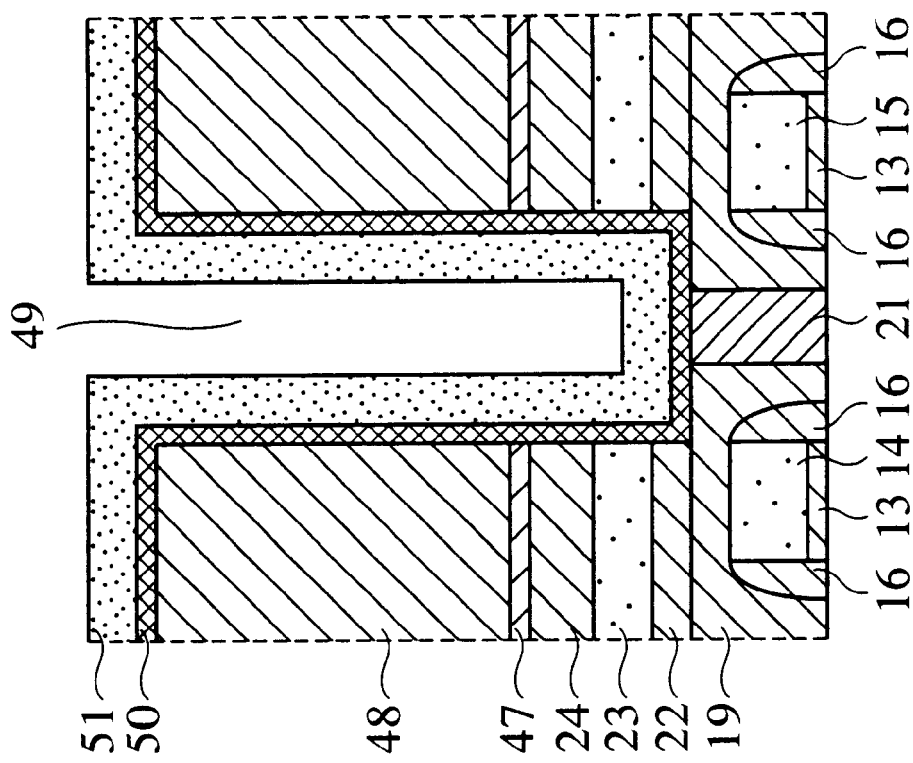
FIGS. 27A–27B are views explaining those of the fabrication steps of fabricating the semiconductor device according to the sixteenth embodiment of the present invention, which follow the last one of the fabrication steps shown in FIG. 26B and are on the way to the completion of the semiconductor device.
Figure 27B:
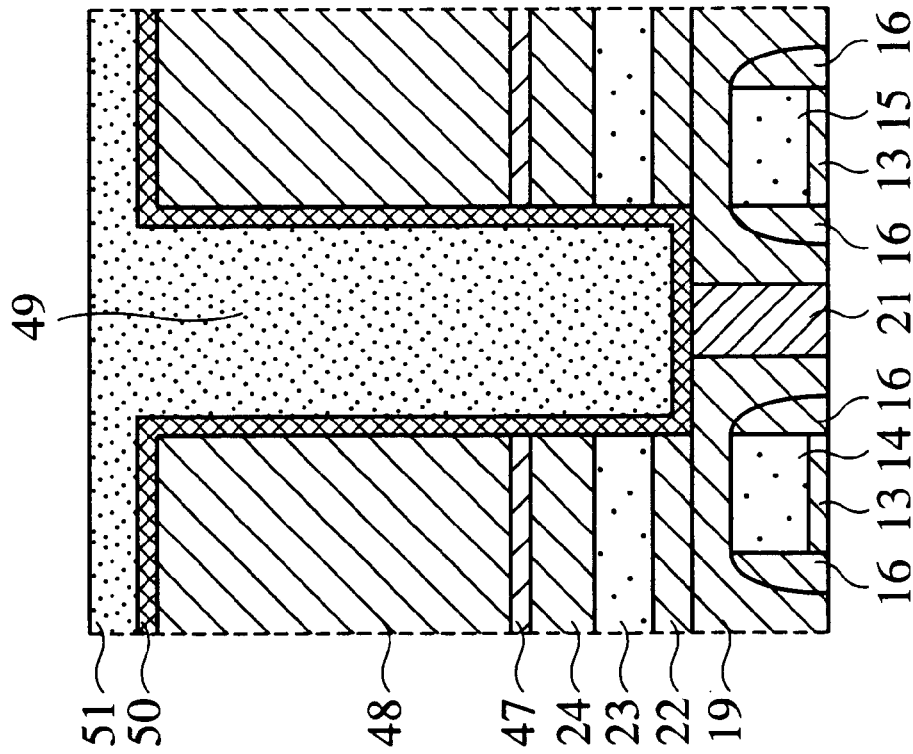

Reference is made to FIGS. 27A and 27B.

Then, a TiN film 50 is deposited on the entire surface by CVD method to cover the side surfaces and the bottom surface of the opening 49, and an Ru film 51 is deposited again by CVD method. In forming the rectangular pole storage node, as shown in FIG. 27A, the opening 49 is completely filled with the Ru film 51. In forming the cylindrical storage node, as shown in FIG. 27B, the opening 49 is not completely filled with the Ru film 51, leaving a concavity which contours the shape of the opening 49.

Figure 28A:
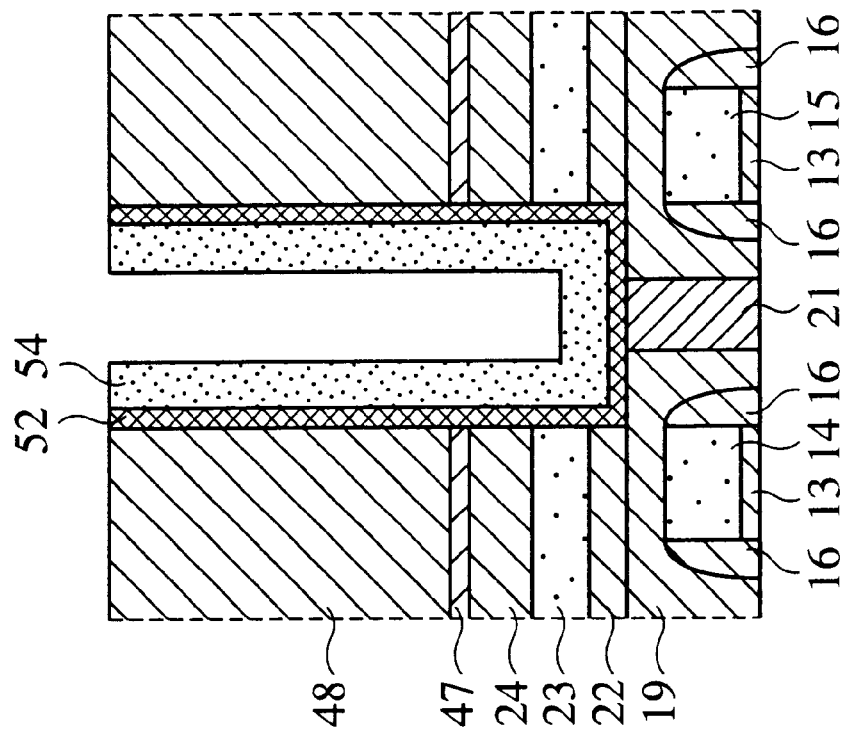
FIGS. 28A–28B are views explaining those of the fabrication steps of fabricating the semiconductor device according to the sixteenth embodiment of the present invention, which follow the last one of the fabrication steps shown in FIGS. 27A and 27B and are on the way to the completion of the semiconductor device.
Figure 28B:
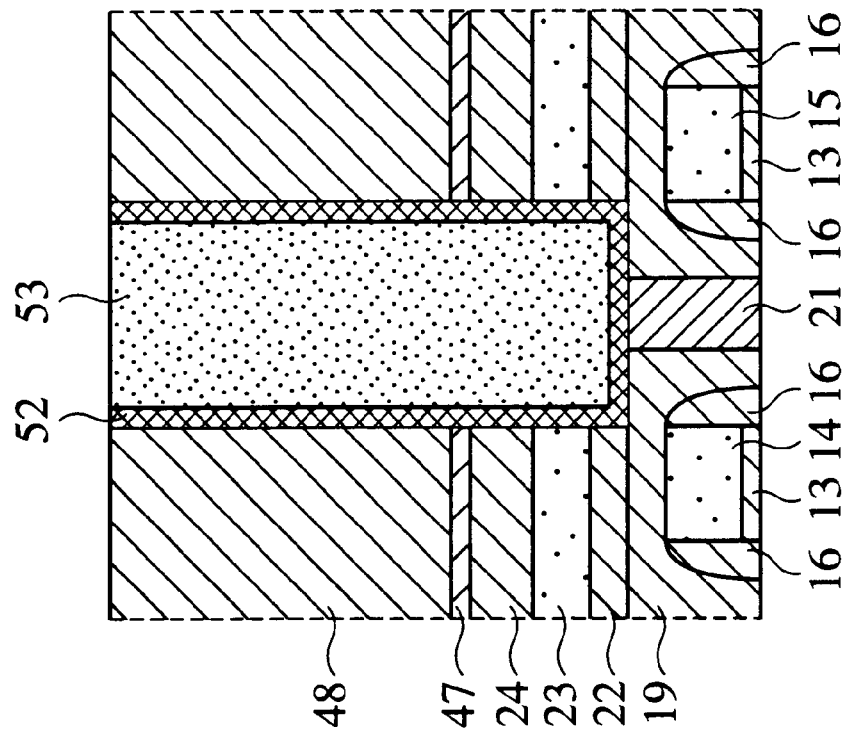

Reference is made to FIGS. 28A and 28B.

Then, the Ru film 51 and the TiN film 50 on the flat upper surface of the insulation film 48 are polished by CMP to form the adhesion improving layer 52 and the storage nodes 53, 54 buried in the opening 49.

The storage nodes 53, 54 are effectively the lower plugs.

Figure 29A:
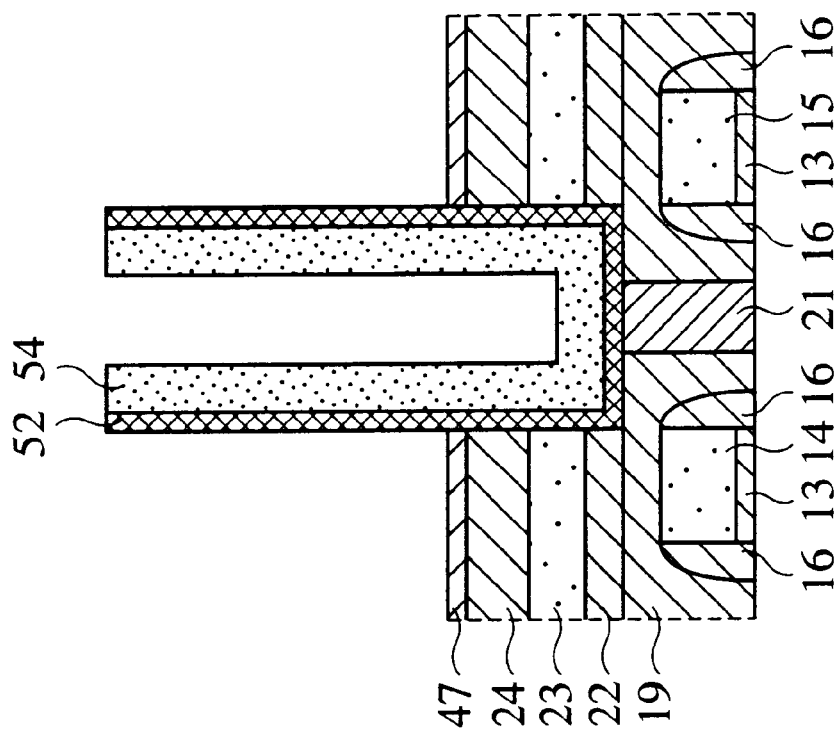
FIGS. 29A–29B are views explaining those of the fabrication steps of fabricating the semiconductor device according to the sixteenth embodiment of the present invention, which follow the last one of the fabrication steps shown in FIGS. 28A and 28B and are on the way to the completion of the semiconductor device.
Figure 29B:
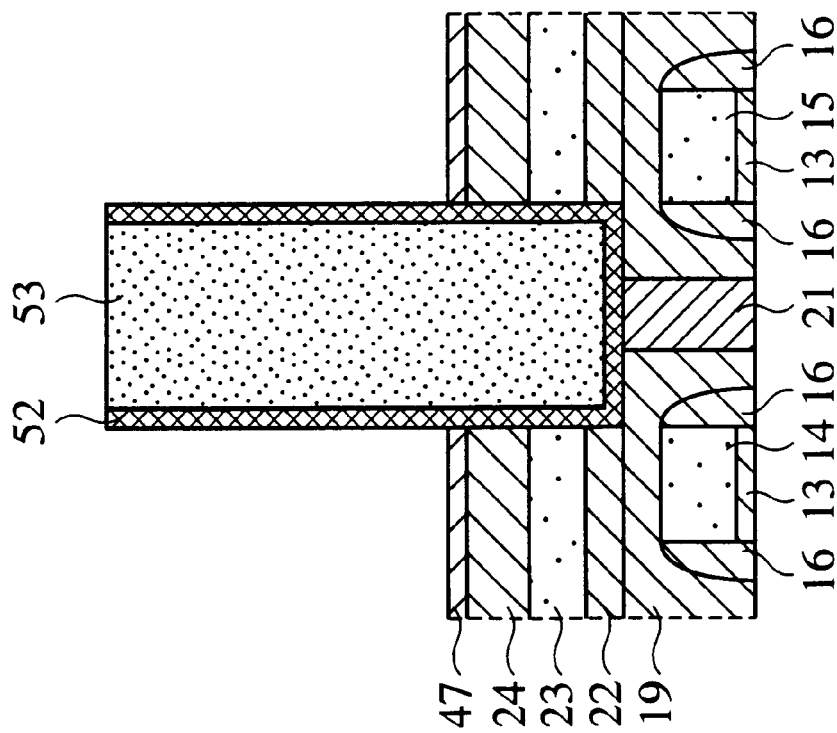

Reference is made to FIGS. 29A and 29B.

Then, the insulation film 48 is selectively removed by diluted HF with the etching stopper 47 as a stopper.

Figure 30A:
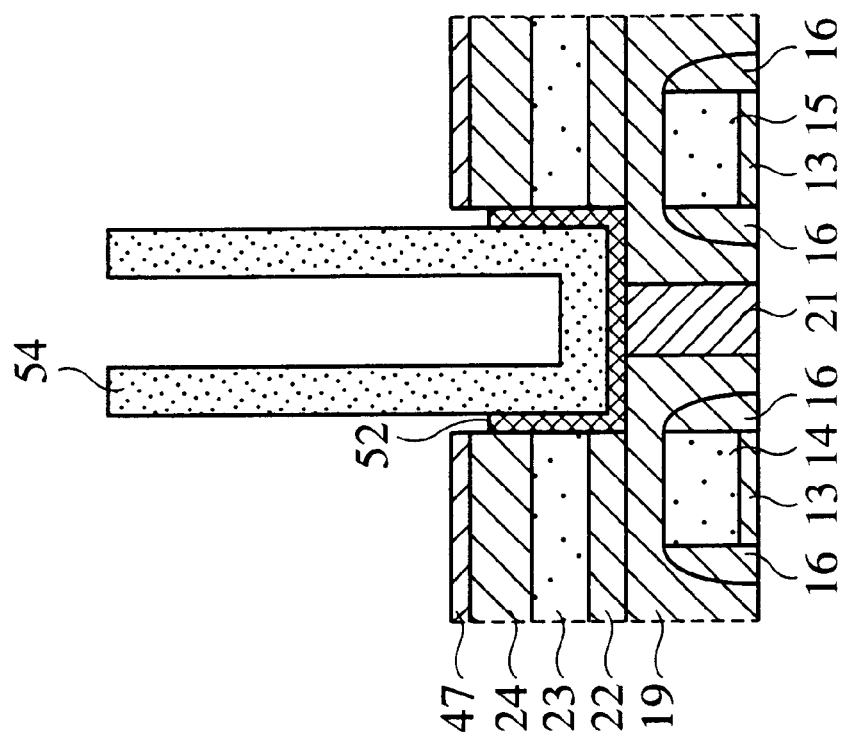
FIGS. 30A and 30B are views explaining those of the fabrication steps of fabricating the semiconductor device according to the sixteenth embodiment of the present invention, which follow the last one of the fabrication steps shown in FIGS. 29A and 29B and are on the way to the completion of the semiconductor device.
Figure 30B:
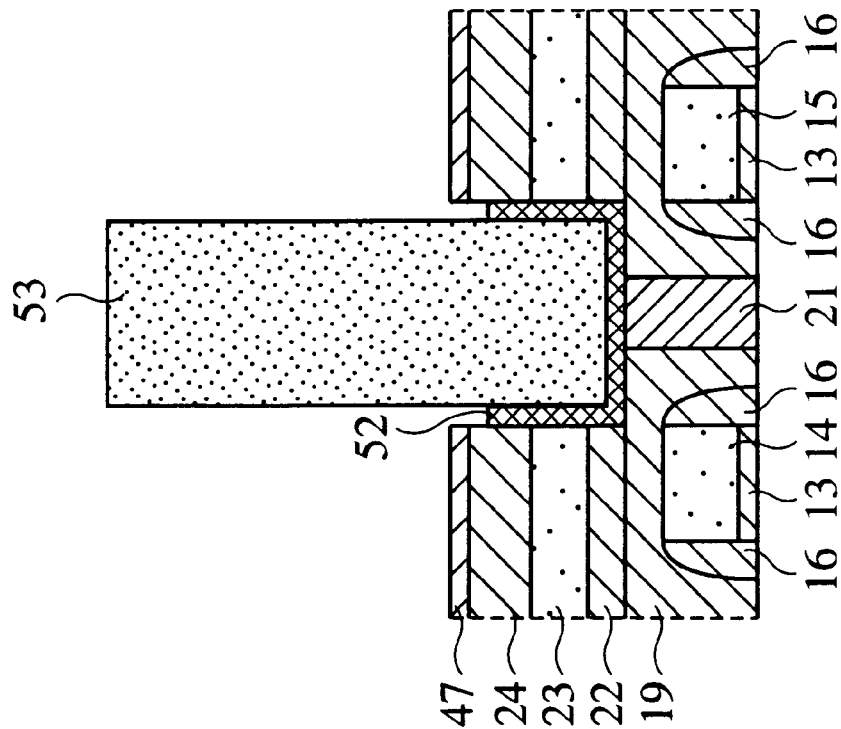

Reference is made to FIGS. 30A and 30B.

Then, the exposed portion of the adhesion improving layer 52 is etched by wet etching using heated hydrochloric acid, sulfuric acid, hydrogen peroxide aqueous solution+ hydrochloric acid, hydrogen peroxide aqueous solution+ sulfuric acid or diluted HF, and furthermore the adhesion improving layer 52 is excessively etched to define a gap along the sidewalls of the storage nodes 53, 54.

Figure 31A:
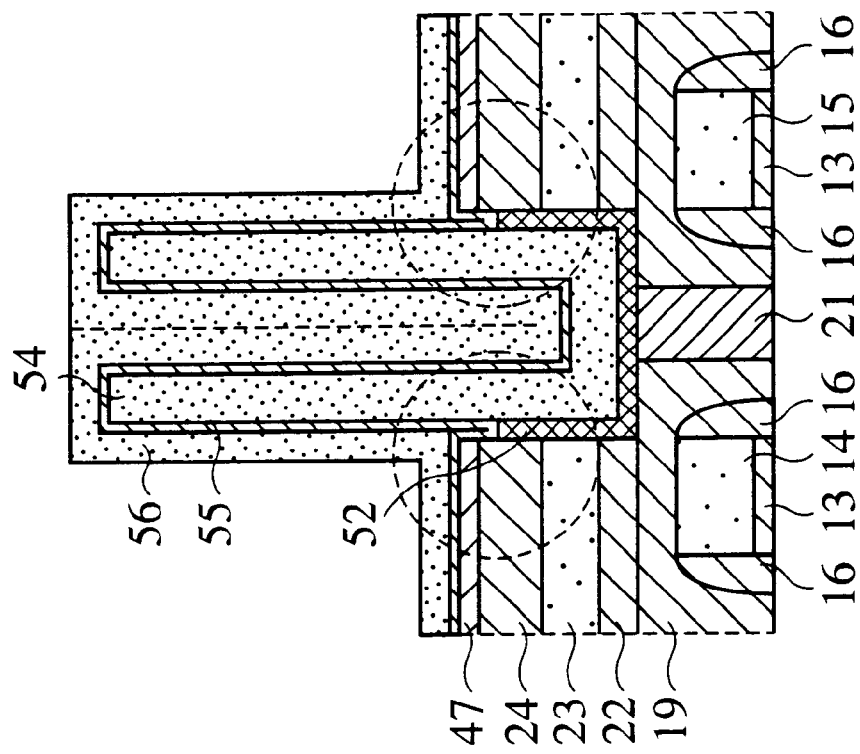
FIGS. 31A and 31B are views explaining those of the fabrication steps of fabricating the semiconductor device according to the sixteenth embodiment of the present invention, which follow the last one of the fabrication steps shown in FIGS. 30A and 30B.
Figure 31B:
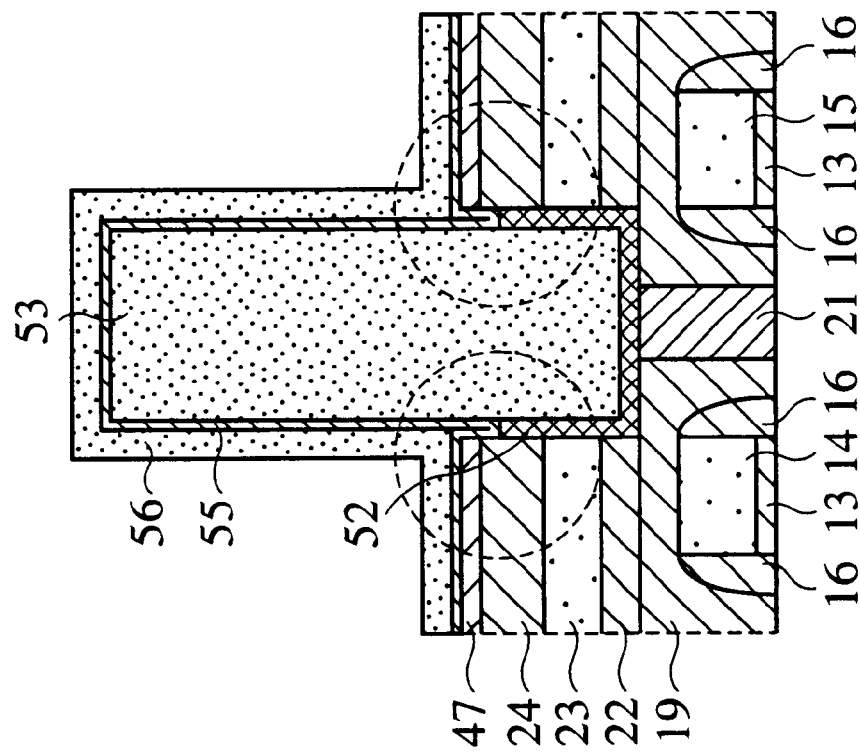

Reference is made to FIGS. 31A and 31B.

In completely the same way as in the first embodiment, a Ta$_2$O$_5$ film of a thickness d$_c$ of, e.g., 10 nm and an Ru film of, e.g., a 150 nm-thick are sequentially deposited by CVD method, and the Ru film and Ta$_2$O$_5$ film are etched into a prescribed shape to form the cell plate 56 and the capacitor dielectric film 55.

The structures circled by the dotted lines in FIGS. 31A and 31B are substantially the same as shown in FIG. 18B.

In the sixteenth embodiment, the parts which are substantially the lower plugs are formed in one piece with the storage nodes 53, 54, whereby the number of the film forming steps can be small and the CMP step for burying the lower plugs in the lower plug holes is not necessary. Furthermore, the storage nodes 53, 54 are formed by CMP, whereby the Ru film may not be formed thick in comparison with that in the case that the storage nodes are formed by etching, whereby a use amount of Ru can be smaller.

In the sixteenth embodiment, the parts which are effectively to be the lower plugs are formed in one-piece with the storage nodes 53, 54, whereby the storage nodes 53, 54 are contiguous to the adhesion improving layer 52 at a larger contiguous area, whereby the adhesion is improved, and accordingly the storage nodes 53, 54 do not peel.

The other characteristics are substantially the same as those of the case that the disalignment between the storage node and the lower plug takes place in the eighth embodiment.

The fabrication steps following the step of etching the adhesion improving layer 52 of the sixteenth embodiment may be changed to correspond to the ninth to the fourteenth embodiments, whereby the same effects as those produced by the ninth to the fourteenth embodiments can be provided.

In the case that the fabrication steps following the step of etching the adhesion improving layer 52 are changed to correspond to the fourteenth embodiment, the excessive etching of the adhesion improving layer 52 is not performed.

Embodiments of the present invention have been explained above, and other various modification of the present invention are possible. For example, the constitution of the variation of the first embodiment, which is shown in FIG. 6, is applicable as it is to the second to the sixteenth embodiments and their modifications.

The constitution of the modification of the first embodiment is not applicable to the sixteenth embodiment using the cylindrical storage node 54.

Figure 32:
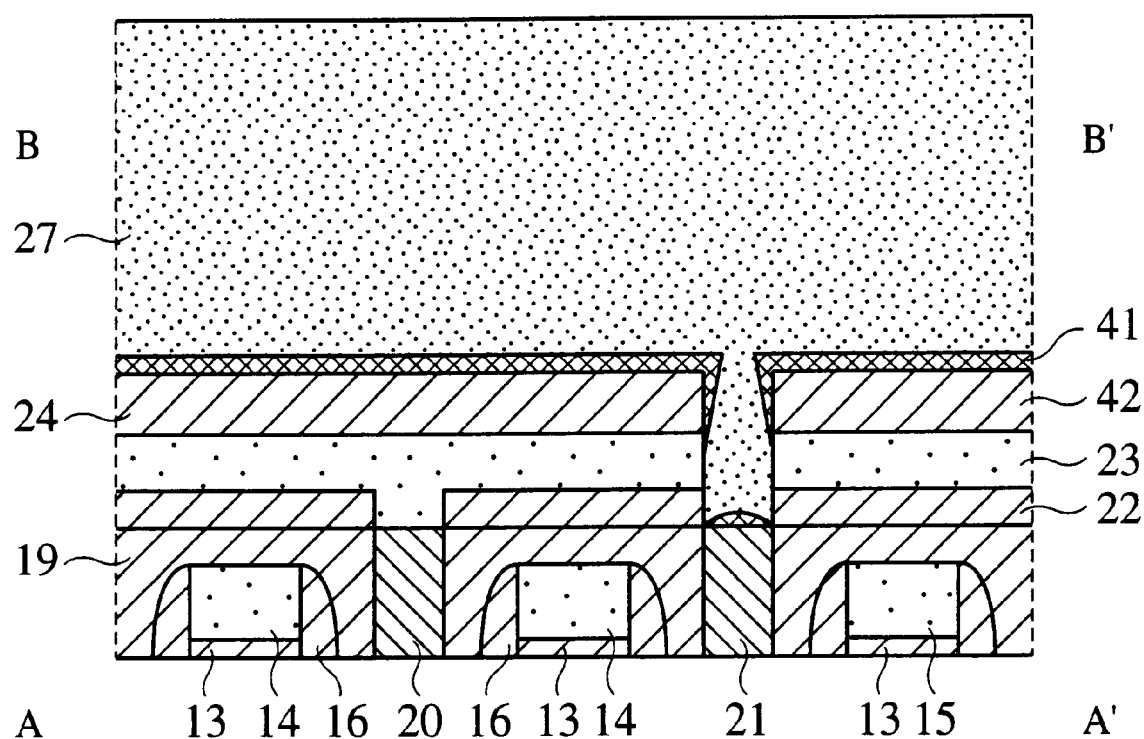
FIG. 32 is a view explaining a modification of the eighth embodiment of the present invention.
Figure 33A:
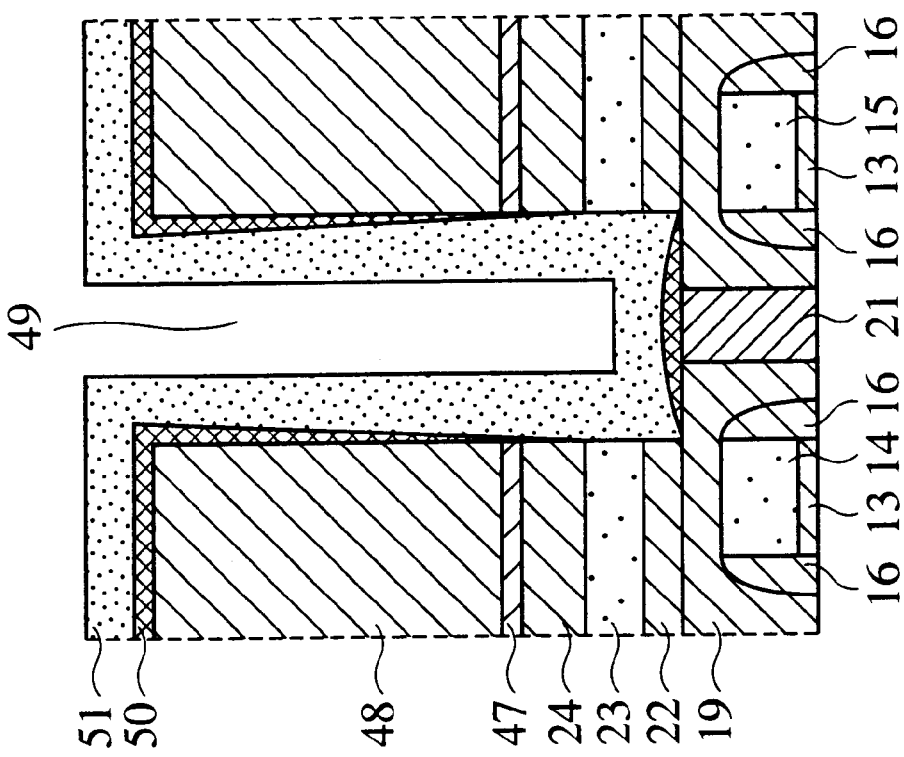
FIGS. 33A and 33B are views explaining a modification of the sixteenth embodiment of the present invention.
Figure 33B:
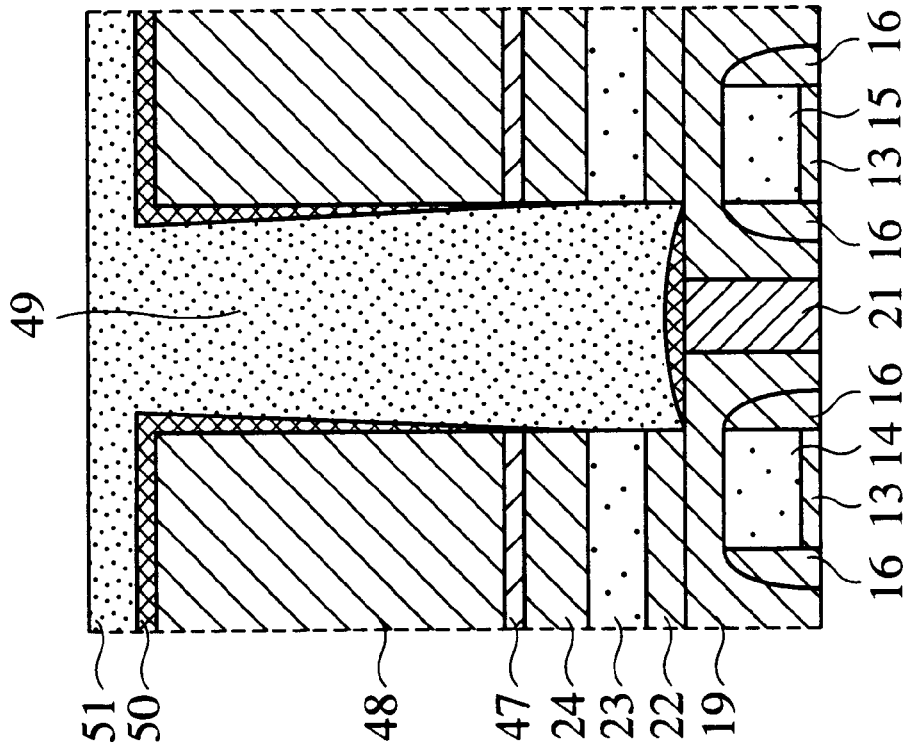
Figure 34A:
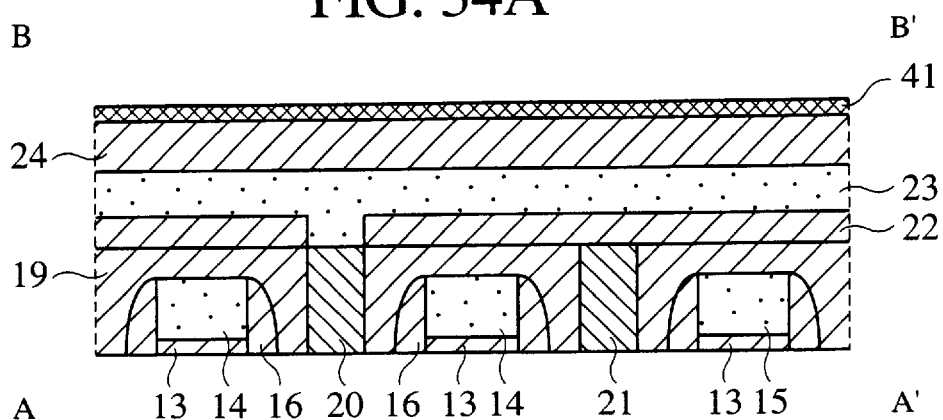
FIGS. 34A–34C and 35A–35B are views explaining a modification of the eighth embodiment of the present invention.
Figure 34B:
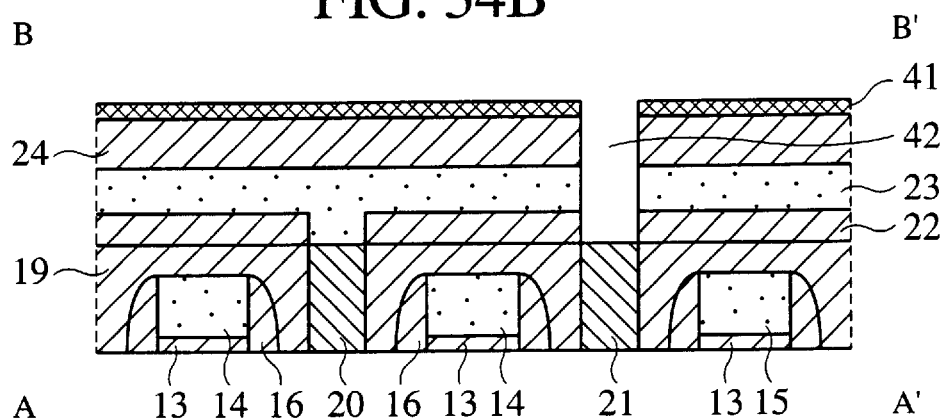
Figure 34C:
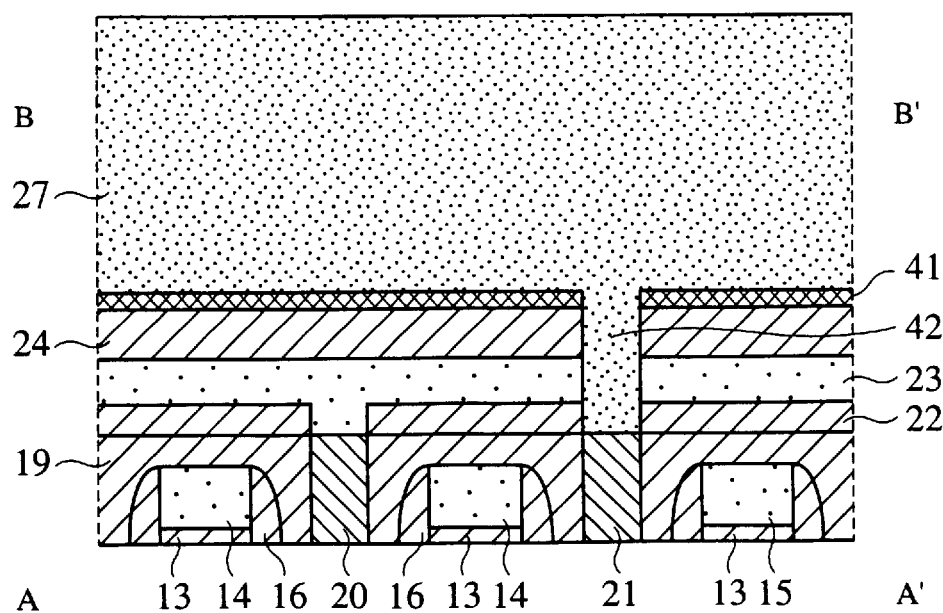
Figure 35A:
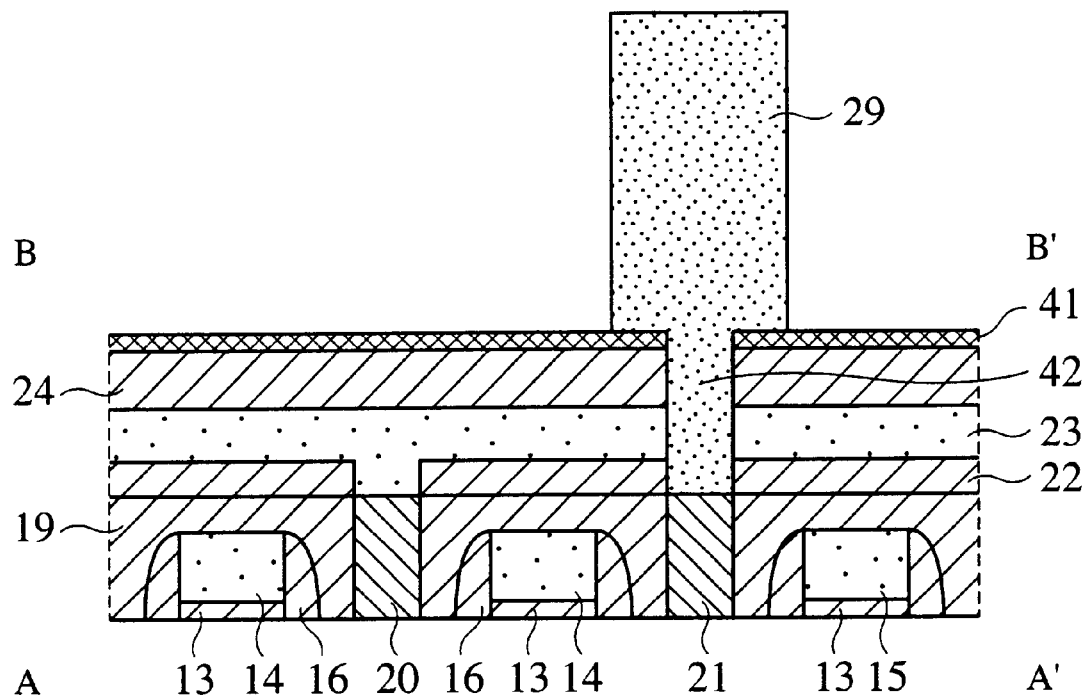
Figure 35B:
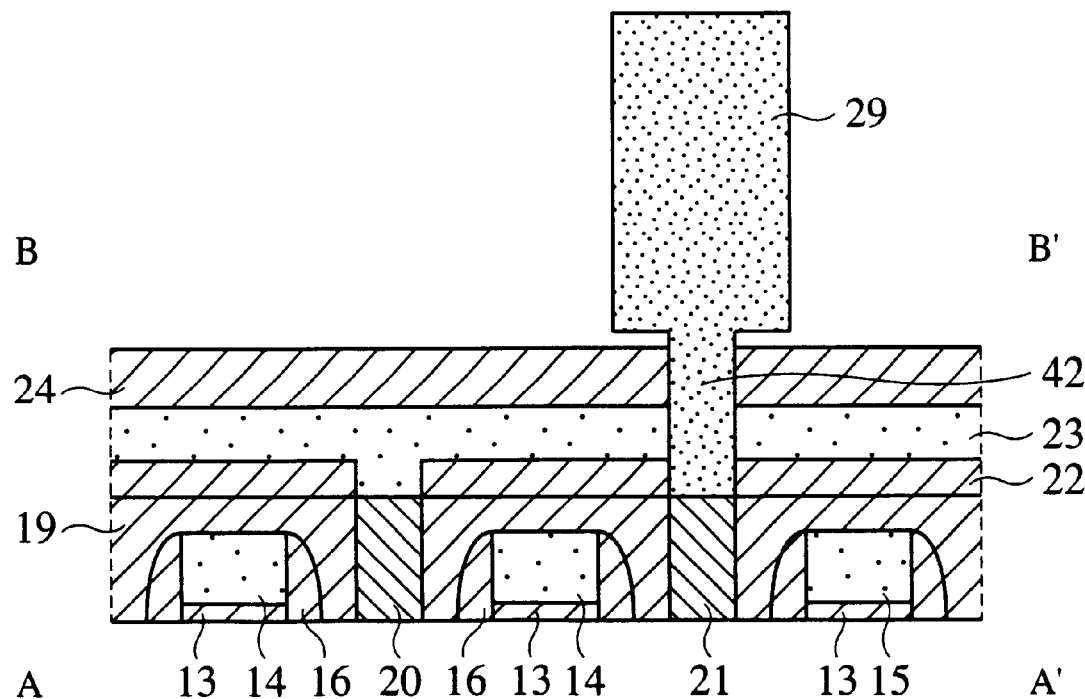
Figure 36A:
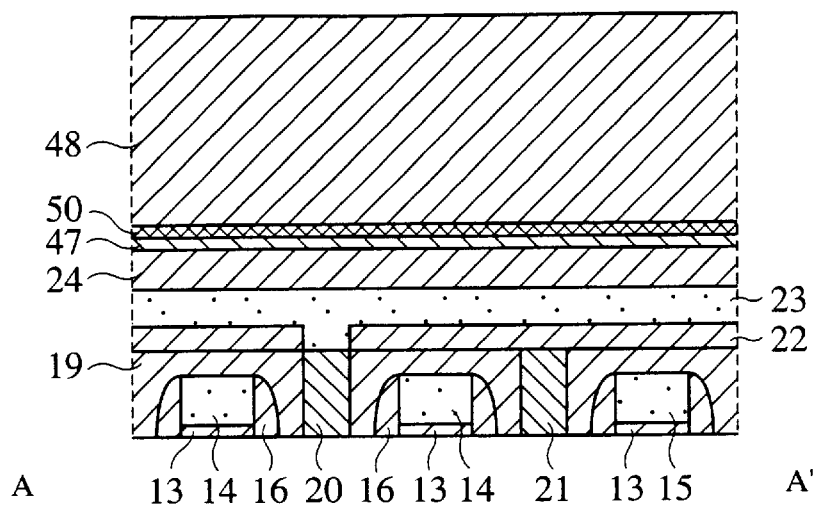
FIGS. 36A–36C and 37A–37B are views explaining a modification of the sixteenth embodiment of the present invention.
Figure 36B:
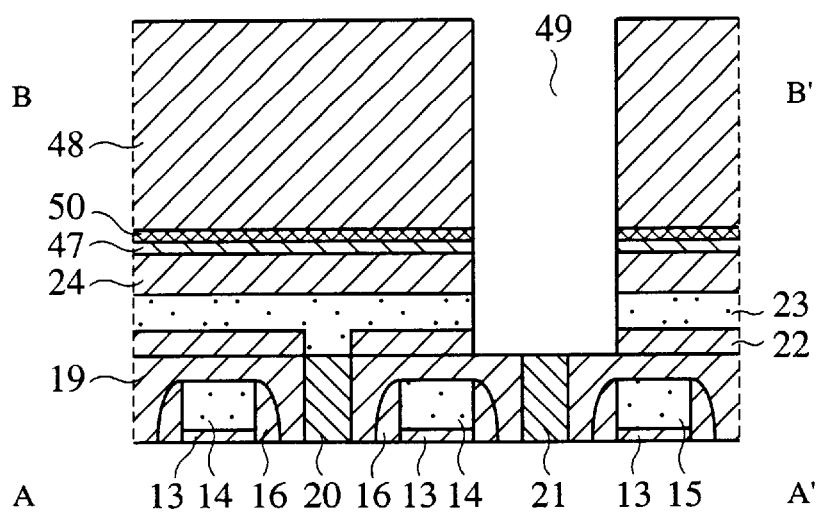
Figure 36C:
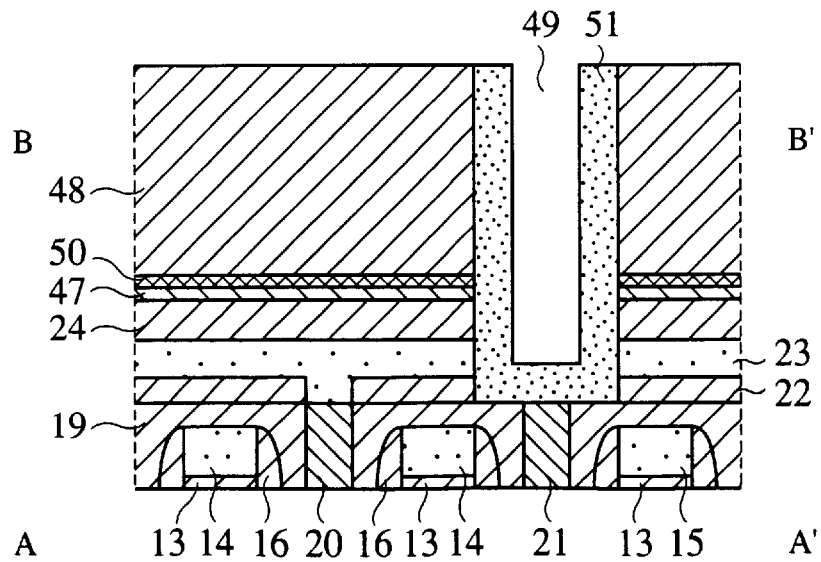
Figure 37A:
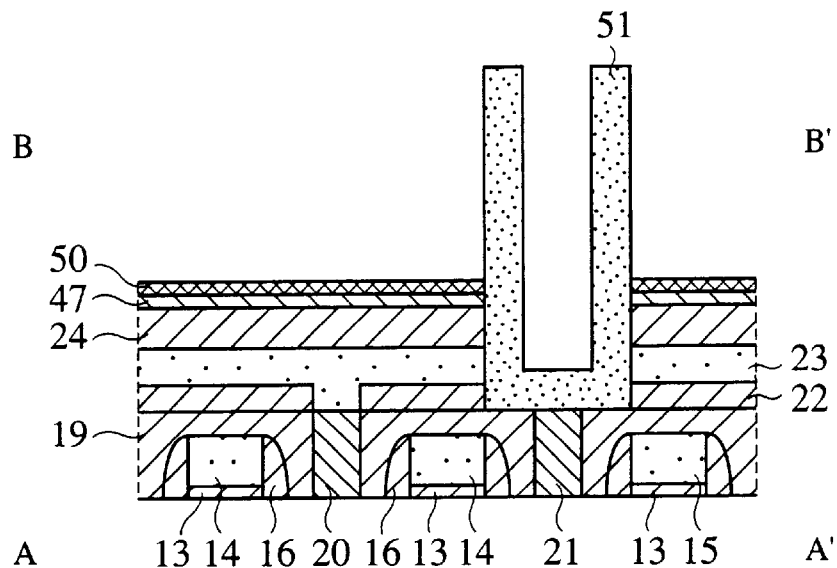
Figure 37B:
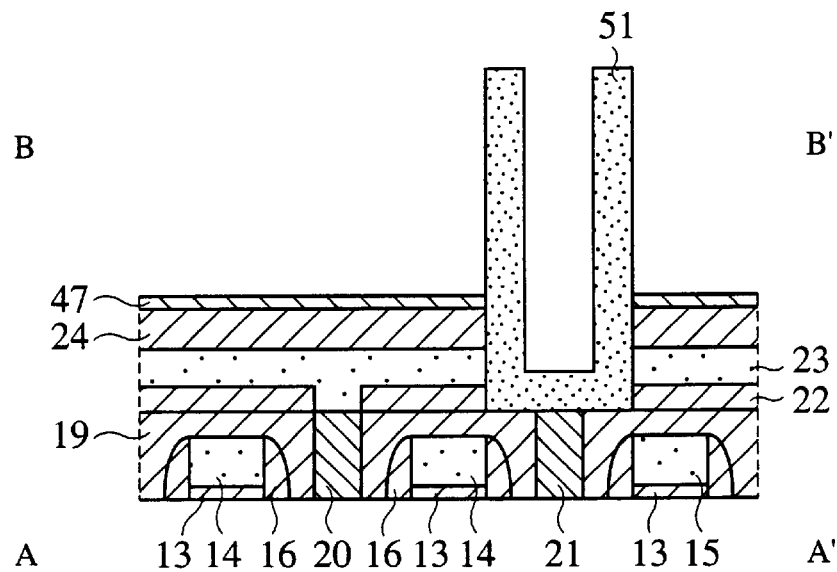
Figure 38A:
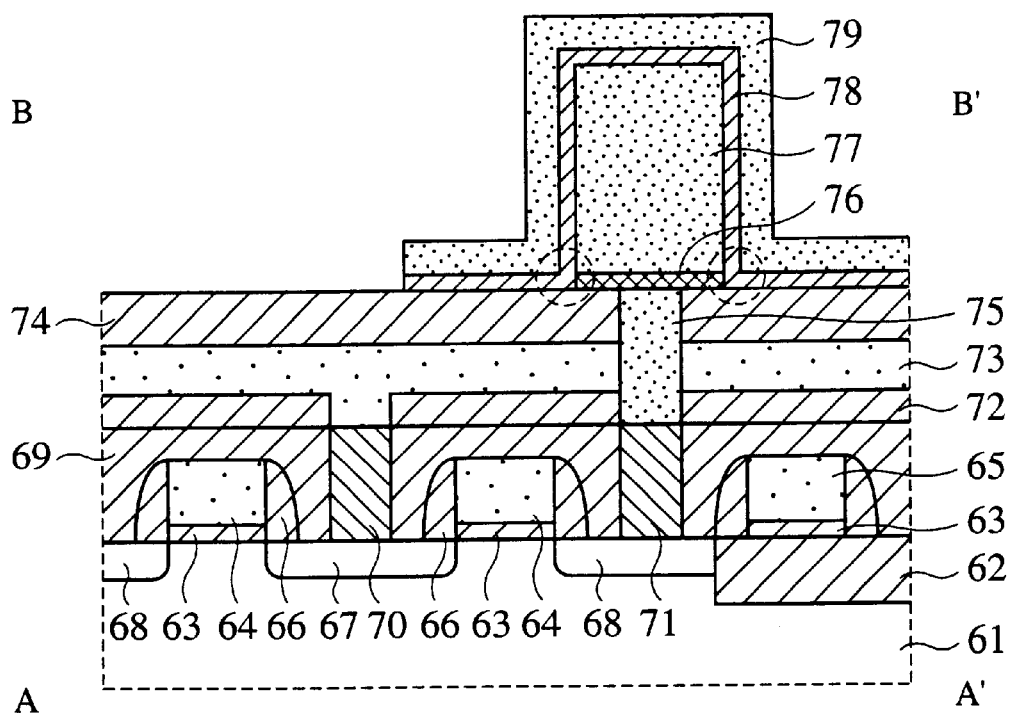
FIGS. 38A and 38B are views explaining the storage capacitor of the conventional DRAM.
Figure 38B:
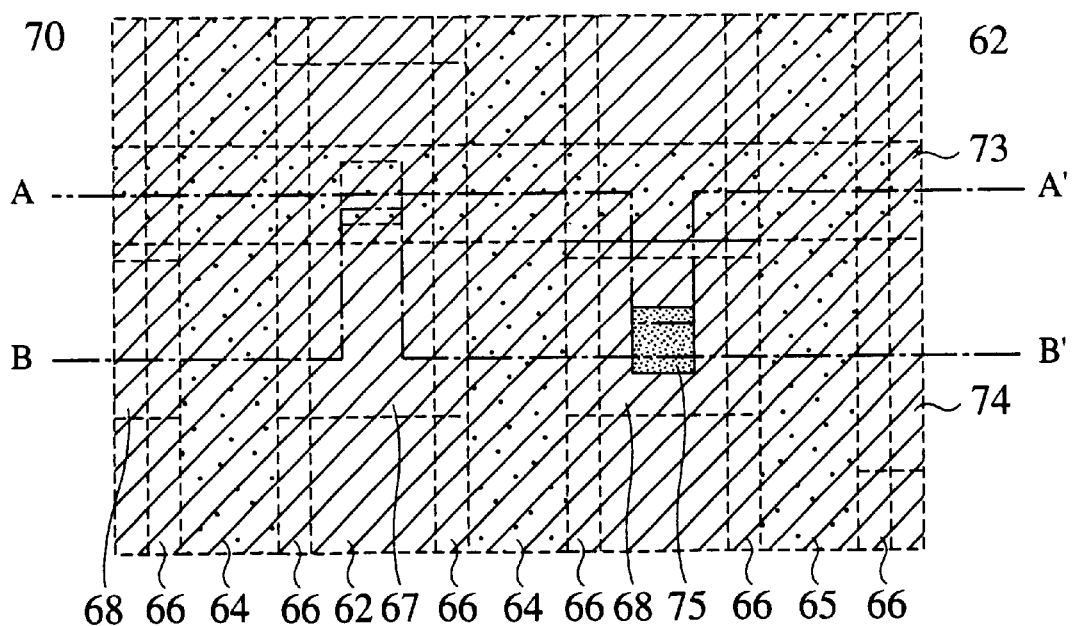
Figure 39A:
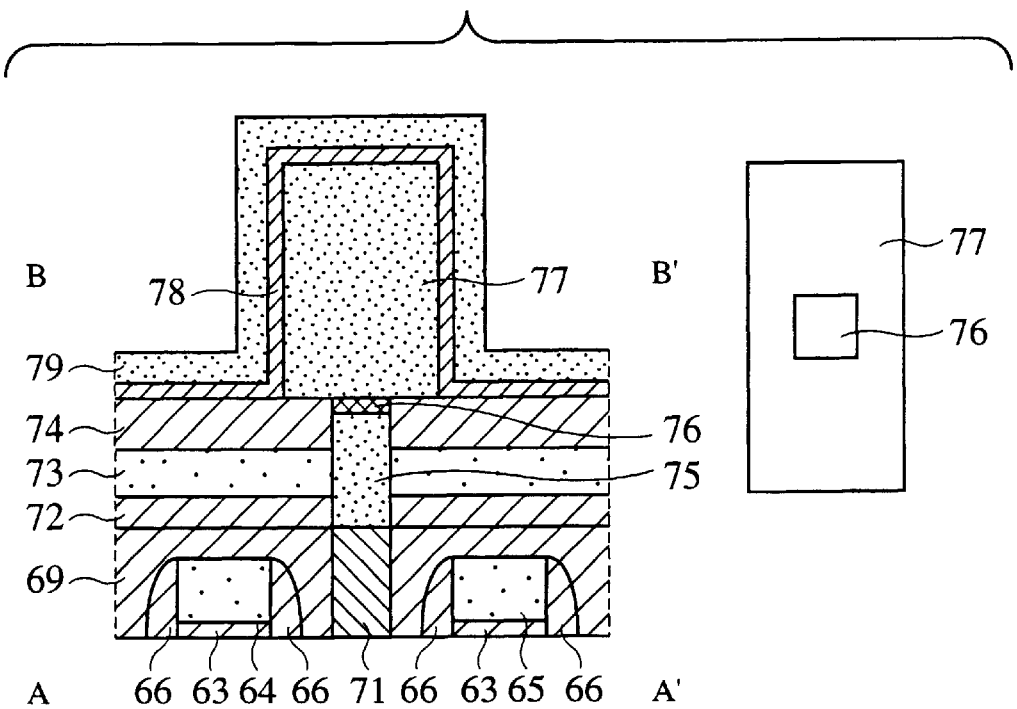
FIGS. 39A and 39B are views explaining a structure and problems of the improved storage capacitor of the conventional DRAM.
Figure 39B:
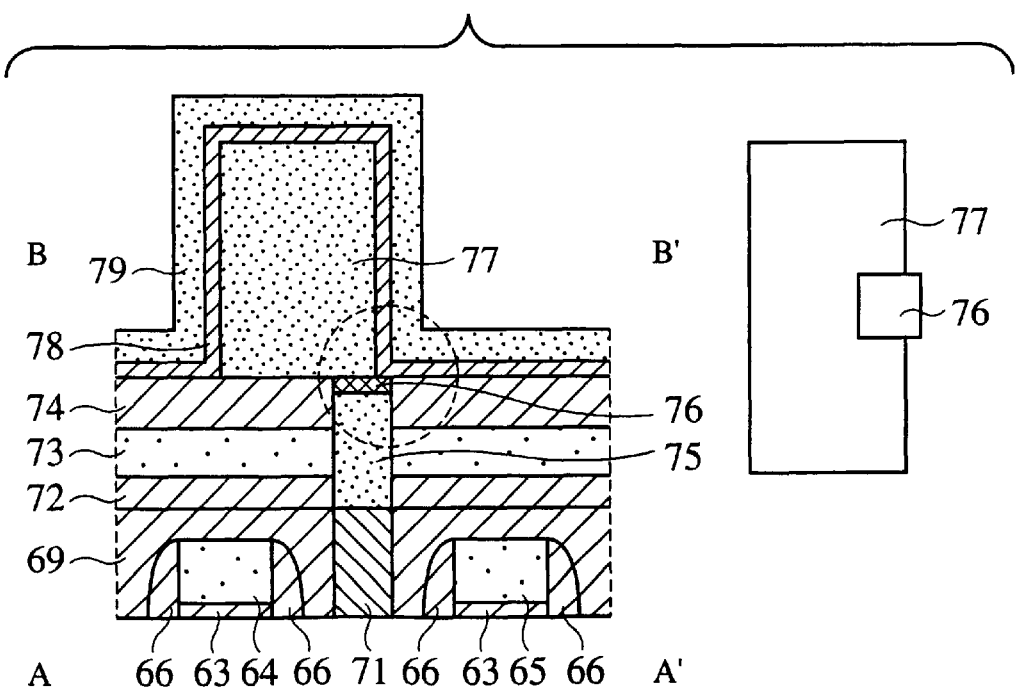

In the eighth to the sixteenth embodiments, the adhesion improving layer is contiguous to the side surfaces and bottom surface of the lower plug, but it is not essential to cover all the side surfaces and the bottom surface of the lower plug. As shown in FIGS. 32, 33A, and 33B, the adhesion improving layer may be formed on an upper part of the side surfaces which is a little below a position where the cavity is formed by the over-etching.

In this case, the adhesion improving layer may be formed only on the upper surface of the third inter-layer insulation film 24, whereby the adhesion improving layer can function as a peeling prevention film.

In this case, as shown in FIGS. 34A–34C, 35A–35B, 36A–36C, and 37A–37B, the via hole for the lower plugs 25, 42 may be formed by forming the adhesion improving layer thin on the entire surface before the via hole for the lower plugs 25, 42 is formed and then etching the adhesion improving layer and the insulation film below the adhesion improving layer by using a resist pattern.

Idealistically, an electrode material forming the lower plug is the same material as the lower electrode called the storage node, but may be formed of a material different from that of the lower electrode as long as the above-described requirements (1) to (3) are satisfied.

In the above-described respective embodiments, the capacitor dielectric film is a high dielectric constant film of Ta$_2$O$_5$ film, but is not limited to Ta$_2$O$_5$ film. High dielectric constant films, such as, SBT (SrBi$_2$Ta$_2$O$_9$) film BST ((Ba, Sr)TiO$_3$) film, PZLT film etc. may be used.

In the description of the above-described respective embodiments, the contact plugs, etc. are formed by sputtering method, but CVD method may be used in place of sputtering method.

In the description of the above-described embodiments, the bit line is formed of doped polycrystalline silicon film, but may be formed of a metal, such as W or others, or a silicide, such as WSi, or others.

The present invention has been explained by means of the above-described respective embodiments in which the present invention is applied to the storage capacitor of a DRAM. However, the present invention is not essentially applied to DRAMs, and is applicable to semiconductor integrated circuit devices requiring a number of capacitors, especially to ferroelectric memories (FeRAMs) having the same structure as DRAMs, whereby FeRAMs of high integration can be fabricated.

In an application of the present invention to an FeRAM, information is stored by using residual polarization of the capacitor dielectric film of the storage capacitor. Accordingly, the capacitor dielectric film must be a high dielectric constant film of a ferroelectric film, such as SBT film, PZT film or others.

In the above-described respective embodiments, the storage node, the lower plug and the cell plate are formed of Ru film, but Ru film is not essential. At least one of the storage node, the lower plug and the cell plate may be formed of ruthenium oxide (RO) film, W film, Pt (platinum) film or others.

In the above-described respective embodiments, the present invention is applied to so-called COB (Capacitor Over Bit line) structure, which the storage node is provided over the bit line. However, the present invention is not related to the bit line. Thus, the present invention may be also applicable to so-called CUB (Capacitor Under Bit line) structure.

In the above-described respective embodiments, the adhesion improving layer is formed of TiN. A conducting material, which can improve adhesion between the lower plug and the storage electrode and can selectively etch against the storage electrode and peripheral insulation film, may be also used as the adhesion improving layer. Thus, WN, Ti, TiAlN, W, etc. are also applicable to the adhesion improving layer instead of TiN.

When the adhesion improving layer is formed between the storage node and a silicon layer such as an amorphous silicon or a polycrystalline silicon, the adhesion improving layer can act also as a barrier metal which prevents silicidation between the storage node and the silicon layer. In this case, TiN, WN, etc. are preferable to the adhesion improving layer. From the point of view of the contact resistance, it is preferable that the adhesion improving layer is formed by stacked film of a barrier metal layer and a contact metal layer. In this case, TiN/Ti, WN/Ti, etc. may be used.

After the fabrication step shown in FIGS. 28A and 28B in the sixteenth embodiment, the adhesion improving layer 52 may be etched to form a slit between the insulation film 48 and the storage node 53 or 54. In this case, insulation film 48 is not removed but left, and then the capacitor dielectric film 55 and cell plate 56 are formed to form concave-type capacitor. In this case, slit structures, which corresponds to the structures circled by the dotted lines in FIGS. 31A and 31B, is formed on a portion between the upper portion of the storage node 53 or 54 and the insulation film 48.

According to the present invention, an electrode material of the storage node is a material which does not deteriorate a high dielectric film, and the adhesion improving layer for improving adhesion of the storage node is excessively etched or oxidized, whereby even when disalignment takes place between the storage node and the lower plug, generation of leak current due to deterioration of the high dielectric constant film can be effectively restrained. This permits a high dielectric constant film to be used as the capacitor dielectric film. The present invention much contributes to realization of semiconductor integrated circuit devices of the next generation, such as DRAMs, etc. having higher integration and higher density.

What is claimed is:

1. A semiconductor device comprising: a lower contact electrode buried in an insulation film, an adhesion improving layer formed on the lower contact electrode; a lower electrode formed on the adhesion improving layer; a capacitor dielectric film covering the lower electrode; and an upper electrode covering the capacitor dielectric film, in which a gap is formed between the insulation film and the lower electrode, in which surfaces of the gap are defined by the adhesion improving layer, the lower electrode and the insulation film, and a distance between the adhesion improving layer and the upper electrode is enlarged by the gap so that the distance becomes larger than a thickness of the capacitor dielectric film.

2. A semiconductor device according to claim 1, wherein the adhesion improving layer and the capacitor dielectric film do not directly contact each other.

3. A semiconductor device according to claim 1, wherein a cavity is formed between the adhesion improving layer and the capacitor dielectric film in the gap.

4. A semiconductor device comprising: a lower electrode; an adhesion improving layer formed at least on a sidewall of the lower electrode; an insulation film formed at least on a sidewall of the adhesion improving layer; a capacitor dielectric film covering the lower electrode; and an upper electrode covering the capacitor dielectric film, in which an upper surface of the adhesion improving layer on the sidewall of the lower electrode is lower than a upper surface of the lower electrode and an tipper surface of the insulation film, a gap is formed on the upper surface of the adhesion improving layer, in which a lower surface of the gap is defined by the adhesion improving layer and a side surface of the gap is defined by the lower electrode and the insulation film, and the gap is filled by a material selected from the group consisting of a self-oxide film of the lower electrode, a self nitridized film of the lower electrode, and the capacitor dielectric film.

5. A semiconductor device according to claim 4, wherein the lower electrode has a cylindrical-shaped body.

6. A semiconductor device according to claim 4, wherein the adhesion improving layer is formed of a titanium nitride film.

7. A semiconductor device according to claim 6, wherein the lower electrode is formed of a ruthenium film.

8. A semiconductor device according to claim 4, wherein the lower electrode includes a ruthenium film and has a cylindrical-shaped body, and the adhesion improving layer is formed of a titanium nitride film.

9. A semiconductor device according to claim 4, wherein the lower electrode includes a ruthenium film and has a cylindrical-shaped body, and the adhesion improving layer is formed of a titanium nitride film.

10. A semiconductor device comprising: a lower electrode: an adhesion improving layer formed at least on a sidewall of the lower electrode; an insulation film formed at least on a sidewall of the adhesion improving layer; a capacitor dielectric film covering the lower electrode; and an upper electrode covering the capacitor dielectric film, in which a self-oxide film of the adhesion improving layer is formed at least on an upper surface of the adhesion improving layer, the adhesion improving layer and the capacitor dielectric film are separated from each other by the self-oxide film.

11. A semiconductor device according to claim 10, wherein the lower electrode has a cylindrical-shaped body.

12. A semiconductor device according to claim 10, wherein the adhesion improving layer is formal of a titanium nitride film.

13. A semiconductor device according to claim 12, wherein the lower electrode is formed of a ruthenium film.

14. A semiconductor device comprising:

an insulation film formed over a semiconductor substrate;

an opening penetrating the insulation film;

an adhesion improving layer having a cylindrical-shaped body formed on an innerwall of the opening;

a lower electrode having a cylindrical-shaped body formed on a side face of the adhesion improving layer in the opening, the lower electrode being extended higher than the adhesion improving layer;

a gap formed on the upper face of the adhesion improving layer, a side face of the gap is defined by a side face of the lower electrode and a side face of the insulation film;

a capacitor dielectric film formed in the gap and on the lower electrode; and an upper electrode formed on the capacitor dielectric film.

15. A semiconductor device according to claim 14, wherein the adhesion improving layer is formed of a titanium nitride film.

16. A semiconductor device according to claim 15, wherein the lower electrode is formed of a ruthenium film.

17. A semiconductor device comprising:

a first insulation film formed over a semiconductor substrate; a second insulation film formed on the first insulation film;

an opening penetrating the first insulation film and the second insulation film;

an adhesion improving layer having a cylindrical-shaped body formed on an inner wall of the first insulation film in the opening;

a lower electrode having a cylindrical-shaped body formed on a side face of the adhesion improving layer in the opening, the lower electrode being extended higher than the adhesion improving layer;

a gap formed on the upper face of the adhesion improving layer, a side face of the gap is defined by a side face of the lower electrode and a side face of the second insulation film:

a capacitor dielectric film formed in the gap and on the lower electrode; and an upper electrode formed on the capacitor dielectric film.

18. A semiconductor device according to claim 17, wherein the adhesion improving layer is formed of a titanium nitride film.

19. A semiconductor device according to claim 17, wherein the lower electrode is formed of a ruthenium film.

20. A semiconductor device according to claim 17, wherein the first insulation film is formed of a silicon oxide film.

21. A semiconductor device according to claim 20, wherein the second insulation film is formed on silicon nitride film.

22. A semiconductor device according to claim 17, wherein a distance between the adhesion improving layer and the upper electrode is enlarged by the gap so that the distance becomes larger than a thickness of the capacitor dielectric film.

* * * * *